United States Patent
Chen et al.

(10) Patent No.: US 12,489,467 B2
(45) Date of Patent: Dec. 2, 2025

(54) ERASURE CODE-BASED ENCODING METHOD AND RELATED DEVICE

(71) Applicant: Huawei Technologies Co., Ltd., Shenzhen (CN)

(72) Inventors: Xiangyu Chen, Shenzhen (CN); Jianing Pei, Moscow (RU); Shaoteng Liu, Shenzhen (CN); Xiaoyang Zhang, Shenzhen (CN)

(73) Assignee: HUAWEI TECHNOLOIGES CO., LTD., Shenzhen (CN)

( * ) Notice: Subject to any disclaimer, the term of this patent is extended or adjusted under 35 U.S.C. 154(b) by 0 days.

(21) Appl. No.: 18/618,654

(22) Filed: Mar. 27, 2024

(65) Prior Publication Data

US 2024/0243757 A1    Jul. 18, 2024

Related U.S. Application Data

(63) Continuation of application No. PCT/CN2022/121171, filed on Sep. 26, 2022.

(30) Foreign Application Priority Data

Sep. 28, 2021    (CN) .......................... 202111144265.5

(51) Int. Cl.
  *H03M 13/15*    (2006.01)
(52) U.S. Cl.
  CPC ................................ *H03M 13/154* (2013.01)
(58) Field of Classification Search
  CPC .................................................. H03M 13/154
  See application file for complete search history.

(56) References Cited

U.S. PATENT DOCUMENTS

| | | |
|---|---|---|
| 8,132,044 B1 * | 3/2012 | Saeed ................ G06F 11/1088 714/6.1 |
| 2015/0256204 A1 * | 9/2015 | Torii ................ H03M 13/2945 714/755 |

(Continued)

FOREIGN PATENT DOCUMENTS

| | | |
|---|---|---|
| CN | 105760116 A | 7/2016 |
| CN | 109491835 A | 3/2019 |

(Continued)

OTHER PUBLICATIONS

Wu Si et al: "Enabling I/O-Efficient Redundancy Transitioning in Erasure-Coded KV stores via Elastic Reed-Solomon Codes", 2020 International Symposium on Reliable Distributed Systems (SRDS), IEEE, Sep. 21, 2020, pp. 246-255, XP033857262.

(Continued)

*Primary Examiner* — Joseph D Torres
(74) *Attorney, Agent, or Firm* — Conley Rose, P.C.

(57) ABSTRACT

A method includes an encoder side that obtains a plurality of data blocks in batches, and encodes the data blocks. In an $i^{th}$ time of encoding, after obtaining an incremental data block, the encoder side performs encoding processing on the incremental data block using erasure code to generate an incremental parity block, the incremental data block includes at least one data block, and i is an integer greater than 1. The encoder side performs an exclusive OR operation based on the incremental parity block and an original global parity block to generate a first incremental global parity block. The original global parity block is a first incremental global parity block generated by the encoder side in an $(i-1)^{th}$ time of encoding, and an original data block is a data block obtained by the encoder side before the $(i-1)^{th}$ time of encoding.

20 Claims, 12 Drawing Sheets

(56) References Cited

U.S. PATENT DOCUMENTS

| | | | | |
|---|---|---|---|---|
| 2017/0255519 A1* | 9/2017 | Zhang | ............... | H03M 13/356 |
| 2018/0032395 A1* | 2/2018 | Yang | ................... | H03M 13/154 |
| 2018/0046543 A1* | 2/2018 | Canepa | ............... | H03M 13/154 |

FOREIGN PATENT DOCUMENTS

| | | | |
|---|---|---|---|
| CN | 111245719 A | 6/2020 |
| CN | 112835738 A | 5/2021 |
| CN | 113258936 A | 8/2021 |

OTHER PUBLICATIONS

Xu Fangliang et al: "Incremental encoding for erasure-coded cross-datacenters cloud storage", Future Generation Computer Systems, vol. 87, Oct. 1, 2018, pp. 527-537, XP093223114.

James S.Plank et al,"A Performance Evaluation and Examination of Open-Source Erasure Coding Libraries for Storage",2009,total 13 pages.

Li Qian et al,"An Ant Colony Optimization Algorithms Based Data Update Scheme for Erasure-Coded",journal of computer research and development,2021,with English abstract total 14 pages.

\* cited by examiner

ERASURE CODE-BASED ENCODING METHOD AND RELATED DEVICE

CROSS-REFERENCE TO RELATED APPLICATIONS

This is a continuation of International Patent Application No. PCT/CN2022/121171 filed on Sep. 26, 2022, which claims priority to Chinese Patent Application No. 202111144265.5 filed on Sep. 28, 2021. The disclosures of the aforementioned applications are hereby incorporated by reference in their entireties.

TECHNICAL FIELD

This disclosure relates to the field of coding technologies, and in particular, to an erasure code-based encoding method and a related device.

BACKGROUND

An erasure code (EC) technology may be applied to a data storage system, and is a data coding method that can reduce data redundancy and ensure data reliability. (n, k) erasure code indicates a type of erasure code in which a quantity of data blocks is k and a quantity of parity blocks is n−k. Erasure code that meets a maximum distance separable (MDS) feature has the following property. Any data blocks and parity blocks that are in n blocks and whose total quantity is k may be selected to reconstruct initial k data blocks. Therefore, for a group of (n, k) erasure code that meets the MDS feature, when no more than n−k data blocks are lost, the lost data blocks may be reconstructed in the foregoing decoding mode.

Commonly used erasure code is referred to as a full erasure code scheme. When an accumulated quantity of written data blocks reaches k data blocks, EC encoding is performed on the k data blocks to generate parity blocks. The data blocks are a, the parity blocks are b, and a specific calculation process is as follows:

$$b = Qa.$$

$a=[a_1, a_2, \ldots, a_k]^T$ is a data vector corresponding to the k data blocks, Q is an encoding matrix of (n−k)×k, $b=[b_1, \ldots, b_{n-k}]^T$ is a parity vector corresponding to n−k parity blocks, $a_i$ is a data block, and $b_i$ is a parity block, where $1 \leq i \leq k$.

For the full erasure code scheme, EC encoding can be performed on the k data blocks only after the quantity of written data blocks reaches k. When the quantity of written data blocks does not reach k, three-copy redundancy protection needs to be performed on the to-be-encoded data to ensure data reliability. This wastes storage space.

SUMMARY

According to a first aspect, an embodiment of this disclosure provides an erasure code-based encoding method, where the method is applied to an encoder side and includes the following. The encoder side obtains a plurality of data blocks in batches, where the plurality of data blocks belongs to a same encoding group. The encoder side performs encoding processing on the plurality of data blocks by using erasure code. In an $i^{th}$ time of encoding, after obtaining an incremental data block, the encoder side performs encoding processing on the incremental data block by using the erasure code to generate an incremental parity block, the incremental data block includes at least one data block, and i is an integer greater than 1. The encoder side performs an exclusive OR operation based on the incremental parity block and an original global parity block to generate a first incremental global parity block. The original global parity block is a first incremental global parity block generated by the encoder side in an $(i-1)^{th}$ time of encoding, the original global parity block is used to reconstruct a damaged data block in an original data block, the original data block is a data block obtained by the encoder side before the $(i-1)^{th}$ time of encoding, and the original data block and the incremental data block belong to a same encoding group. The first incremental global parity block is used to reconstruct a damaged data block in the original data block and the incremental data block.

Further, when the encoder side is used in different scenarios, sources of the plurality of data blocks may be inconsistent. Further, when the encoder side is used in a storage system, the plurality of data blocks obtained by the encoder side in batches are a plurality of data blocks written into the storage system by an upper-layer service in batches. The upper-layer service may be an application-layer service, for example, a write service of an application program. The upper-layer service may be a write service of another client. This is not limited herein.

When the encoder side is used in an encoding system, the plurality of data blocks obtained by the encoder side in batches may be to-be-transmitted data of a server. The encoding group refers to a set of data blocks supported by the erasure code. A maximum quantity of data blocks supported by the erasure code is k, in other words, a maximum quantity of data blocks included in the encoding group is k, where k is a positive integer. When the encoder side is used in the storage system, the encoding group is also referred to as a stripe.

The encoder side obtains the plurality of data blocks in batches. The plurality of data blocks belongs to the same encoding group, and the data blocks belonging to the same encoding group are encoded by using the same erasure code. The encoding group may also be referred to as a global data vector, and a location of the data block obtained by the encoder side in the encoding group may also be referred to as a location of the data block in the global data vector. For example, $x_{b_i+1}$ is a first data block in the $i^{th}$ encoding process of the encoder side, $b_i+1$ indicates a location of the data block in the global data vector (or the encoding group), and the global data vector (or the encoding group) is x, where $x=[x_1, x_2, \ldots, x_k]^T$, and i is an integer greater than 1.

In embodiments of this disclosure, the plurality of data blocks obtained by the encoder side in batches are classified into the incremental data block and the original data block based on an encoding sequence. The incremental data block includes the at least one data block. Further, the data block obtained in the $i^{th}$ time of encoding is referred to as the incremental data block. The data block obtained before the $(i-1)^{th}$ time of encoding is referred to as the original data block. For example, when i=2, a data block obtained in a second time of encoding is referred to as the incremental data block, and a data block obtained in a first time of encoding is referred to as the original data block. When i=3, a data block obtained in a third time of encoding is referred to as the incremental data block, and data blocks obtained in a second time of encoding and a first time of encoding are referred to as original data blocks.

In the $i^{th}$ time of encoding, after obtaining the incremental data block, the encoder side performs encoding processing on the incremental data block by using the erasure code to generate the incremental parity block. In embodiments of this disclosure, a parity block generated based on the incremental data block is referred to as the incremental parity block. Similarly, a parity block generated based on the original data block is referred to as an original parity block.

After obtaining the incremental parity block, the encoder side updates the original global parity block. Further, the encoder side performs the exclusive OR operation in a finite field based on the incremental parity block and the original global parity block to generate the first incremental global parity block. The encoder side updates (or replaces, or overwrites) the original global parity block by using the first incremental global parity block.

The erasure code-based encoding method provided in embodiments of this disclosure significantly improves encoding flexibility, and avoids high write overheads and a write amplification problem that are caused by a case in which a full encoding scheme is applied to three-copy backup processing to perform reliability protection on a large quantity of incremental data blocks. This effectively reduces storage space occupied by the backup processing. The encoding processing at the encoder side is averaged, and a computing hotspot problem caused by the full encoding is avoided.

With reference to the first aspect, in a possible implementation of the first aspect, when i=2, that the encoder side generates the first incremental global parity block in the $(i-1)^{th}$ time of encoding includes the following. The encoder side performs encoding processing on the original data block by using the erasure code, and generates a parity block in the $(i-1)^{th}$ time of encoding. The parity block in the $(i-1)^{th}$ time of encoding is equal to the first incremental global parity block generated in the $(i-1)^{th}$ time of encoding.

Further, in the first time of encoding, the original data block at the encoder side is equal to the incremental data block and equal to the data block obtained in the first time of encoding. For example, when i=2, in the second time of encoding, after obtaining an incremental data block X2, the encoder side performs encoding processing on the incremental data block by using the erasure code to generate an incremental parity block X2'. In the first time of encoding, after obtaining an original data block X1, the encoder side performs encoding processing on the original data block by using the erasure code to generate the original parity block.

With reference to the first aspect, in a possible implementation of the first aspect, that the encoder side performs encoding processing on the incremental data block by using the erasure code to generate an incremental parity block includes the following. The encoder side determines a quantity of data blocks in the incremental data block. When the quantity of data blocks in the incremental data block is less than or equal to a first encoding threshold, the encoder side performs encoding processing on the incremental data block by using a first incremental encoding matrix to generate the incremental parity block, or when the quantity of data blocks in the incremental data block is greater than the first encoding threshold, the encoder side performs encoding processing on the incremental data block by using a first incremental parity matrix and an inverse matrix of a first intermediate parity matrix to generate the incremental parity block. The first incremental encoding matrix is a submatrix of a global encoding matrix of the erasure code, a product of the first incremental parity matrix and the inverse matrix of the first intermediate parity matrix is equal to the first incremental encoding matrix, and the first intermediate parity matrix is a submatrix of a global parity matrix of the erasure code.

Further, to further reduce encoding complexity, after obtaining data blocks, the encoder side determines a quantity of data blocks that need to be encoded. Further, in the first time of encoding, the encoder side determines a quantity of original data blocks. In the $i^{th}$ time of encoding, the encoder side determines a quantity of data blocks in the incremental data block.

The encoder side determines, based on a quantity of to-be-encoded data blocks (for example, the quantity of original data blocks or the quantity of data blocks in the incremental data block), to perform encoding processing in different modes to obtain the parity block. In embodiments of this disclosure, the $i^{th}$ time of encoding is used as an example to describe the encoding processing mode. It may be understood that the $(i-1)^{th}$ time of encoding or an $(i+1)^{th}$ time of encoding is similar to the $i^{th}$ time of encoding. Details are not described herein again. In the $i^{th}$ time of encoding, an incremental data vector including incremental data blocks is $x_{in}^i$, where $x_{in}^i=[x_{b_i+1}, x_{b_i+2}, \ldots, x_{b_i+t_i}]^T$. $b_i+1$ indicates a location sequence number of an initial data block of $x_{in}^i$ in the global data vector $x=[x_1, x_2, \ldots, x_k]^T$, $t_i$ indicates the quantity of data blocks in the incremental data block in the $i^{th}$ time of encoding, and $t_i$ is an integer greater than or equal to 1.

Further, the encoder side determines the encoding processing mode based on a relationship between the quantity of to-be-encoded data blocks and the first encoding threshold. The first encoding threshold may be configured based on an actual requirement. This is not limited in embodiments of this disclosure.

It should be noted that the erasure code in embodiments of this disclosure is (n, k) erasure code, in other words, a maximum quantity of data blocks supported by the encoder side is k (also referred to as that a quantity of data blocks of the encoding group is k), where k is a positive integer. A quantity of global parity blocks generated by the encoder side by performing encoding processing on the data block by using the erasure code is n–k, n is a positive integer, and n is greater than k. Matrices related to the encoding processing of the erasure code include the global encoding matrix and the global parity matrix. The global encoding matrix of the erasure code is set to G, and the global parity matrix of the erasure code is set to H.

In embodiments of this disclosure, the applicant studies erasure code and finds that for some (n, k) erasure code, density of a global encoding matrix is significantly higher than density of a global parity matrix. Calculation complexity of encoding processing performed based on the global encoding matrix is significantly higher than calculation complexity of encoding processing performed based on the global parity matrix. However, when encoding processing is performed based on the global parity matrix, a syndrome needs to be first generated, and then encoding processing is performed on the syndrome to obtain a parity block. Therefore, in comparison with encoding processing performed based on the global encoding matrix, additional calculation complexity is introduced. Based on the foregoing research, the first encoding threshold is introduced in embodiments of this disclosure. When the incremental data blocks on which encoding processing is performed are less than or equal to the first encoding threshold, encoding processing is performed by using the submatrix (the first incremental encoding matrix) of the global encoding matrix. When the incremental data blocks on which the encoding processing is performed are greater than the first encoding threshold, encoding processing is performed by using an association matrix (the first incremental parity matrix) of the global parity matrix to generate a first syndrome, and encoding processing is performed on the first syndrome by using the inverse matrix of the first intermediate parity matrix to generate an incremental parity block. Calculation overheads of the encoder side are effectively reduced, and encoding performance is improved.

With reference to the first aspect, in a possible implementation of the first aspect, when the maximum quantity of data blocks that can be encoded by using the erasure code is k, the quantity of global parity blocks generated by the encoder side by performing encoding processing on the data blocks by using the erasure code is n−k, the global parity block is used to reconstruct a damaged data block in the data blocks on which encoding processing is performed, k is a positive integer, n is a positive integer, and n is greater than k, first, the encoder side determines the first incremental encoding matrix from the global encoding matrix based on the incremental data block. The first incremental encoding matrix is set to $G_{in}^i$, and the first incremental encoding matrix is the submatrix of the global encoding matrix G. The first incremental encoding matrix $G_{in}^i$ is formed by performing column juxtaposition on columns that correspond to the incremental data block and that are of the global encoding matrix G of the erasure code.

For example, the incremental data block includes $x_1$, $x_2$, and $x_3$, and the incremental data block corresponds to vectors in first, second, and third columns of the global encoding matrix. The encoder side performs column juxtaposition based on the vectors in the first, second, and third columns of the global encoding matrix to form the first incremental encoding matrix.

Alternatively, the encoder side determines the first intermediate parity matrix $H_y$ from the global parity matrix H of the erasure code, where the first intermediate parity matrix $H_y$ is last n−k columns of the global parity matrix H of the erasure code.

Alternatively, the encoder side determines a second intermediate parity matrix $H_x$ from the global parity matrix H of the erasure code, where the second intermediate parity matrix $H_x$ is first k columns of the global parity matrix H of the erasure code.

The encoder side determines the first incremental parity matrix from the second intermediate parity matrix $H_x$ based on the incremental data block, where the first incremental parity matrix is formed by performing column juxtaposition on columns that correspond to the incremental data block and that are of the second intermediate parity matrix $H_x$. The first incremental parity matrix is set to $H_{in}^i$.

For example, the incremental data block includes $x_1$, $x_2$, and $x_3$, and the incremental data block corresponds to vectors in first, second, and third columns of the second intermediate parity matrix. The encoder side performs column juxtaposition based on the vectors in the first, second, and third columns of the second intermediate parity matrix to form the first incremental parity matrix $H_{in}^i$.

With reference to the first aspect, in a possible implementation of the first aspect, G is the global encoding matrix of the erasure code, H is the global parity matrix of the erasure code, and G and H meet the following relationships:

$$H = [H_x \mid H_y], \text{ and}$$

$$G = H_y^{-1} \times H_x.$$

$H_y$ is the first intermediate parity matrix, the first intermediate parity matrix $H_y$ is the last n−k columns of the global parity matrix H of the erasure code, $H_x$ is the second intermediate parity matrix, and the second intermediate parity matrix $H_x$ is the first k columns of the global parity matrix H of the erasure code.

$G_{in}^i$ is the first incremental encoding matrix, $H_{in}^i$ is the first incremental parity matrix, and $G_{in}^i$ and $H_{in}^i$ meet the following relationship:

$$G_{in}^i = H_y^{-1} \times H_{in}^i.$$

It should be noted that "×" in embodiments of this disclosure refers to a finite field multiplication operation. A finite field in embodiments of this disclosure may be a Galois field (GF) such as GF(2^8), a GF(2^16), or another finite field. This is not limited herein.

With reference to the first aspect, in a possible implementation of the first aspect, that the encoder side performs encoding processing on the incremental data block by using a first incremental encoding matrix $G_{in}^i$ to generate the incremental parity block includes obtaining the incremental parity block through calculation by using the following method:

$$y_{in}^i = G_{in}^i \times x_{in}^i.$$

The incremental data vector including the incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in the global data vector $x = [x_1, x_2, \ldots, x_k]^T$, and the global data vector is a vector including data blocks of the encoding group.

With reference to the first aspect, in a possible implementation of the first aspect, that the encoder side performs encoding processing on the incremental data block by using a first incremental parity matrix $H_{in}^i$ and an inverse matrix of a first intermediate parity matrix $H_y$ to generate the incremental parity block includes obtaining the incremental parity block through calculation by using the following method:

$$y_{in}^i = H_y^{-1} \times (H_{in}^i \times x_{in}^i).$$

The incremental data vector including the incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in the global data vector $x = [x_1, x_2, \ldots, x_k]^T$.

With reference to the first aspect, in a possible implementation of the first aspect, that the encoder side performs encoding processing on the incremental data block by using a first incremental parity matrix $H_{in}^i$ and an inverse matrix of a first intermediate parity matrix $H_y$ to generate the incremental parity block includes obtaining the incremental parity block through calculation by using the following method:

$$s_{in}^i = H_{in}^i \times x_{in}^i, \text{ and}$$

$$y_{in}^i = H_y^{-1} \times s_{in}^i.$$

The incremental data vector including the incremental data blocks is $x_{in}^i$, where $x_{in}^i=[x_{b_i+1}, x_{b_i+2}, \ldots, x_{b_i+t_i}]^T$, and an incremental parity vector including incremental parity blocks is $y_{in}^i$, where $y_{in}^i=[y_{in,1}, y_{in,2}, \ldots, y_{in,n-k}]^T$. $b_i+1$ indicates a location sequence number of an initial data block of $x_{in}^i$ in the global data vector $x=[x_1, x_2, \ldots, x_k]^T$, and $s_{in}^i$ is the first syndrome.

With reference to the first aspect, in a possible implementation of the first aspect, that the encoder side performs an exclusive OR operation based on the incremental parity block and an original global parity block to generate a first incremental global parity block includes obtaining the first incremental global parity block through calculation by using the following method:

$$y = y^* + y_{in}^i.$$

y is the first incremental global parity block, y* is the original global parity block, $y_{in}^i$ is the incremental parity block, and + is an operator of the exclusive OR operation in a finite field.

With reference to the first aspect, in a possible implementation of the first aspect, that the encoder side performs encoding processing on the incremental data block by using the erasure code to generate an incremental parity block includes the following.

When a maximum quantity of data blocks that can be encoded by using the erasure code is k, a quantity of global parity blocks generated by the encoder side by performing encoding processing on the data blocks by using the erasure code is n–k, the global parity block is used to reconstruct a damaged data block in the data blocks on which encoding processing is performed, k is a positive integer, n is a positive integer, and n is greater than k, the encoder side determines the first intermediate parity matrix from the global parity matrix of the erasure code, where the first intermediate parity matrix is last n–k columns of the global parity matrix H of the erasure code, and the first intermediate parity matrix is set to $H_y$, the encoder side determines the second intermediate parity matrix from the global parity matrix of the erasure code, where the second intermediate parity matrix is first k columns of the global parity matrix H of the erasure code, and the second intermediate parity matrix is set to $H_x$, and the encoder side determines the first incremental parity matrix from the second intermediate parity matrix $H_x$ based on the incremental data block, where the first incremental parity matrix is formed by performing column juxtaposition on columns that correspond to the incremental data block and that are of the second intermediate parity matrix. The first incremental parity matrix is set to $H_{in}^i$. For example, the incremental data block includes $x_1$, $x_2$, and $x_3$, and the incremental data block corresponds to vectors in first, second, and third columns of the second intermediate parity matrix. The encoder side performs column juxtaposition based on the vectors in the first, second, and third columns of the second intermediate parity matrix to form the first incremental parity matrix $H_{in}^i$.

The encoder side determines a third intermediate parity matrix based on the global parity matrix H. The third intermediate parity matrix is set to $H_{ys}$. The third intermediate parity matrix meets the following condition. Density of an inverse matrix $H_{ys}^{-1}$ of the third intermediate parity matrix is lower than density of an inverse matrix $H_y^{-1}$ of the first intermediate parity matrix $H_y$, and any $(n-k)^{th}$-order submatrix of a matrix $[H_x|H_{ys}]$ is nonsingular. It may be understood that there may be a plurality of implementations of the third intermediate parity matrix, and any matrix that meets the foregoing condition may be used as the third intermediate parity matrix.

The encoder side determines a second incremental encoding matrix based on the second intermediate parity matrix $H_x$ and the third intermediate parity matrix $H_{ys}$. The second incremental encoding matrix is a product of the first incremental parity matrix and the inverse matrix of the third intermediate parity matrix $H_{ys}$. Further, the second incremental encoding matrix is set to $G_{ins}^i$, and the second incremental encoding matrix is calculated in the following manner: $G_{ins}^i=H_{ys}^{-1}\times H_{in}^i$.

The encoder side determines a quantity of data blocks in the incremental data block.

When the quantity of data blocks in the incremental data block is less than or equal to $t_{th}$, the encoder side performs encoding processing on the incremental data block by using the second incremental encoding matrix $G_{ins}^i$ to generate the incremental parity block, or when the quantity of data blocks in the incremental data block is greater than $t_{th}$, the encoder side performs encoding processing on the incremental data block by using the first incremental parity matrix $H_{in}^i$ and the inverse matrix of the third intermediate parity matrix $H_{ys}$ to generate the incremental parity block.

In embodiments of this disclosure, because the density of the inverse matrix $H_{ys}^{-1}$ of the third intermediate parity matrix is significantly lower than the density of the inverse matrix $H_y^{-1}$ of the first intermediate parity matrix, calculation overheads of the encoder side can be further reduced, and encoding performance can be improved. In addition, because any $(n-k)^{th}$-order submatrix of the matrix $[H_x|H_{ys}]$ is nonsingular, it can be ensured that the foregoing encoding process meets an MDS feature, and data reliability is effectively ensured. When a stripe is fully written (that is, when a quantity of written data blocks is k), the first incremental global parity block is encoded by using $[H_x|H_{ys}]$, and finally the second incremental global parity block is generated, so that the generated second incremental global parity block meets an encoding feature of the erasure code.

With reference to the first aspect, in a possible implementation of the first aspect, that the encoder side performs encoding processing on the incremental data block by using the second incremental encoding matrix $G_{ins}^i$ to generate the incremental parity block includes obtaining the incremental parity block through calculation by using the following method:

$$y_{in}^i = G_{ins}^i \times x_{in}^i.$$

An incremental data vector including incremental data blocks is $x_{in}^i$, where $x_{in}^i=[x_{b_i+1}, x_{b_i+2}, \ldots, x_{b_i+t_i}]^T$, and an incremental parity vector including incremental parity blocks is $y_{in}^i$, where $y_{in}^i=[y_{in,1}, y_{in,2}, \ldots, y_{in,n-k}]^T$. $b_i+1$ indicates a location sequence number of an initial data block of $x_{in}^i$ in the global data vector $x=[x_1, x_2, \ldots, x_k]^T$, and the global data vector is a vector including data blocks of the encoding group.

With reference to the first aspect, in a possible implementation of the first aspect, that the encoder side performs encoding processing on the incremental data block by using the first incremental parity matrix $H_{in}^i$ and the inverse matrix of the third intermediate parity matrix $H_{ys}$ to generate the incremental parity block includes obtaining the incremental parity block through calculation by using the following method:

$$s_{in}^i = H_{in}^i \times x_{in}^i, \text{ and}$$

$$y_{in}^j = H_{ys}^{-1} \times s_{in}^j.$$

An incremental data vector including incremental data blocks is $x_{in}^i$, where $x_{in}^i=[x_{b_i+1}, x_{b_i+2}, \ldots, x_{b_i+t_i}]^T$, and an incremental parity vector including incremental parity blocks is $y_{in}^i$, where $y_{in}^i=[y_{in,1}, y_{in,2}, \ldots, y_{in,n-k}]^T$. $b_i+1$ indicates a location sequence number of an initial data block of $x_{in}^i$ in the global data vector $x=[x_1, x_2, \ldots, x_k]^T$, and $s_{in}^i$ is a first syndrome.

With reference to the first aspect, in a possible implementation of the first aspect, after that the encoder side performs an exclusive OR operation based on the incremental parity block and an original global parity block to generate a first incremental global parity block, the method further includes the following.

When a sum of a quantity of data blocks in the original data block and the quantity of data blocks in the incremental data block is equal to k, the encoder side encodes the first incremental global parity block y by using a first parity matrix to generate a second incremental global parity block y**. The first parity matrix is a product of the inverse matrix of the first intermediate parity matrix $H_y$ and the third intermediate parity matrix $H_{ys}$, and the second incremental global parity block is used to reconstruct a damaged data block in the original data blocks and the incremental data blocks, wherein a total quantity of the original data blocks and the incremental data blocks is k.

Further, when the sum of the original data blocks and the incremental data blocks is equal to k, that is, encoded data blocks reach an upper limit of the encoding group (for example, the stripe is fully written), the encoder side encodes the first incremental global parity block by using the first parity matrix to generate the second incremental global parity block. The second incremental global parity block is used to reconstruct the damaged data block in the written original data blocks and the written incremental data blocks, wherein a total quantity of the original data blocks and the incremental data blocks is k. The generated second incremental global parity block meets the encoding feature of the erasure code.

With reference to the first aspect, in a possible implementation of the first aspect, that when a sum of a quantity of data blocks in the original data block and the quantity of data blocks in the incremental data block is equal to k, the encoder side encodes the first incremental global parity block y by using a first parity matrix to generate a second incremental global parity block y** includes obtaining the second incremental global parity block through calculation by using the following method:

$$y^{**} = \left(H_y^{-1} \times H_{ys}\right) \times y.$$

y** is the second incremental global parity block, y is the first incremental global parity block, and $H_y^{-1} \times H_{ys}$ is the first parity matrix.

With reference to the first aspect, in a possible implementation of the first aspect, that the encoder side performs encoding processing on the incremental data block by using the erasure code to generate an incremental parity block includes the following.

The encoder side performs encoding processing on the incremental data block by using a first incremental parity matrix $H_{in}^i$ to generate the incremental parity block, where the first incremental parity matrix $H_{in}^i$ is a submatrix of a global parity matrix H of the erasure code.

In embodiments of this disclosure, the encoder side performs encoding processing on the incremental data block by using the first incremental parity matrix with low complexity to effectively reduce calculation overheads of the encoder side.

With reference to the first aspect, in a possible implementation of the first aspect, the method further includes the following.

When a maximum quantity of data blocks that can be encoded by using the erasure code is k, a quantity of global parity blocks generated by the encoder side by performing encoding processing on the data blocks by using the erasure code is n−k, the global parity block is used to reconstruct a damaged data block in the data blocks on which encoding processing is performed, k is a positive integer, n is a positive integer, and n is greater than k, the encoder side determines the first intermediate parity matrix from the global parity matrix of the erasure code, where the first intermediate parity matrix is last n−k columns of the global parity matrix H of the erasure code, and the first intermediate parity matrix is set to $H_y$, the encoder side determines the second intermediate parity matrix from the global parity matrix of the erasure code, where the second intermediate parity matrix is first k columns of the global parity matrix H of the erasure code, and the second intermediate parity matrix is set to $H_x$, and the encoder side determines the first incremental parity matrix from the second intermediate parity matrix $H_x$ based on the incremental data block, where the first incremental parity matrix is formed by performing column juxtaposition on columns that correspond to the incremental data block and that are of the second intermediate parity matrix. The first incremental parity matrix is set to $H_{in}^i$. For example, the incremental data block includes $x_1$, $x_2$, and $x_3$, and the incremental data block corresponds to vectors in first, second, and third columns of the second intermediate parity matrix. The encoder side performs column juxtaposition based on the vectors in the first, second, and third columns of the second intermediate parity matrix to form the first incremental parity matrix $H_{in}^i$.

With reference to the first aspect, in a possible implementation of the first aspect, that the encoder side performs encoding processing on the incremental data block by using a first incremental parity matrix $H_{in}^i$ to generate the incremental parity block includes obtaining the incremental parity block through calculation by using the following method:

$$y_{in}^i = H_{in}^i \times x_{in}^i.$$

An incremental data vector including incremental data blocks is $x_{in}^i$, where $x_{in}^i=[x_{b_i+1}, x_{b_i+2}, \ldots, x_{b_i+t_i}]^T$, and an incremental parity vector including incremental parity blocks is $y_{in}^i$, where $y_{in}^i=[y_{in,1}, y_{in,2}, \ldots, y_{in,n-k}]^T$. $b_i+1$ indicates a location sequence number of an initial data block of $x_{in}^i$ in the global data vector $x=[x_1, x_2, \ldots, x_k]^T$, and i is an integer greater than 1.

With reference to the first aspect, in a possible implementation of the first aspect, after that the encoder side performs an exclusive OR operation based on the incremental parity block and an original global parity block to generate a first incremental global parity block, the method further includes the following.

To further improve data reliability, when a sum of a quantity of data blocks in the original data block and a quantity of data blocks in the incremental data block is equal to k, the encoder side encodes the first intermediate incremental global parity block y by using an inverse matrix of the first intermediate parity matrix to generate a third incremental global parity block y***, where the third incremental global parity block is used to reconstruct a damaged data block in the original data blocks and the incremental data blocks, wherein a total quantity of the original data blocks and the incremental data blocks is k.

Because the encoder side performs encoding processing on the first incremental global parity block only after encoded data blocks reach an upper limit of the encoding group to obtain the third incremental global parity block, data reliability can be ensured, and encoding performance can be improved.

With reference to the first aspect, in a possible implementation of the first aspect, that when a sum of a quantity of data blocks in the original data block and a quantity of data blocks in the incremental data block is equal to k, the encoder side encodes the first incremental global parity block y by using an inverse matrix of the first intermediate parity matrix to generate a third incremental global parity block y*** includes obtaining the third incremental global parity block through calculation by using the following method:

$$y^{***} = H_y^{-1} \times y.$$

y*** is the third incremental global parity block, $H_y^{-1}$ is the inverse matrix of the first intermediate parity matrix, and y is the first incremental global parity block.

With reference to the first aspect, in a possible implementation of the first aspect, the method further includes the following. The encoder side performs three-copy backup processing on the first incremental global parity block.

Further, because the second intermediate parity matrix may include an $r^{th}$-order singular submatrix, where r is an integer and $2 \leq r \leq k$, encoding processing performed by the encoder side based on a submatrix (namely, the first incremental parity matrix) of the second intermediate parity matrix may fail to meet an MDS feature. To resolve this problem, the encoder side needs to perform backup processing on the first incremental global parity block to ensure data reliability of the first incremental global parity block, and further ensure the data reliability of the finally generated first incremental global parity block. For example, the encoder side performs three-copy backup processing on the first incremental global parity block. An example in which a quantity of first incremental global parity blocks is P is used for description, and P is an integer greater than or equal to 1. When any quantity of blocks, less than or equal to P, in the original data block, the incremental data block, and the first incremental global parity block is lost, the encoder side may reconstruct the lost data block by using the backup first incremental global parity block, thereby ensuring the data reliability.

With reference to the first aspect, in a possible implementation of the first aspect, the first incremental global parity block further includes redundant data.

Optionally, the encoder side performs exclusive OR processing on P first incremental global parity blocks to generate a backup parity block. The encoder side performs backup processing on the backup parity block. For example, the encoder side performs three-copy backup processing on the backup parity block. A use of the backup parity block is similar to a use of the backup first incremental global parity block. When any quantity of blocks, less than or equal to P, in the original data block, the incremental data block, and the first incremental global parity block is lost, the encoder side may reconstruct the lost data block by using the backup parity block, thereby ensuring the data reliability.

Optionally, the encoder side may further add the redundant data to the first incremental global parity block to ensure the data reliability of the first incremental global parity block. Further, the encoder side performs the exclusive OR operation based on the incremental parity block and the original global parity block to generate the first incremental global parity block. The encoder side adds the redundant data to the first incremental global parity block. Optionally, the redundant data may be generated based on the first incremental global parity block. A storage device stores the first incremental global parity block to which the redundant data is added. A decoder side reconstructs a damaged block in the original data block, the incremental data block, and the first incremental global parity block by using the first incremental global parity block to which the redundant data is added.

According to a second aspect, an embodiment of this disclosure provides an encoding device, where the encoding device may be used in an encoder side and includes a processing module or a transceiver module configured to obtain a plurality of data blocks in batches, where the plurality of data blocks belongs to a same encoding group.

The processing module is further configured to perform encoding processing on the plurality of data blocks by using erasure code. In an $i^{th}$ time of encoding, after obtaining an incremental data block, the encoder side performs encoding processing on the incremental data block by using the erasure code to generate an incremental parity block, the incremental data block includes at least one data block, and i is an integer greater than 1.

The processing module is further configured to perform an exclusive OR operation based on the incremental parity block and an original global parity block to generate a first incremental global parity block. The original global parity block is a first incremental global parity block generated by the encoder side in an $(i-1)^{th}$ time of encoding, the original global parity block is used to reconstruct a damaged data block in an original data block, the original data block is a data block obtained by the encoder side before the $(i-1)^{th}$ time of encoding, and the original data block and the incremental data block belong to a same encoding group. The first incremental global parity block is used to reconstruct a damaged data block in the original data block and the incremental data block.

In a possible implementation, the processing module is further configured to determine a quantity of data blocks in the incremental data block.

The processing module is further configured to, when the quantity of data blocks in the incremental data block is less than or equal to a first encoding threshold $t_{th}$, perform encoding processing on the incremental data block by using a first incremental encoding matrix $G_{in}^i$ to generate the incremental parity block.

Alternatively, the processing module is further configured to, when the quantity of data blocks in the incremental data block is greater than the first encoding threshold $t_{th}$, perform encoding processing on the incremental data block by using a first incremental parity matrix $H_{in}^i$ and an inverse matrix of a first intermediate parity matrix $H_y$ to generate the incremental parity block.

The first incremental encoding matrix $G_{in}^i$ is a submatrix of a global encoding matrix G of the erasure code, a product of the first incremental parity matrix $H_{in}^i$ and the inverse matrix of the first intermediate parity matrix $H_y$ is equal to the first incremental encoding matrix $G_{in}^i$, and the first intermediate parity matrix $H_y$ is a submatrix of a global parity matrix H of the erasure code.

In a possible implementation, when a maximum quantity of data blocks that can be encoded by using the erasure code is k, a quantity of global parity blocks generated by the encoder side by performing encoding processing on the data blocks by using the erasure code is n–k, the global parity block is used to reconstruct a damaged data block in the data blocks on which encoding processing is performed, k is a positive integer, n is a positive integer, and n is greater than k, the processing module is further configured to determine the first incremental encoding matrix $G_{in}^i$ from the global encoding matrix G of the erasure code based on the incremental data block, where the first incremental encoding matrix $G_{in}^i$ is formed by performing column juxtaposition on columns that correspond to the incremental data block and that are of the global encoding matrix G of the erasure code, the processing module is further configured to determine the first intermediate parity matrix $H_y$ from the global parity matrix H of the erasure code, where the first intermediate parity matrix $H_y$ is last n–k columns of the global parity matrix H of the erasure code, or the processing module is further configured to determine a second intermediate parity matrix $H_x$ from the global parity matrix H of the erasure code, where the second intermediate parity matrix $H_x$ is first k columns of the global parity matrix H of the erasure code, and the processing module is further configured to determine the first incremental parity matrix $H_{in}^i$ from the second intermediate parity matrix $H_x$ based on the incremental data block, where the first incremental parity matrix $H_{in}^i$ is formed by performing column juxtaposition on columns that correspond to the incremental data block and that are of the second intermediate parity matrix $H_x$.

In a possible implementation, G is the global encoding matrix of the erasure code, H is the global parity matrix of the erasure code, and G and H meet the following relationships:

$$H = [H_x \mid H_y],$$

and $$G = H_y^{-1} \times H_x.$$

$H_y$ is the first intermediate parity matrix, the first intermediate parity matrix $H_y$ is the last n–k columns of the global parity matrix H of the erasure code, $H_x$ is the second intermediate parity matrix, and the second intermediate parity matrix $H_x$ is the first k columns of the global parity matrix H of the erasure code.

$G_{in}^i$ is the first incremental encoding matrix, $H_{in}^i$ is the first incremental parity matrix, and $G_{in}^i$ and $H_{in}^i$ meet the following relationship:

$$G_{in}^i = H_y^{-1} \times H_{in}^i.$$

In a possible implementation, the processing module is further configured to obtain the incremental parity block through calculation by using the following method:

$$y_{in}^i = G_{in}^i \times x_{in}^i.$$

An incremental data vector including incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in a global data vector $x = [x_1, x_2, \ldots, x_k]^T$, and the global data vector is a vector including data blocks of the encoding group.

In a possible implementation, the processing module is further configured to obtain the incremental parity block through calculation b using the following method:

$$s_{in}^i = H_{in}^i \times x_{in}^i,$$

and $$y_{in}^i = H_y^{-1} \times s_{in}^i.$$

An incremental data vector including incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in a global data vector $x = [x_1, x_2, \ldots, x_k]^T$, and $s_{in}^i$ is a first syndrome.

In a possible implementation, the processing module is further configured to obtain the first incremental global parity block through calculation by using the following method:

$$y = y^* + y_{in}^i.$$

y is the first incremental global parity block, y* is the original global parity block, $y_{in}^i$ is the incremental parity block, and + is an operator of the exclusive OR operation in a finite field.

In a possible implementation, when the maximum quantity of data blocks that can be encoded by using the erasure code is k, the quantity of global parity blocks generated by the encoder side by performing encoding processing on the data blocks by using the erasure code is n–k, the global parity block is used to reconstruct the damaged data block in the data blocks on which encoding processing is performed, k is a positive integer, n is a positive integer, and n is greater than k, the processing module is further configured to determine the first intermediate parity matrix $H_y$ from the global parity matrix of the erasure code based on the incremental data block, where the first intermediate parity matrix $H_y$ is the last n−k columns of the global parity matrix H of the erasure code, or the processing module is further configured to determine the second intermediate parity matrix $H_x$ from the global parity matrix of the erasure code based on the incremental data block, where the second intermediate parity matrix $H_x$ is the first k columns of the global parity matrix H of the erasure code, and the processing module is further configured to determine the first incremental parity matrix $H_{in}{}^i$ from the second intermediate parity matrix $H_x$ based on the incremental data block, where the first incremental parity matrix is formed by performing column juxtaposition on the columns that correspond to the incremental data block and that are of the second intermediate parity matrix.

The processing module is further configured to determine a third intermediate parity matrix $H_{ys}$ based on the global parity matrix H of the erasure code. Density of an inverse matrix of the third intermediate parity matrix is lower than density of the inverse matrix of the first intermediate parity matrix, and any (n−k)$^{th}$-order submatrix of a matrix $[H_x|H_{ys}]$ is nonsingular.

The processing module is further configured to determine a second incremental encoding matrix $G_{ins}{}^i$ based on the second intermediate parity matrix $H_x$ and the third intermediate parity matrix $H_{ys}$. The second incremental encoding matrix $G_{ins}{}^i$ is a product of the first incremental parity matrix $H_{in}{}^i$ and the inverse matrix of the third intermediate parity matrix $H_{ys}$.

The processing module is further configured to determine the quantity of data blocks in the incremental data block.

The processing module is further configured to, when the quantity of data blocks in the incremental data block is less than or equal to $t_{th}$, perform encoding processing on the incremental data block by using the second incremental encoding matrix $G_{ins}{}^i$ to generate the incremental parity block.

Alternatively, the processing module is further configured to, when the quantity of data blocks in the incremental data block is greater than $t_{th}$, perform encoding processing on the incremental data block by using the first incremental parity matrix $H_{in}{}^i$ and the inverse matrix of the third intermediate parity matrix $H_{ys}$ to generate the incremental parity block.

In a possible implementation, the processing module is further configured to obtain the incremental parity block through calculation by using the following method:

$$y_{in}^i = G_{ins}^i \times x_{in}^i.$$

An incremental data vector including incremental data blocks is $x_{in}{}^i$, where $x_{in}{}^i=[x_{b_i+1}, x_{b_i+2}, \ldots, x_{b_i+t_i}]^T$, and an incremental parity vector including incremental parity blocks is $y_{in}{}^i$, where $y_{in}{}^i=[y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and the global data vector is a vector including data blocks of the encoding group.

In a possible implementation, the processing module is further configured to obtain the incremental parity block through calculation b using the following method:

$$s_{in}^i = H_{in}^i \times x_{in}^i,$$

and $$y_{in}^i = H_{ys}^{-1} \times s_{in}^i.$$

An incremental data vector including incremental data blocks is $x_{in}{}^i$, where $x_{in}{}^i=[x_{b_i+1}, x_{b_i+2}, \ldots, x_{b_i+t_i}]^T$, and an incremental parity vector including incremental parity blocks is $y_{in}{}^i$, where $y_{in}{}^i=[y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and $s_{in}{}^i$ is a first syndrome.

In a possible implementation, the processing module is further configured to, when a sum of a quantity of data blocks in the original data block and the quantity of data blocks in the incremental data block is equal to k, encode the first incremental global parity block y by using a first parity matrix to generate a second incremental global parity block y**. The first parity matrix is a product of the inverse matrix of the first intermediate parity matrix $H_y$ and the third intermediate parity matrix $H_{ys}$, and the second incremental global parity block is used to reconstruct a damaged data block in the original data blocks and the incremental data blocks, wherein a total quantity of the original data blocks and the incremental data blocks is k.

In a possible implementation, that the processing module is further configured to, when a sum of a quantity of data blocks in the original data block and the quantity of data blocks in the incremental data block is equal to k, encode the first incremental global parity block y by using a first parity matrix to generate a second incremental global parity block y** includes obtaining the second incremental global parity block through calculation by using the following method:

$$y^{**} = \left(H_y^{-1} \times H_{ys}\right) \times y.$$

y** is the second incremental global parity block, y is the first incremental global parity block, and $H_y^{-1} \times H_y$ is the first parity matrix.

In a possible implementation, the processing module is further configured to perform encoding processing on the incremental data block by using a first incremental parity matrix $H_{in}{}^i$ to generate the incremental parity block.

The first incremental parity matrix $H_{in}{}^i$ is a submatrix of a global parity matrix H of the erasure code.

In a possible implementation, when a maximum quantity of data blocks that can be encoded by using the erasure code is k, a quantity of global parity blocks generated by the encoder side by performing encoding processing on the data blocks by using the erasure code is n−k, the global parity block is used to reconstruct a damaged data block in the data blocks on which encoding processing is performed, k is a positive integer, n is a positive integer, and n is greater than k, the processing module is further configured to determine a first intermediate parity matrix from the global parity matrix of the erasure code, where the first intermediate parity matrix is last n−k columns of the global parity matrix H of the erasure code, the processing module is further configured to determine a second intermediate parity matrix $H_x$ from the global parity matrix H of the erasure code, where the second intermediate parity matrix $H_x$ is first k columns of the global parity matrix H of the erasure code, and the processing module is further configured to determine the first incremental parity matrix $H_{in}{}^i$ from the second intermediate parity matrix $H_x$ based on the incremental data block, where the first incremental parity matrix $H_{in}{}^i$ is formed by performing column juxtaposition on columns that correspond to the incremental data block and that are of the second intermediate parity matrix $H_x$.

In a possible implementation, the processing module is further configured to obtain the incremental parity block through calculation by using the following method:

$$y_{in}^i = H_{in}^i \times x_{in}^i.$$

An incremental data vector including incremental data blocks is $x_{in}{}^i$, where $x_{in}{}^i=[x_{b_i+1}, x_{b_i+2}, \ldots, x_{b_i+t_i}]^T$, and an incremental parity vector including incremental parity blocks is $y_{in}{}^i$, where $y_{in}{}^i=[y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and i is an integer greater than 1.

In a possible implementation, the processing module is further configured to, when a sum of a quantity of data blocks in the original data block and a quantity of data blocks in the incremental data block is equal to k, encode the first intermediate incremental global parity block y by using an inverse matrix of the first intermediate parity matrix to generate a third incremental global parity block y***, where the third incremental global parity block is used to reconstruct a damaged data block in the original data blocks and the incremental data blocks, wherein a total quantity of the original data blocks and the incremental data blocks is k.

In a possible implementation, the processing module is further configured to obtain the third incremental global parity block through calculation by using the following method:

$$y^{***} = H_y^{-1} \times y.$$

y*** is the third incremental global parity block, $H_y^{-1}$ is the inverse matrix of the first intermediate parity matrix, and y is the first incremental global parity block.

In a possible implementation, the processing module is further configured to perform three-copy backup processing on the first incremental global parity block.

In a possible implementation, the first incremental global parity block further includes redundant data.

According to a third aspect, an embodiment of this disclosure provides an encoding device, where the encoding device may be used in an encoder side and includes a processor or a transceiver configured to obtain a plurality of data blocks in batches, where the plurality of data blocks belongs to a same encoding group.

The processor is further configured to perform encoding processing on the plurality of data blocks by using erasure code. In an $i^{th}$ time of encoding, after obtaining an incremental data block, the encoder side performs encoding processing on the incremental data block by using the erasure code to generate an incremental parity block, the incremental data block includes at least one data block, and i is an integer greater than 1.

The processor is further configured to perform an exclusive OR operation based on the incremental parity block and an original global parity block to generate a first incremental global parity block. The original global parity block is a first incremental global parity block generated by the encoder side in an $(i-1)^{th}$ time of encoding, the original global parity block is used to reconstruct a damaged data block in an original data block, the original data block is a data block obtained by the encoder side before the $(i-1)^{th}$ time of encoding, and the original data block and the incremental data block belong to a same encoding group. The first incremental global parity block is used to reconstruct a damaged data block in the original data block and the incremental data block.

In a possible implementation, the processor is further configured to determine a quantity of data blocks in the incremental data block.

The processor is further configured to, when the quantity of data blocks in the incremental data block is less than or equal to a first encoding threshold $t_{th}$, perform encoding processing on the incremental data block by using a first incremental encoding matrix $G_{in}{}^i$ to generate the incremental parity block.

Alternatively, the processor is further configured to, when the quantity of data blocks in the incremental data block is greater than the first encoding threshold $t_{th}$, perform encoding processing on the incremental data block by using a first incremental parity matrix $H_{in}{}^i$ and an inverse matrix of a first intermediate parity matrix $H_y$ to generate the incremental parity block.

The first incremental encoding matrix $G_{in}{}^i$ is a submatrix of a global encoding matrix G of the erasure code, a product of the first incremental parity matrix $H_{in}{}^i$ and the inverse matrix of the first intermediate parity matrix $H_y$ is equal to the first incremental encoding matrix $G_{in}{}^i$, and the first intermediate parity matrix $H_y$ is a submatrix of a global parity matrix H of the erasure code.

In a possible implementation, when a maximum quantity of data blocks that can be encoded by using the erasure code is k, a quantity of global parity blocks generated by the encoder side by performing encoding processing on the data blocks by using the erasure code is n–k, the global parity block is used to reconstruct a damaged data block in the data blocks on which encoding processing is performed, k is a positive integer, n is a positive integer, and n is greater than k, the processor is further configured to determine the first incremental encoding matrix $G_{in}{}^i$ from the global encoding matrix G of the erasure code based on the incremental data block, where the first incremental encoding matrix $G_{in}{}^i$ is formed by performing column juxtaposition on columns that correspond to the incremental data block and that are of the global encoding matrix G of the erasure code, the processor is further configured to determine the first intermediate parity matrix $H_y$ from the global parity matrix H of the erasure code, where the first intermediate parity matrix $H_y$ is last n–k columns of the global parity matrix H of the erasure code, or the processor is further configured to determine a second intermediate parity matrix $H_x$ from the global parity matrix H of the erasure code, where the second intermediate parity matrix $H_x$ is first k columns of the global parity matrix H of the erasure code, and the processor is further configured to determine the first incremental parity matrix $H_{in}{}^i$ from the second intermediate parity matrix $H_x$ based on the incremental data block, where the first incremental parity matrix $H_{in}{}^i$ is formed by performing column juxtaposition on columns that correspond to the incremental data block and that are of the second intermediate parity matrix $H_x$.

In a possible implementation, G is the global encoding matrix of the erasure code, H is the global parity matrix of the erasure code, and G and H meet the following relationships:

$$H = [H_x \mid H_y],$$

and $$G = H_y^{-1} \times H_x.$$

$H_y$ is the first intermediate parity matrix, the first intermediate parity matrix $H_y$ is the last n−k columns of the global parity matrix H of the erasure code, $H_x$ is the second intermediate parity matrix, and the second intermediate parity matrix $H_x$ is the first k columns of the global parity matrix H of the erasure code.

$G_{in}{}^i$ is the first incremental encoding matrix, $H_{in}{}^i$ is the first incremental parity matrix, and $G_{in}{}^i$ and $H_{in}{}^i$ meet the following relationship:

$$G_{in}^i = H_y^{-1} \times H_{in}^i.$$

In a possible implementation, the processor is further configured to obtain the incremental parity block through calculation by using the following method:

$$y_{in}^i = G_{in}^i \times x_{in}^i.$$

An incremental data vector including incremental data blocks is $x_{in}{}^i$, where $x_{in}{}^i = [x_{b_i+1}, x_{b_i+2}, \ldots, x_{b_i+t_i}]^T$, and an incremental parity vector including incremental parity blocks is $y_{in}{}^i$, where $y_{in}{}^i = [y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and the global data vector is a vector including data blocks of the encoding group.

In a possible implementation, the processor is further configured to obtain the incremental parity block through calculation by using the following method:

$$s_{in}^i = H_{in}^i \times x_{in}^i,$$

and $$y_{in}^i = H_y^{-1} \times s_{in}^i.$$

An incremental data vector including incremental data blocks is $x_{in}{}^i$, where $x_{in}{}^i = [x_{b_i+1}, x_{b_i+2}, \ldots, x_{b_i+t_i}]^T$, and an incremental parity vector including incremental parity blocks is $y_{in}{}^i$, where $y_{in}{}^i = [y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and $s_{in}{}^i$ is a first syndrome.

In a possible implementation, the processor is further configured to obtain the first incremental global parity block through calculation b using the following method:

$$y = y^* + y_{in}^i.$$

y is the first incremental global parity block, y* is the original global parity block, $y_{in}{}^i$ is the incremental parity block, and + is an operator of the exclusive OR operation in a finite field.

In a possible implementation, when a maximum quantity of data blocks that can be encoded by using the erasure code is k, a quantity of global parity blocks generated by the encoder side by performing encoding processing on the data blocks by using the erasure code is n−k, the global parity block is used to reconstruct a damaged data block in the data blocks on which encoding processing is performed, k is a positive integer, n is a positive integer, and n is greater than k, the processor is further configured to determine the first intermediate parity matrix $H_y$ from the global parity matrix of the erasure code based on the incremental data block, where the first intermediate parity matrix $H_y$ is the last n−k columns of the global parity matrix H of the erasure code, or the processor is further configured to determine the second intermediate parity matrix $H_x$ from the global parity matrix of the erasure code based on the incremental data block, where the second intermediate parity matrix $H_x$ is the first k columns of the global parity matrix H of the erasure code, and the processor is further configured to determine the first incremental parity matrix $H_{in}{}^i$ from the second intermediate parity matrix $H_x$ based on the incremental data block, where the first incremental parity matrix is formed by performing column juxtaposition on columns that correspond to the incremental data block and that are of the second intermediate parity matrix.

The processor is further configured to determine a third intermediate parity matrix $H_{ys}$ based on the global parity matrix H of the erasure code. Density of an inverse matrix of the third intermediate parity matrix is lower than density of the inverse matrix of the first intermediate parity matrix, and any $(n-k)^{th}$-order submatrix of a matrix $[H_x | H_{ys}]$ is nonsingular.

The processor is further configured to determine a second incremental encoding matrix $G_{ins}{}^i$ based on the second intermediate parity matrix $H_x$ and the third intermediate parity matrix $H_{ys}$. The second incremental encoding matrix $G_{ins}{}^i$ is a product of the first incremental parity matrix $H_{in}{}^i$ and the inverse matrix of the third intermediate parity matrix $H_{ys}$.

The processor is further configured to determine a quantity of data blocks in the incremental data block.

The processor is further configured to, when the quantity of data blocks in the incremental data block is less than or equal to $t_{th}$, perform encoding processing on the incremental data block by using the second incremental encoding matrix $G_{ins}{}^i$ to generate the incremental parity block.

Alternatively, the processor is further configured to, when the quantity of data blocks in the incremental data block is greater than $t_{th}$, perform encoding processing on the incremental data block by using the first incremental parity matrix $H_{in}{}^i$ and the inverse matrix of the third intermediate parity matrix $H_{ys}$ to generate the incremental parity block.

In a possible implementation, the processor is further configured to obtain the incremental parity block through calculation by using the following method:

$$y_{in}^i = G_{ins}^i \times x_{in}^i.$$

An incremental data vector including incremental data blocks is $x_{in}{}^i$, where $x_{in}{}^i = [x_{b_i+1}, x_{b_i+2}, \ldots, x_{b_i+t_i}]^T$, and an incremental parity vector including incremental parity blocks is $y_{in}{}^i$, where $y_{in}{}^i = [y_{in,1}, y_{in,2}, \ldots, y_{in,n-k}]^T$. $b_i+1$ indicates a location sequence number of an initial data block of $x_{in}^{\ i}$ in a global data vector $x=[x_1, x_2, \ldots, x_k]^T$, and the global data vector is a vector including data blocks of the encoding group.

In a possible implementation, the processor is further configured to obtain the incremental parity block through calculation by using the following method:

$$s_{in}^i = H_{in}^i \times x_{in}^i,$$

and $$y_{in}^j = H_{ys}^{-1} \times s_{in}^i.$$

An incremental data vector including incremental data blocks is $x_{in}^{\ i}$, where $x_{in}^{\ i}=[x_{b_i+1}, x_{b_i+2}, \ldots, x_{b_i+t_i}]^T$, and an incremental parity vector including incremental parity blocks is $y_{in}^{\ i}$, where $y_{in}^{\ i}=[y_{in,1}, y_{in,2}, \ldots, y_{in,n-k}]^T$. $b_i+1$ indicates a location sequence number of an initial data block of $x_{in}^{\ i}$ in a global data vector $x=[x_1, x_2, \ldots, x_k]^T$, and $s_{in}^{\ i}$ is a first syndrome.

In a possible implementation, the processor is further configured to, when a sum of a quantity of data blocks in the original data block and the quantity of data blocks in the incremental data block is equal to k, encode the first incremental global parity block y by using a first parity matrix to generate a second incremental global parity block y**. The first parity matrix is a product of the inverse matrix of the first intermediate parity matrix $H_y$ and the third intermediate parity matrix $H_{ys}$, and the second incremental global parity block is used to reconstruct a damaged data block in the original data blocks and the incremental data blocks, wherein a total quantity of the original data blocks and the incremental data blocks is k.

In a possible implementation, that the processor is further configured to, when a sum of a quantity of data blocks in the original data block and the quantity of data blocks in the incremental data block is equal to k, encode the first incremental global parity block y by using a first parity matrix to generate a second incremental global parity block y** includes obtaining the second incremental global parity block through calculation by using the following method:

$$y^{**} = \left(H_y^{-1} \times H_{ys}\right) \times y.$$

y** is the second incremental global parity block, y is the first incremental global parity block, and $H_y^{-1} \times H_{ys}$ is the first parity matrix.

In a possible implementation, the processor is further configured to perform encoding processing on the incremental data block by using a first incremental parity matrix $H_{in}^{\ i}$ to generate the incremental parity block.

The first incremental parity matrix $H_{in}^{\ i}$ is a submatrix of a global parity matrix H of the erasure code.

In a possible implementation, when a maximum quantity of data blocks that can be encoded by using the erasure code is k, a quantity of global parity blocks generated by the encoder side by performing encoding processing on the data blocks by using the erasure code is n−k, the global parity block is used to reconstruct a damaged data block in the data blocks on which encoding processing is performed, k is a positive integer, n is a positive integer, and n is greater than k, the processor is further configured to determine a first intermediate parity matrix from the global parity matrix of the erasure code, where the first intermediate parity matrix is last n−k columns of the global parity matrix H of the erasure code, the processor is further configured to determine a second intermediate parity matrix $H_x$ from the global parity matrix H of the erasure code, where the second intermediate parity matrix $H_x$ is first k columns of the global parity matrix H of the erasure code, and the processor is further configured to determine the first incremental parity matrix $H_{in}^{\ i}$ from the second intermediate parity matrix $H_x$ based on the incremental data block, where the first incremental parity matrix $H_{in}^{\ i}$ is formed by performing column juxtaposition on columns that correspond to the incremental data block and that are of the second intermediate parity matrix $H_x$.

In a possible implementation, the processor is further configured to obtain the incremental parity block through calculation by using the following method:

$$y_{in}^i = H_{in}^i \times x_{in}^i.$$

An incremental data vector including incremental data blocks is $x_{in}^{\ i}$, where $x_{in}^{\ i}=[x_{b_i+1}, x_{b_i+2}, \ldots, x_{b_i+t_i}]^T$, and an incremental parity vector including incremental parity blocks is $y_{in}^{\ i}$, where $y_{in}^{\ i}=[y_{in,1}, y_{in,2}, \ldots, y_{in,n-k}]^T$. $b_i+1$ indicates a location sequence number of an initial data block of $x_{in}^{\ i}$ in a global data vector $x=[x_1, x_2, \ldots, x_k]^T$, and i is an integer greater than 1.

In a possible implementation, the processor is further configured to, when a sum of a quantity of data blocks in the original data block and a quantity of data blocks in the incremental data block is equal to k, encode the first intermediate incremental global parity block y by using an inverse matrix of the first intermediate parity matrix to generate a third incremental global parity block y***, where the third incremental global parity block is used to reconstruct a damaged data block in the original data blocks and the incremental data blocks, wherein a total quantity of the original data blocks and the incremental data blocks is k.

In a possible implementation, the processor is further configured to obtain the third incremental global parity block through calculation by using the following method:

$$y^{***} = H_y^{-1} \times y.$$

y*** is the third incremental global parity block, $H_y^{-1}$ is the inverse matrix of the first intermediate parity matrix, and y is the first incremental global parity block.

In a possible implementation, the processor is further configured to perform three-copy backup processing on the first incremental global parity block.

In a possible implementation, the first incremental global parity block further includes redundant data.

According to a fourth aspect, an embodiment of this disclosure provides an encoding device. The encoding device may implement functions performed by the encoder side in the method according to the first aspect. The encoding device includes a processor, a memory, a receiver connected to the processor, and a transmitter connected to the processor. The memory is configured to store program code, and transmit the program code to the processor. The processor is configured to drive, according to instructions in the program code, the receiver and the transmitter to perform the method according to the first aspect. The receiver and the transmitter are separately connected to the processor to perform operations performed by the encoder side in the method in the foregoing aspects. Further, the transmitter may perform a sending operation, and the receiver may perform a receiving operation. Optionally, the receiver and the transmitter may be a radio frequency circuit, and the radio frequency circuit receives and sends a message through an antenna. Alternatively, the receiver and the transmitter may be a communication interface. The processor is connected to the communication interface through a bus, and the processor receives or sends a message through the communication interface.

According to a fifth aspect, an embodiment of this disclosure provides a storage system, including a storage node and an encoder side.

The encoder side performs the method according to the first aspect, and performs encoding processing on to-be-written data of the storage node to generate a first incremental global parity block. The storage node is configured to store the to-be-written data and the first incremental global parity block.

According to a sixth aspect, an embodiment of this disclosure provides a coding system, including an encoder side and a decoder side.

The encoder side performs the method according to the first aspect.

The decoder side performs a decoding method corresponding to the method according to the first aspect.

The encoder side is configured to perform encoding processing on to-be-transmitted data to generate a first incremental global parity block.

The decoder side is configured to perform decoding processing on the to-be-transmitted data and the first incremental global parity block.

According to a seventh aspect, an embodiment of this disclosure provides a computer-readable storage medium that stores one or more computer-executable instructions. When the computer-executable instructions are executed by a processor, the processor performs any one of the possible implementations of the first aspect.

According to an eighth aspect, an embodiment of this disclosure provides a computer program product (or referred to as a computer program) that stores one or more computer-executable instructions. When the computer-executable instructions are executed by a processor, the processor performs any one of the possible implementations of the first aspect.

According to a ninth aspect, this disclosure provides a chip system. The chip system includes a processor configured to support a computer device to implement functions in the foregoing aspects. In a possible design, the chip system further includes a memory. The memory is configured to store program instructions and data that are necessary for the computer device. The chip system may include a chip, or may include a chip and another discrete device.

According to a tenth aspect, an embodiment of this disclosure provides a chip system. The chip system includes at least one processor and a communication interface, the communication interface and the at least one processor are interconnected through a line, and the at least one processor is configured to run a computer program or instructions to perform the method according to the first aspect.

The communication interface in the chip system may be an input/output interface, a pin, a circuit, or the like.

With reference to the fifth aspect, in a first implementation of the fifth aspect of embodiments of this disclosure, the chip system described above in this disclosure further includes at least one memory, and the at least one memory stores instructions. The memory may be a storage unit in the chip system, for example, a register or a cache, or may be a storage unit (for example, a read-only memory (ROM) or a random-access memory (RAM)) of the chip.

DESCRIPTION OF EMBODIMENTS

The following clearly describes the technical solutions in embodiments of this disclosure with reference to the accompanying drawings in embodiments of this disclosure. It is clear that the described embodiments are merely some but not all of embodiments of this disclosure. In the specification, claims, and accompanying drawings of this disclosure, the terms "first", "second", corresponding term numbers, and the like are intended to distinguish between similar objects but do not necessarily indicate a specific order or sequence. It should be understood that the terms used in such a way are interchangeable in proper circumstances, and this is merely a distinguishing manner used when objects that have a same attribute are described in embodiments of this disclosure. In addition, terms "include", "have", and any other variations thereof are intended to cover non-exclusive inclusion, so that a process, method, system, product, or device that includes a series of units is not limited to those units, but may include other units not expressly listed or inherent to such a process, method, product, or device.

In descriptions of this disclosure, "/" means "or" unless otherwise specified. For example, A/B may indicate A or B. In this disclosure, "and/or" describes only an association relationship for describing associated objects and indicates that three relationships may exist. For example, A and/or B may indicate the following three cases: only A exists, both A and B exist, and only B exists. In addition, in the descriptions of this disclosure, "at least one item" means one or more items, and "a plurality of items" means two or more items. "At least one item (piece) of the following" or a similar expression thereof means any combination of these items, including a singular item (piece) or any combination of plural items (pieces). For example, at least one item (piece) of a, b, or c may indicate a, b, c, a and b, a and c, b and c, or a, b, and c, where a, b, and c may be singular or plural.

The technical solutions in embodiments of this disclosure may also be applied to various storage systems, for example, a centralized storage system or a distributed storage system.

The technical solutions in embodiments of this disclosure may be applied to various communication systems, for example, a Long-Term Evolution (LTE) system, an LTE frequency division duplex (FDD) system, an LTE time division duplex (TDD) system, a universal mobile telecommunications system (UMTS), a worldwide interoperability for microwave access (WIMAX) communication system, a fifth generation (5G) system (or a New Radio (NR) system), or a future sixth generation (6G) communication system.

For ease of understanding, the following describes application scenarios to which embodiments of this disclosure are applicable with reference to the accompanying drawings.

Figure 1A:
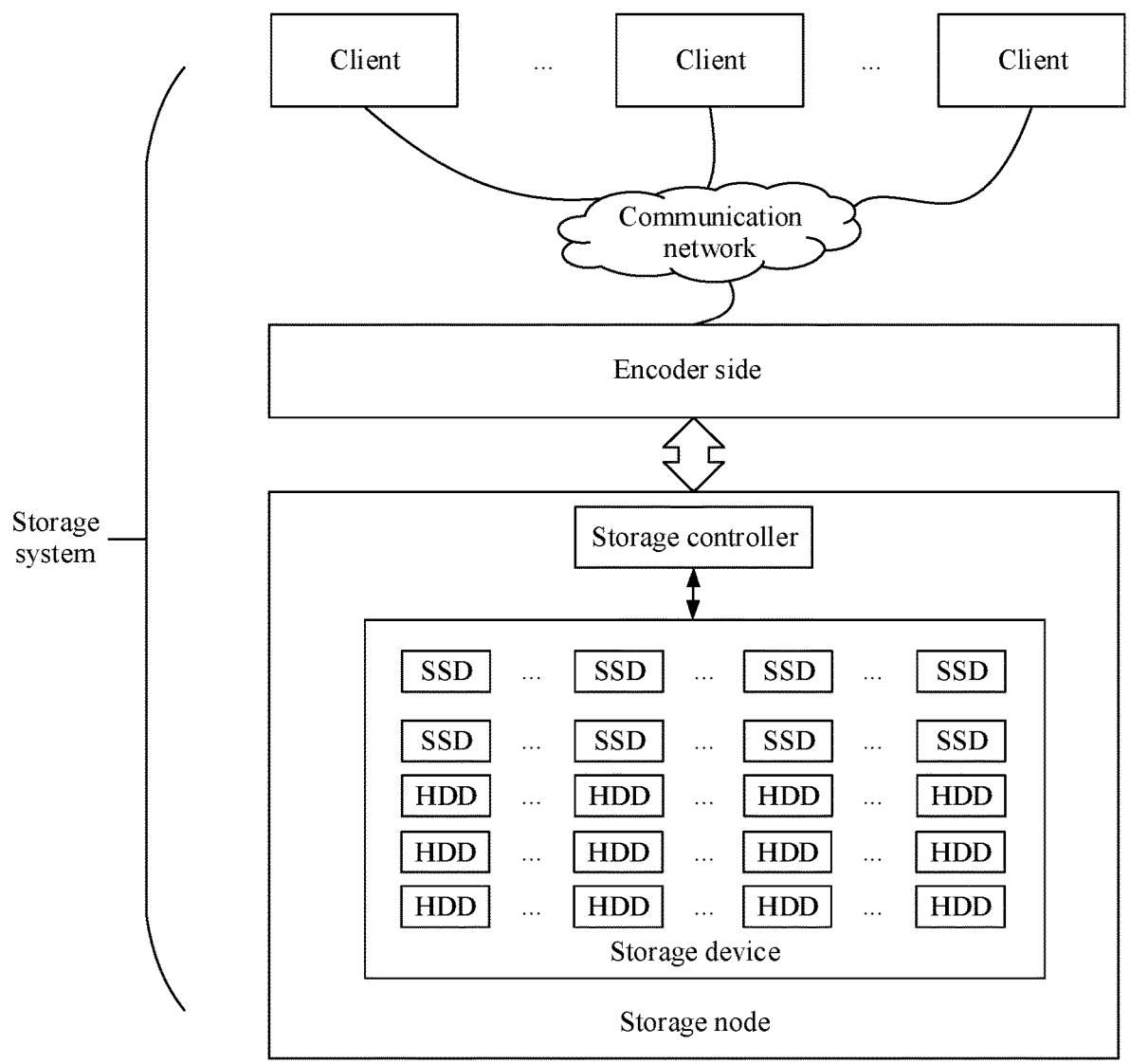
FIG. 1A is a schematic diagram of a storage system according to an embodiment of this disclosure.
Figure 1B:
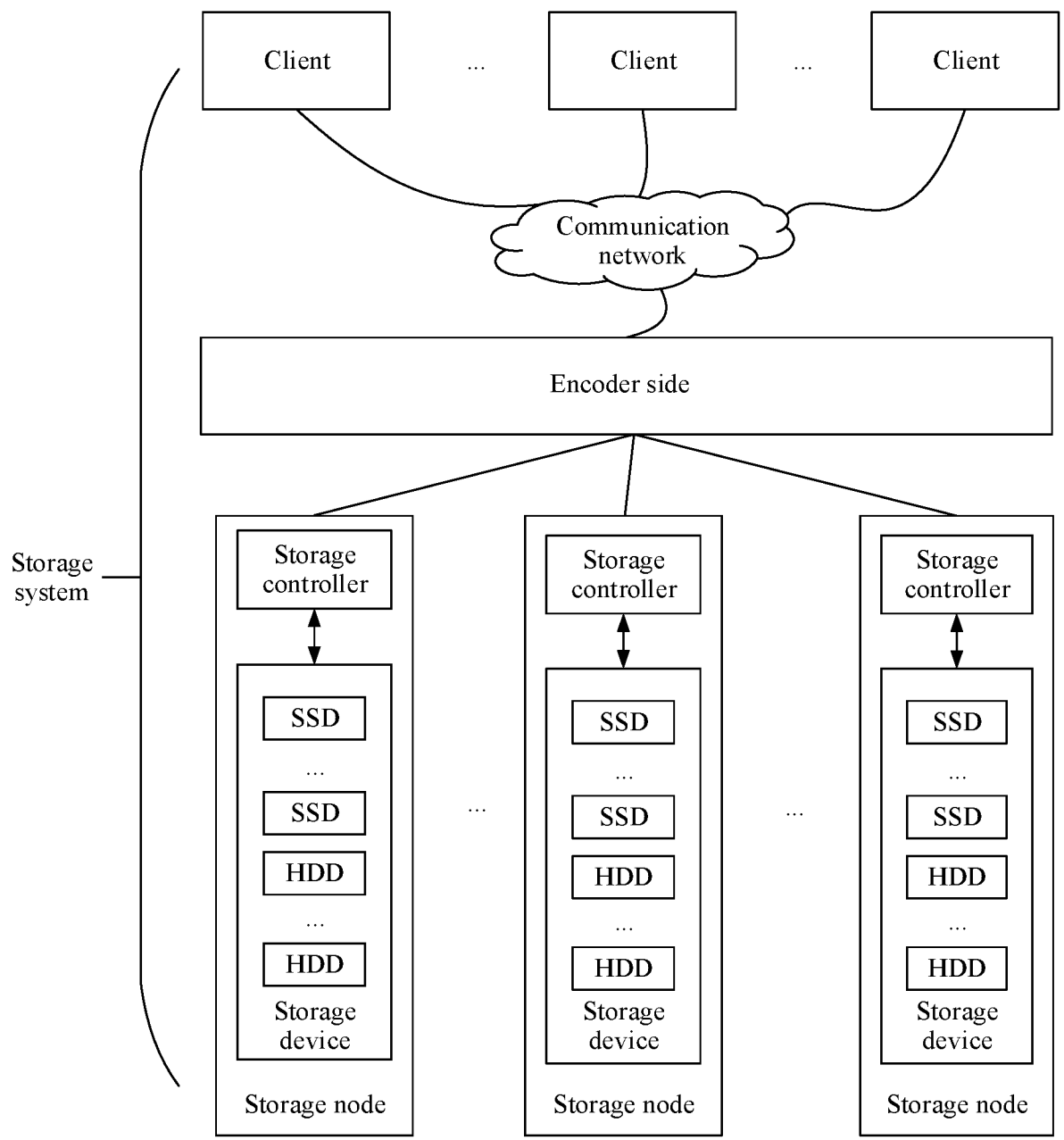
FIG. 1B is a schematic diagram of another storage system according to an embodiment of this disclosure.

Refer to FIG. 1A and FIG. 1B. FIG. 1A and FIG. 1B describe storage systems of two different architectures.

The storage system in FIG. 1A includes a storage node and at least one client. The client and the storage node are connected by using a communication network (for example, Ethernet or INFINIBAND). An encoder side and a plurality of storage devices are disposed in the storage node, and the storage node may actually be a storage array.

FIG. 1B shows a distributed storage system. The storage system includes at least one client and a plurality of storage nodes, and each storage node may actually be a server. The client and the storage node are connected to each other by using a communication network. The communication network may be the Ethernet or the INFINIBAND. This is not limited herein. At least one storage node in the storage system includes an encoder side, each storage node includes a storage device, and all the storage nodes establish communication connection to each other by using the communication network.

The storage devices in FIG. 1A and FIG. 1B may be hard disk drives (HDDs), solid state drives (SSDs), or storage disks of other types.

The encoder side in the storage node in FIG. 1A processes to-be-written data sent by the client to a storage array in which the encoder side is located. Each encoder side in FIG. 1B may receive the to-be-written data sent by the client, and perform erasure code-based encoding and reconstruction on the to-be-written data. Data encoded by an encoder side may be written, by using a storage controller, into a storage device of a storage node on which the encoder side is located, or may be sent to a storage device of another storage node by using the communication network to implement distributed storage.

Optionally, a distributed storage system may include an encoder side, and the encoder side is configured to perform encoding processing on data from a client. The encoder side loads one or more storage node groups in the storage system, and each storage node group includes one or more storage nodes.

Optionally, because a plurality of encoder sides may work in parallel in the distributed storage system, each of the plurality of encoder sides is responsible for a storage node group in the storage system, and each storage node group includes at least one storage node.

The encoder side in the storage node group is responsible for receiving the to-be-written data sent by the client, performing encoding on the to-be-written data, and storing the to-be-written data into the storage node in the storage node group by using the storage controller. An encoder side in the following may refer to any encoder side in FIG. 1A or FIG. 1B, and the encoder side is used for erasure code-based encoding and reconstruction.

Figure 1C:
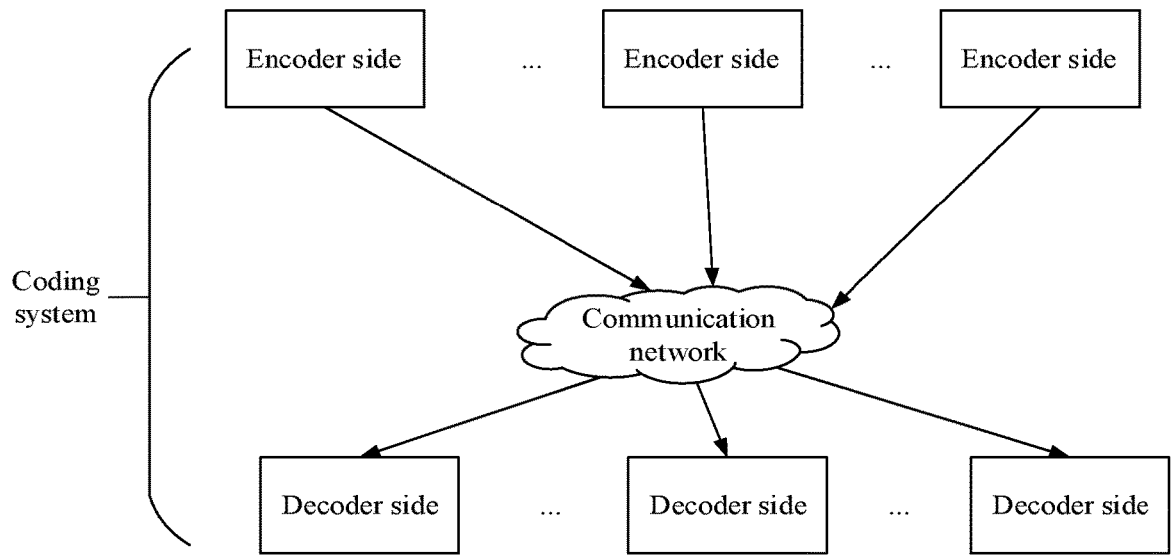
FIG. 1C is a schematic diagram of a coding system according to an embodiment of this disclosure.

FIG. 1C describes a coding system. The coding system may be used in various communication systems or communication networks. Further, when performing data transmission in a network, the encoder side performs encoding processing on to-be-sent data by using the erasure code-based encoding method provided in embodiments of this disclosure, to generate and send corresponding data blocks and global parity blocks. After receiving the data blocks and global parity blocks from the encoder side, a decoder side restores the original data by using some of the data blocks and global parity blocks. This improves reliability of the data transmission. This resolves a computing hotspot problem and reduces duty cycles.

In a possible implementation, the encoder side performs encoding by using (n, k) erasure code, where n is a positive integer, and k is a positive integer. After generating the data blocks (or after receiving data blocks from another client), the encoder side may perform encoding processing on the data blocks based on the erasure code to generate the global parity blocks. After generating the global parity blocks, the encoder side sends the data blocks and the global parity blocks to the decoder side by using the communication network. The decoder side restores the original data by using the received some of data blocks and global parity blocks.

In another possible implementation, the encoder side performs encoding by using (n, k) erasure code. After generating the data blocks (or after receiving data blocks from another client), the encoder side may perform the following operation. After generating the data blocks (or receiving the data blocks), the encoder side sends the data blocks to the decoder side by using the communication network to implement immediate receiving and sending of the data blocks. At the same time, the encoder side performs encoding processing on the data blocks based on the erasure code to generate the global parity blocks. After generating the global parity blocks, the encoder side sends the data blocks and the parity blocks to the decoder side by using the communication network. The decoder side restores the original data by using the received some of data blocks and global parity blocks.

Optionally, the encoder side sets a first encoding threshold. When a quantity of obtained data blocks is less than the first encoding threshold, the encoder side performs encoding processing on the data block and a virtual data block by using the erasure code to generate the global parity block. A sum of a quantity of data blocks obtained by the encoder side and a quantity of virtual data blocks is equal to the first encoding threshold. The virtual data block may be a data block whose content is null.

It should be understood that the erasure code-based encoding method provided in embodiments of this disclosure may alternatively be parsed as an erasure code-based decoding method, in other words, the decoder side performs an operation reversely according to the method of the encoder side. A technical means of the decoder side is similar to a technical means of the encoder side. The decoding method performed corresponding to the erasure code-based encoding method also falls within the protection scope of this disclosure.

Figure 2:
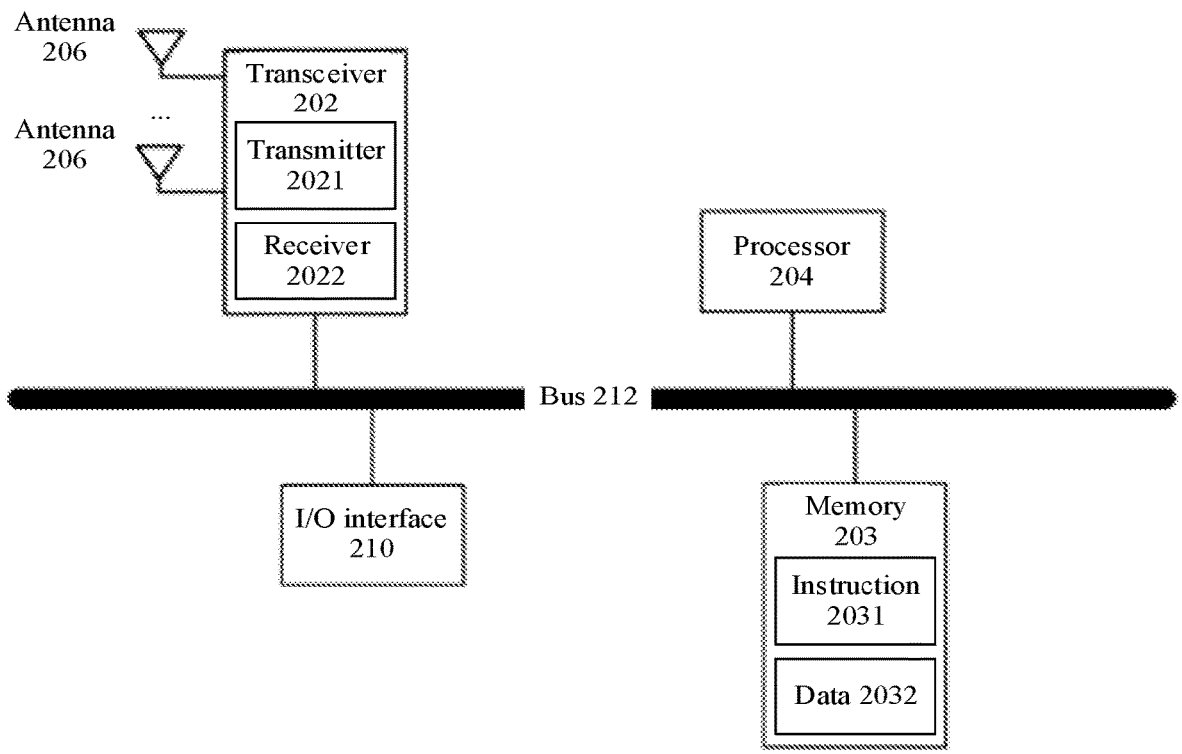
FIG. 2 is a schematic diagram of a hardware structure of an encoding device according to an embodiment of this disclosure.

FIG. 2 is a schematic diagram of a hardware structure of an encoding device according to an embodiment of this disclosure. The encoding device may be a possible implementation of an encoder side or a decoder side in embodiments of this disclosure. As shown in FIG. 2, the encoding device includes at least a processor 204, a memory 203, and a transceiver 202. The memory 203 is further configured to store instructions 2031 and data 2032. Optionally, the encoding device may further include antennas 206, an input/output (I/O) interface 210, and a bus 212. The transceiver 202 further includes a transmitter 2021 and a receiver 2022. In addition, the processor 204, the transceiver 202, the memory 203, and the I/O interface 210 are communicatively connected to each other through the bus 212, and the antennas 206 are connected to the transceiver 202.

The processor 204 may be a general-purpose processor, for example, but not limited to, a central processing unit (CPU), or may be a dedicated processor, for example, but not limited to, a digital signal processor (DSP), an application-specific integrated circuit (ASIC), or a field-programmable gate array (FPGA). Alternatively, the processor 204 may be a neural network processing unit (NPU). In addition, the processor 204 may alternatively be a combination of a plurality of processors. In particular, in the technical solutions provided in embodiments of this disclosure, the processor 204 may be configured to perform related steps of an erasure code-based encoding method in subsequent method embodiments. The processor 204 may be a processor that is specially designed to perform the foregoing steps and/or operations, or a processor that performs the foregoing steps and/or operations by reading and executing the instructions 2031 stored in the memory 203. The processor 204 may need to use the data 2032 in a process of performing the foregoing steps and/or operations.

The transceiver 202 includes the transmitter 2021 and the receiver 2022. In an optional implementation, the transmitter 2021 is configured to send a signal through the antenna 206. The receiver 2022 is configured to receive a signal through at least one of the antennas 206. In particular, in the technical solutions provided in embodiments of this disclosure, the transmitter 2021 may be configured to perform, by using at least one of the antennas 206, for example, an operation performed by a receiving module or a sending module in an encoder side or a decoder side when the erasure code-based encoding method in the subsequent method embodiments is applied to the encoder side or the decoder side.

In embodiments of this disclosure, the transceiver 202 is configured to support the encoding device to perform the foregoing receiving and sending functions. A processor having a processing function is considered as the processor 204. The receiver 2022 may also be referred to as an input port, a receiver circuit, or the like. The transmitter 2021 may be referred to as a transmitter, a transmitter circuit, or the like.

The processor 204 may be configured to execute the instructions 2031 stored in the memory 203 to control the transceiver 202 to receive a message and/or send a message, to complete functions of the encoding device in the method embodiments of this disclosure. In an implementation, it may be considered that a function of the transceiver 202 is implemented by using a transceiver circuit or a dedicated transceiver chip. In embodiments of this disclosure, that the transceiver 202 receives a message may be understood as that the transceiver 202 inputs data, and that the transceiver 202 sends a message may be understood as that the transceiver 202 outputs data.

The memory 203 may be various types of storage media, for example, a RAM, a ROM, a non-volatile RAM (NVRAM), a programmable ROM (PROM), an erasable PROM (EPROM), an electrically EPROM (EEPROM), a flash memory, an optical memory, and a register. The memory 203 is further configured to store the instructions 2031 and the data 2032. The processor 204 may perform the steps and/or the operations in the method embodiments of this disclosure by reading and executing the instructions 2031 stored in the memory 203. The data 2032 may need to be used in a process of performing the operations and/or the steps in the method embodiments of this disclosure.

Optionally, the encoding device may further include the I/O interface 210. The I/O interface 210 is configured to receive instructions and/or data from a peripheral device, and output instructions and/or data to the peripheral device.

The following describes some technical concepts in embodiments of this disclosure.

1. Erasure Code (EC):

The erasure code technology is a data protection method. An original data block is encoded by using the erasure code to generate a global parity block (or a parity block). When an original data block is lost, the lost data block may be reconstructed by using an original data block that is not lost and the global parity block. (n, k) erasure code indicates a type of erasure code in which a quantity of data blocks is k and a quantity of data blocks and global parity blocks is n, where n is a positive integer, and k is a positive integer. Erasure code that meets an MDS feature has the following property. Any data blocks and parity blocks that are in the n blocks and whose quantities are k may be selected to reconstruct initial k data blocks. Therefore, for a group of (n, k) erasure code that meets the MDS feature, when no more than n−k data blocks are lost, the lost data blocks may be reconstructed in the decoding mode.

Figure 3:
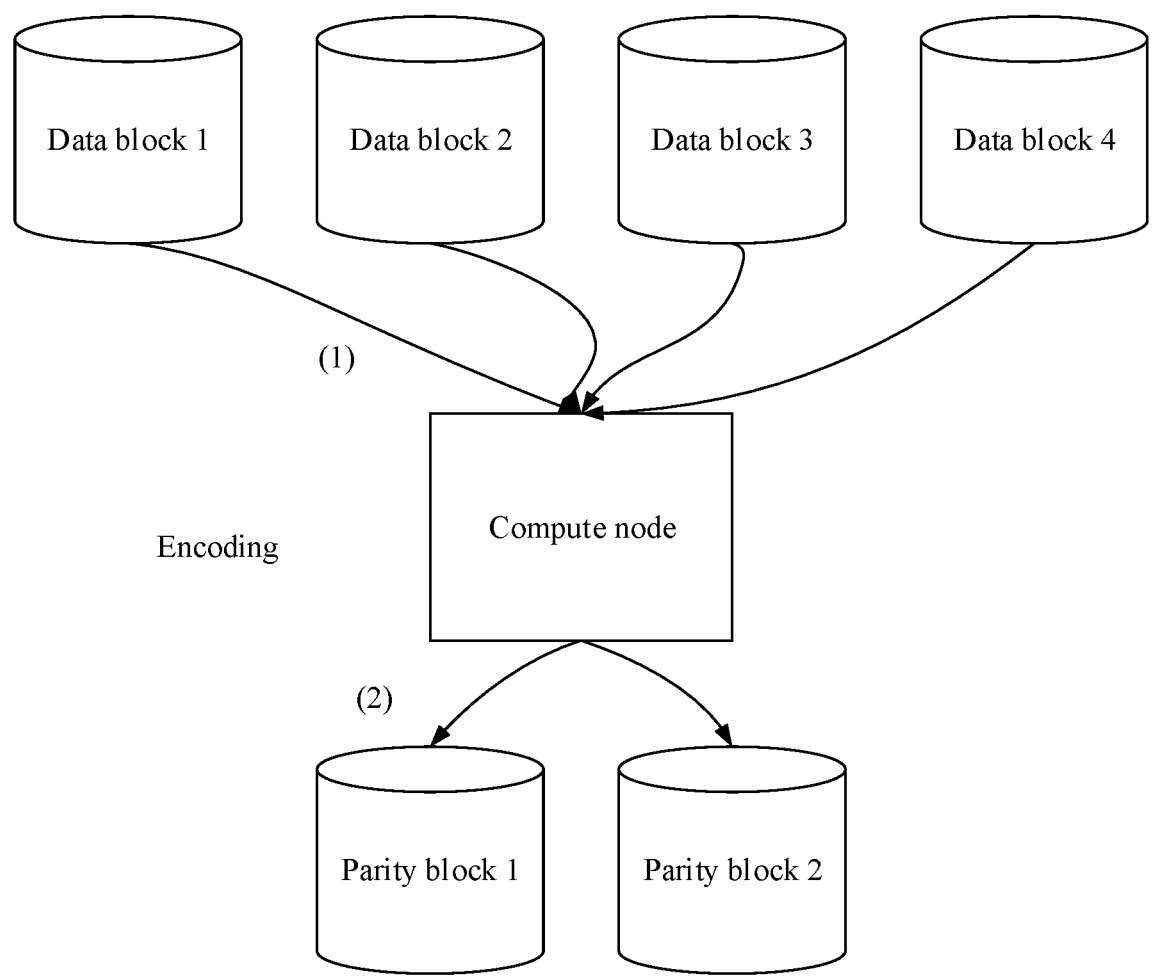
FIG. 3 is a schematic diagram of erasure code-based encoding.

For ease of understanding, FIG. 3 is a schematic diagram of erasure code-based encoding. In a scenario shown in FIG. 3, a compute node performs an erasure code-based encoding method. Further, the compute node obtains data blocks 1, 2, 3, and 4. The compute node performs encoding processing on the data blocks 1, 2, 3, and 4 by using erasure code to generate a parity block 1 and a parity block 2.

Figure 4:
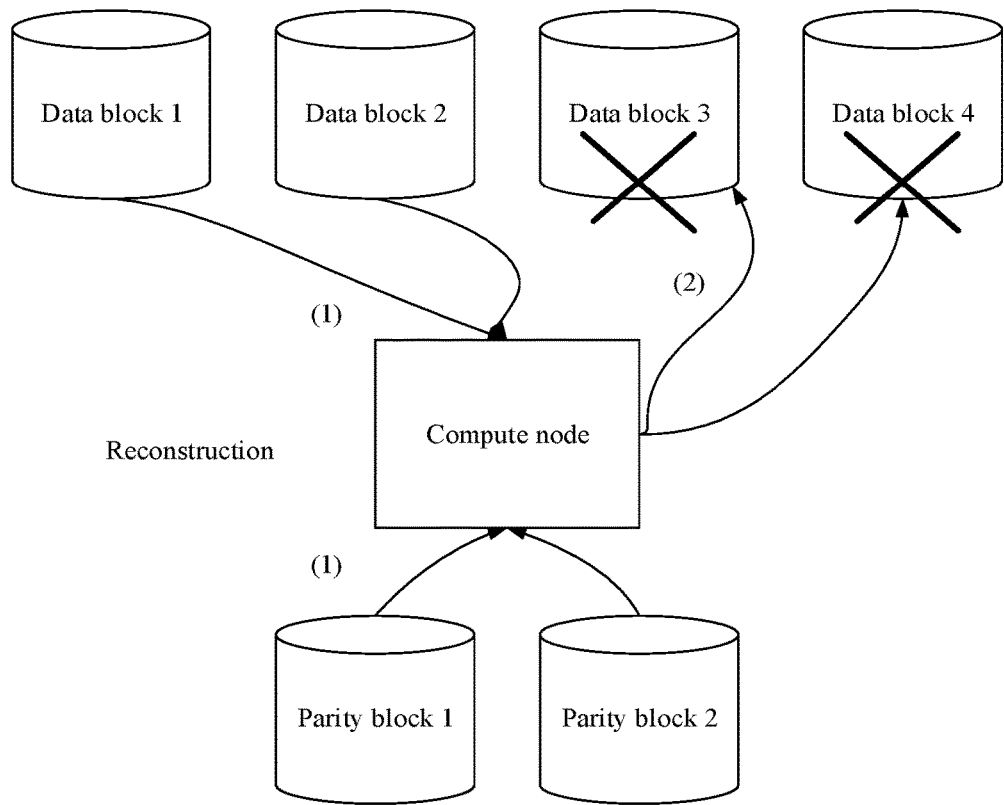
FIG. 4 is a schematic diagram of erasure code-based reconstruction.

Correspondingly, refer to FIG. 4 for an erasure code-based reconstruction scenario. FIG. 4 is a schematic diagram of erasure code-based reconstruction. In the scenario shown in FIG. 4, errors occur in the data blocks 3 and 4. The compute node may perform decoding based on the erasure code and based on the data block 1, the data block 2, the parity block 1, and the parity block 2, to reconstruct the data block 3 and the data block 4.

2. Finite Field:

The finite field is a field including a finite quantity of elements. The finite field may also be referred to as a GF. Like another field, the finite field is a set that is of defined addition, subtraction, multiplication and division operations and that meets a specific rule. A quantity of elements in the finite field is referred to as an order of the finite field, and the order of the finite field is usually a power of a prime number. A feature quantity of the finite field needs to be a prime number E, and therefore a prime field included in the finite field is isomorphic to Zp. If F is a finite field whose features are E, a quantity of elements in F is $E^d$, and d is a positive integer. Finite fields with a same quantity of elements are isomorphic. Therefore, a GF($E^d$) usually indicates an $E^d$-ary finite field. A multiplicative group of the $GF(E^d)$ is an $(E^d-1)^{th}$-order-cyclic group. The finite field is a well-known technology of a person skilled in the art.

3. Full Erasure Code:

The full erasure code is a special (n, k) erasure code scheme, that is erasure code in which a quantity of data blocks is k and a quantity of parity blocks is n−k.

A data block $a_i$ written by an upper-layer application is aggregated by using the full erasure code scheme, where $1 \le i \le k$. When an accumulated quantity of data blocks written by the upper-layer application reaches k, a compute node performs EC encoding on the data block a by using a [1] formula to generate a parity block b:

$$b = Qa \qquad [1]$$

$a=[a_1, a_2, \ldots, a_k]^T$ is a data vector corresponding to the k data blocks, Q is an encoding matrix of (n−k)×k, and $b=[b_1, \ldots, b_{n-k}]^T$ is a parity vector corresponding to n−k parity blocks.

$a_i$ is a data block, and is indicated as a column vector whose length is a block size. Each element in the vector is an element defined in a finite field (for example, a GF(256)), and indicates one byte of data. The block size refers to an amount of data or a stripe depth of a single data block. Stripes refer to data blocks into which consecutive data is divided and that are of a same size. Each data block is referred to as a stripe. $a=[a_1, a_2, \ldots, a_k]^T$ belong to a same encoding group. The encoding group refers to a set of data blocks supported by the erasure code. A maximum quantity of data blocks supported by the erasure code is k, in other words, a maximum quantity of data blocks included in the encoding group is k. When a storage system applies the full erasure code, all data blocks of the encoding group are referred to as stripes.

$b_i$ is a parity block, and is indicated as a column vector whose length is a block size. Each element in the vector is an element defined in a finite field (for example, a GF(256)), and indicates one byte of data.

For (n, k) erasure code, in the full erasure code scheme, EC encoding is performed only after the quantity of written data blocks reaches k. When k is large, due to uncertainty of the storage system, writing for a plurality of times is required to ensure that the quantity of written data blocks reaches k, in other words, a stripe can be fully written only when an amount of data is written into the stripe for a plurality of times. For example, k=20, and n=25, and when a quantity of data blocks written each time is 5, a total quantity of written data blocks reaches k after writing is performed for four times. In this case, an encoder side can encode 20 written data blocks by using the erasure code to generate five corresponding global parity blocks.

It may be understood that the foregoing data block may be written from an index layer to a persistence layer.

To ensure data reliability, backup processing needs to be performed on the written data block before encoding. A common backup mode is three-copy backup processing (or as three-copy redundancy protection). Further, in the three-copy backup processing, each data block that needs to be backed up is replicated into three copies, and these copies are stored on different storage nodes in a storage cluster according to a given distributed storage algorithm.

For the storage system that applies the full erasure code, three-copy backup processing needs to be performed on all to-be-encoded data blocks to ensure data reliability. Therefore, this wastes a large amount of storage space, and causes a write amplification problem.

Based on this, embodiments of this disclosure provide an erasure code-based encoding method. An encoder side obtains a plurality of data blocks in batches. After obtaining an incremental data block, the encoder side performs encoding processing on the incremental data block by using erasure code to generate an incremental parity block. The encoder side performs an exclusive OR operation based on the incremental parity block and an original global parity block to generate a first incremental global parity block. The original global parity block is a first incremental global parity block generated by the encoder side in an $(i-1)^{th}$ time of encoding, the original global parity block is used to reconstruct a damaged data block in an original data block, and the original data block is a data block obtained by the encoder side before the $(i-1)^{th}$ time of encoding. The first incremental global parity block is used to reconstruct a damaged data block in the original data block and the incremental data block. The erasure code-based encoding method provided in embodiments of this disclosure significantly improves encoding flexibility, and avoids high write overheads and the write amplification problem that are caused by a case in which a full encoding scheme is applied to the three-copy backup processing to perform reliability protection on written incremental data blocks. This effectively reduces storage space occupied by the backup processing. The encoding processing is averaged to a write stage of a plurality of pieces of incremental data, and a computing hotspot problem caused by the full encoding is avoided.

Figure 5:
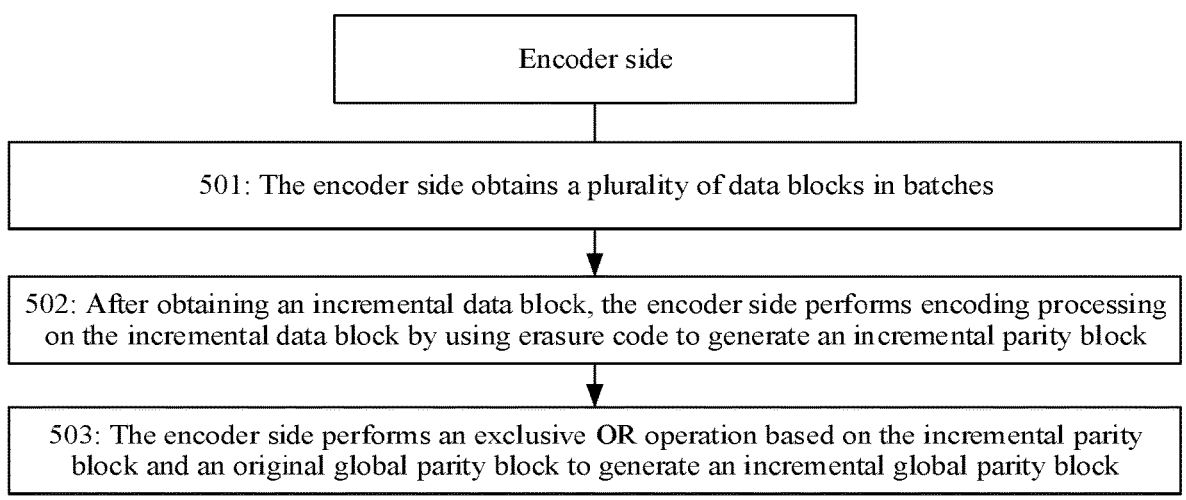
FIG. 5 is a schematic diagram of an embodiment of an erasure code-based encoding method according to an embodiment of this disclosure.

The following describes embodiments of this disclosure with reference to the accompanying drawings. Further, FIG. 5 is a schematic diagram of an embodiment of an erasure code-based encoding method according to an embodiment of this disclosure. The erasure code-based encoding method provided by this embodiment of this disclosure includes the following steps.

501: An encoder side obtains a plurality of data blocks in batches.

In step 501, when the encoder side is used in different scenarios, sources of the plurality of data blocks may be inconsistent. Further, when the encoder side is used in a storage system, the plurality of data blocks obtained by the encoder side in batches are a plurality of data blocks written into the storage system by an upper-layer service in batches. The upper-layer service may be an application-layer service, for example, a write service of an application program. The upper-layer service may be a write service of another client. This is not limited herein.

When the encoder side is used in an encoding system, the plurality of data blocks obtained by the encoder side in batches may be to-be-transmitted data of a server. An encoding group refers to a set of data blocks supported by the erasure code. A maximum quantity of data blocks supported by the erasure code is k, in other words, a maximum quantity of data blocks included in the encoding group is k, where k is a positive integer. When the encoder side is used in the storage system, the encoding group is also referred to as a stripe.

It may be understood that the plurality of data blocks obtained by the encoder side in batches may alternatively be data blocks obtained by the encoder side from another storage node that executes a backup task or a local storage node when the encoder side actually performs encoding. An example in which the encoder side is used in the storage system is used for description. The upper-layer service writes data in batches. Data written in the first time is referred to as D1, and data written in the second time is referred to as D2. The rest may be deduced by analogy. Before first time of encoding is performed, three-copy backup processing is separately performed on D1 and D2. When the encoder side performs first time of encoding, a data block obtained by the encoder side from the local or another storage node is X1, and X1 includes complete D1 and a part of D2.

Optionally, the encoder side may set a second encoding threshold. When a quantity of data blocks obtained by the encoder side is less than the second encoding threshold, the encoder side performs backup processing on the obtained data block, and performs encoding processing after a sum of data blocks obtained next time and the data blocks obtained this time is greater than or equal to the second encoding threshold. For example, if the second encoding threshold is one data block, when the quantity of data blocks obtained by the encoder side is greater than or equal to 1, encoding processing on the data block is triggered. For another example, the second encoding threshold is two data blocks. When the encoder side obtains one data block in an $i^{th}$ time, the encoder side performs backup processing on the data block. When the encoder side obtains one data block in an $(i+1)^{th}$ time, because a total quantity of data blocks obtained in the $i^{th}$ time and the $(i+1)^{th}$ time is equal to the second encoding threshold, the encoder side performs encoding processing on the two data blocks.

The encoding group may also be referred to as a global data vector, and a location of the data block obtained by the encoder side in the encoding group may also be referred to as a location of the data block in the global data vector. For example, $x_{b_i+1}$ is a first data block in an $i^{th}$ encoding process of the encoder side, $b_i+1$ indicates a location of the data block in the global data vector (or the encoding group), and the global data vector (or the encoding group) is x, where $x=[x_1, x_2, \ldots, x_k]^T$, and i is an integer greater than 1.

In embodiments of this disclosure, the plurality of data blocks obtained by the encoder side in batches are classified into an incremental data block and an original data block based on an encoding sequence. The incremental data block includes at least one data block.

Further, the data block obtained in the $i^{th}$ time of encoding is referred to as the incremental data block. A data block obtained before an $(i-1)^{th}$ time of encoding is referred to as the original data block. For example, when i=2, a data block obtained in a second time of encoding is referred to as the incremental data block, and a data block obtained in the first time of encoding is referred to as the original data block. When i=3, a data block obtained in a third time of encoding is referred to as the incremental data block, and data blocks obtained in a second time of encoding and the first time of encoding are referred to as original data blocks.

Specially, in the first time of encoding, the original data block at the encoder side is equal to the incremental data block and equal to the data block obtained in the first time of encoding.

502: After obtaining the incremental data block, the encoder side performs encoding processing on the incremental data block by using the erasure code to generate an incremental parity block.

In step 502, in the $i^{th}$ time of encoding, after obtaining the incremental data block, the encoder side performs encoding processing on the incremental data block by using the erasure code to generate the incremental parity block. In embodiments of this disclosure, a parity block generated based on the incremental data block is referred to as the incremental parity block. Similarly, a parity block generated based on the original data block is referred to as an original parity block.

For example, when i=2, in the second time of encoding, after obtaining an incremental data block X2, the encoder side performs encoding processing on the incremental data block by using the erasure code to generate an incremental parity block X2'. In the first time of encoding, after obtaining an original data block X1, the encoder side performs encoding processing on the original data block by using the erasure code to generate the original parity block.

In still another example, when i=3, in the third time of encoding, after obtaining an incremental data block X3, the encoder side performs encoding processing on the incremental data block by using the erasure code to generate an incremental parity block X3'. In the second time of encoding, after obtaining an incremental data block X2, the encoder side performs encoding processing on the incremental data block by using the erasure code to generate an incremental parity block X2'. In the first time of encoding, after obtaining an original data block X1, the encoder side performs encoding processing on the original data block by using the erasure code to generate the original parity block.

Further, a plurality of encoding methods are proposed in embodiments of this disclosure to generate the incremental parity block based on the incremental data block, and further generate a first incremental global parity block. For details, refer to subsequent embodiments.

503: The encoder side performs an exclusive OR operation based on the incremental parity block and the original global parity block to generate the first incremental global parity block.

In step 503, after obtaining the incremental parity block, the encoder side updates the original global parity block. Further, the encoder side performs the exclusive OR operation in a finite field based on the incremental parity block and the original global parity block to generate the first incremental global parity block. The encoder side updates (or replaces, or overwrites) the original global parity block by using the first incremental global parity block.

In embodiments of this disclosure, global parity blocks are classified into the first incremental global parity block and the original global parity block based on an encoding sequence. The $i^{th}$ time of encoding is used as an example. A global parity block generated based on the $(i-1)^{th}$ time of encoding is referred to as the original global parity block, and a global parity block generated based on the incremental parity block in the $i^{th}$ time of encoding and the original global parity block is referred to as the first incremental global parity block.

The original global parity block is used to reconstruct a damaged data block in the original data block, the original data block is the data block obtained by the encoder side before the $(i-1)^{th}$ time of encoding, and the original data block and the incremental data block belong to a same encoding group. The first incremental global parity block is used to reconstruct a damaged data block in the original data block and the incremental data block.

Specially, in the first time of encoding, the original parity block generated when the encoder side performs encoding processing on the original data block by using the erasure code is equal to the global parity block, and the original parity block is used as an original global parity block in the second time of encoding.

For example, i=4 is used as an example to describe the foregoing erasure code-based encoding method. Refer to Table 1.

TABLE 1

| Time of encoding (i) | Data block obtained by the encoder side | Parity block generated by the encoder side | Global parity block |
|---|---|---|---|
| 1 | X1 | X1' | Y1 = X1' |
| 2 | X2 | X2' | Y2 = X2' + Y1 (+ is the exclusive OR operation in the finite field) |
| 3 | X3 | X3' | Y3 = X3' + Y2 |
| 4 | X4 | X4' | Y4 = X4' + Y3 |

The rest may be deduced by analogy. The first incremental global parity block generated in the $i^{th}$ time of encoding is used as an original global parity block in the $(i+1)^{th}$ time of encoding. In the $(i+1)^{th}$ time of encoding, exclusive OR processing is performed based on the first incremental global parity block (i) generated in the $i^{th}$ time of encoding and an incremental parity block generated in the $(i+1)^{th}$ time of encoding, to generate a new first incremental global parity block (i+1). The encoder side updates the first incremental global parity block (i) by using the first incremental global parity block (i+1).

When this solution is applied to the storage system, the original data block, the incremental data block, the incremental parity block, the original global parity block, and the first incremental global parity block may be stored in an HDD of the storage node to ensure data reliability.

The erasure code-based encoding method provided in embodiments of this disclosure significantly improves encoding flexibility, and avoids high write overheads and a write amplification problem that are caused by a case in which a full encoding scheme is applied to the three-copy backup processing to perform reliability protection on a large quantity of incremental data blocks. This effectively reduces storage space occupied by the backup processing. The encoding processing at the encoder side is averaged, and a computing hotspot problem caused by the full encoding is avoided.

The following separately describes a plurality of encoding methods provided in embodiments of this disclosure. An example in which the second encoding threshold is 1 is used for description (in other words, encoding processing is triggered when the quantity of data blocks is greater than or equal to 1).

Figure 6:
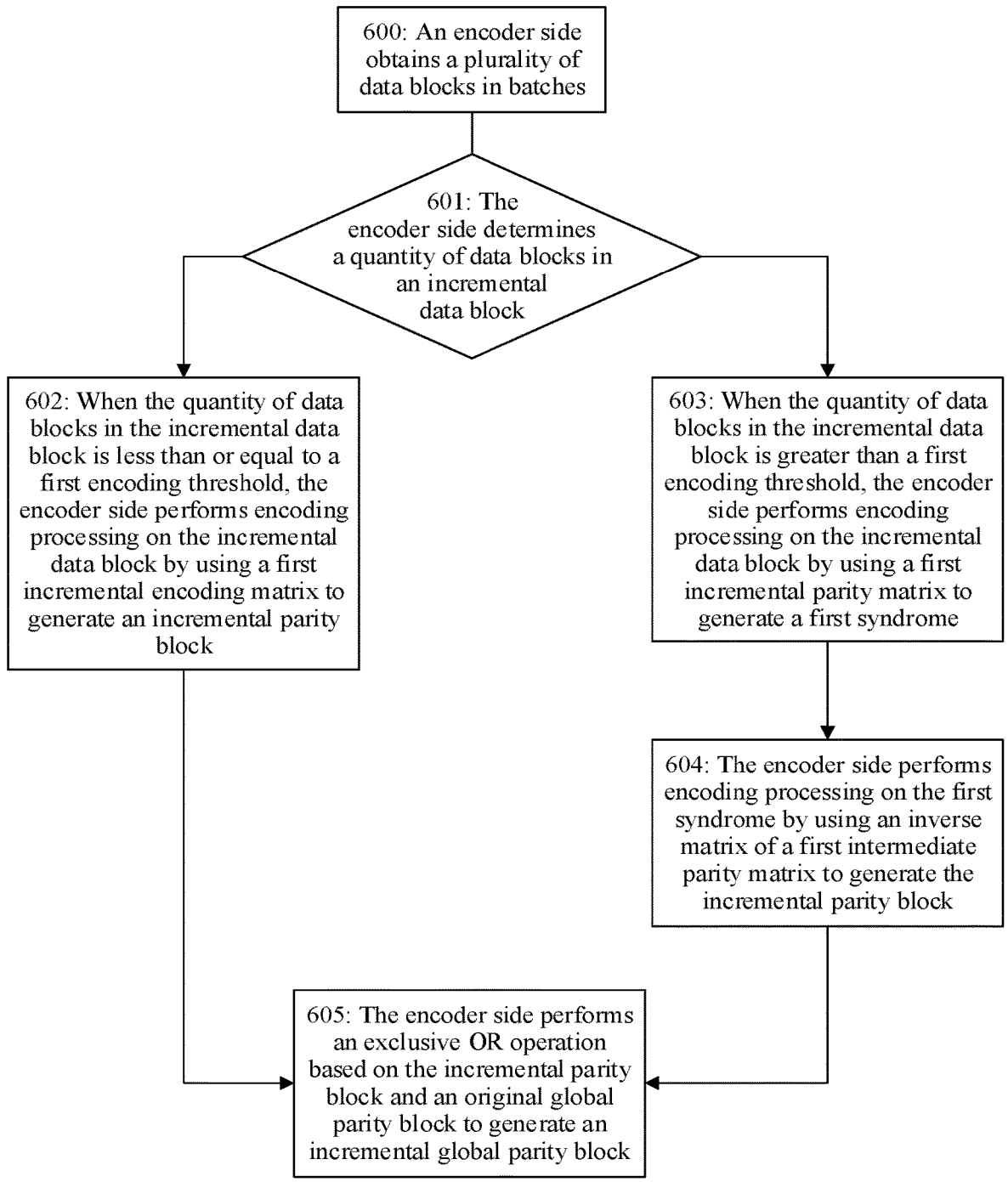
FIG. 6 is a schematic diagram of an embodiment of an erasure code-based encoding method according to an embodiment of this disclosure.

First, FIG. 6 is a schematic diagram of an embodiment of an erasure code-based encoding method according to an embodiment of this disclosure. Based on the foregoing embodiments, the erasure code-based encoding method provided by this embodiment of this disclosure includes the following steps.

600: An encoder side obtains a plurality of data blocks in batches.

Step 600 is similar to step 501. An encoding group corresponding to erasure code includes a plurality of data blocks of a same size, and a basic processing unit of the erasure code-based encoding method is the data block. A storage system is used as an example. When data written by an upper-layer service does not fully fill one data block, backup processing (for example, three-copy backup processing) is performed on the part of written data. An encoding system is used as an example. When to-be-transmitted data does not fully fill one data block, backup processing is performed on the part of written data.

For example, a size of each data block of the encoding group is 4 kilobytes (kB). When a size of data written by the upper-layer service in the first time is 2 kB, backup processing is performed on the 2 kB data. When a sum of data written in an $(i+1)^{th}$ time and the data written in the first time by the upper-layer service is greater than or equal to 4 kB, a sum of data written in first $(i+1)^{th}$ times is rounded up based on the size of each data block to obtain corresponding data blocks.

For example, the data written by the upper-layer service in the first time is D1, and D1 is 2 kB. Data written by the upper-layer service in the second time is D2, and D2 is 1 kB. Data written by the upper-layer service in the third time is D3, and D3 is 2 kB. Because D1+D2 is less than 4 kB, backup processing is performed on D1 and D2 before the third time of writing. For the third time of writing, because D1+D2+D3 is greater than 4 kB, the data written in the third time and data written in first two times may fully fill one data block, and the encoder side selects D1, D2, and a part of D3 as one data block to perform subsequent encoding processing. Backup processing is performed on a remaining part of D3. After data subsequently written by the upper-layer service and the remaining part of D3 may fully fill one data block, subsequent encoding processing is performed by using the part of data as the one data block.

601: The encoder side determines a quantity of data blocks in an incremental data block.

In step 601, to further reduce encoding complexity, after obtaining the data blocks, the encoder side determines the quantity of data blocks that need to be encoded. Further, in the first time of encoding, the encoder side determines a quantity of original data blocks. In an $i^{th}$ time of encoding, the encoder side determines the quantity of data blocks in the incremental data block.

The encoder side determines, based on the quantity of to-be-encoded data blocks (for example, the quantity of original data blocks or the quantity of data blocks in the incremental data block), to perform encoding processing in different modes to obtain a parity block. In embodiments of this disclosure, the $i^{th}$ time of encoding is used as an example to describe an encoding processing mode. It may be understood that an $(i-1)^{th}$ time of encoding or an $(i+1)^{th}$ time of encoding is similar to the $i^{th}$ time of encoding. Details are not described herein again. In the $i^{th}$ time of encoding, an incremental data vector including incremental data blocks is $x_{in}^i$, where $x_{in}^i = [x_{b_i+1}, x_{b_i+2}, \ldots, x_{b_i+t_i}]^T$. $b_i+1$ indicates a location sequence number of an initial data block of $x_{in}^i$ in a global data vector $x = [x_1, x_2, \ldots, x_k]^T$, $t_i$ indicates the quantity of data blocks in the incremental data block in the $i^{th}$ time of encoding, and $t_i$ is an integer greater than or equal to 1.

Further, the encoder side determines the encoding processing mode based on a relationship between the quantity of to-be-encoded data blocks and a first encoding threshold. The first encoding threshold may be configured based on an actual requirement. This is not limited in embodiments of this disclosure. For ease of description, in this embodiment of this disclosure, the first encoding threshold is indicated as $t_{th}$.

When the quantity of data blocks in the incremental data block is less than or equal to the first encoding threshold, enter step 602. When the quantity of data blocks in the incremental data block is greater than the first encoding threshold, enter step 603. For example, when the first encoding threshold is $t_{th}=3$, and the quantity of data blocks in the incremental data block obtained by the encoder side in the $i^{th}$ time of encoding is 2, enter step 602. When the quantity of data blocks in the incremental data block obtained by the encoder side in the $i^{th}$ time of encoding is 4, enter step 603.

It should be noted that the erasure code in embodiments of this disclosure is (n, k) erasure code, in other words, a maximum quantity of data blocks supported by the encoder side is k (or a quantity of data blocks of the encoding group is k), where k is a positive integer, n is a sum of the quantity of data blocks and a quantity of incremental parity blocks, and n is a positive integer. Matrices related to the encoding processing of the erasure code include a global encoding matrix and a global parity matrix. The global encoding matrix of the erasure code is set to G, and the global parity matrix of the erasure code is set to H.

602: When the quantity of data blocks in the incremental data block is less than or equal to the first encoding threshold, the encoder side performs encoding processing on the incremental data block by using a first incremental encoding matrix to generate the incremental parity block.

In step 602, the encoder side determines a first intermediate parity matrix $H_y$ from the global parity matrix H of the erasure code, where the first intermediate parity matrix $H_y$ is last n−k columns of the global parity matrix H of the erasure code. The first intermediate parity matrix is set to $H_y$.

The encoder side determines a second intermediate parity matrix $H_x$ from the global parity matrix H of the erasure code, where the second intermediate parity matrix $H_x$ is first k columns of the global parity matrix H of the erasure code. The second intermediate parity matrix is set to $H_x$.

Further, the global encoding matrix and the global parity matrix meet the following relationships:

$$H = [H_x \mid H_y],$$

and $$G = H_y^{-1} \times H_x.$$

$H_y$ is the first intermediate parity matrix, the first intermediate parity matrix $H_y$ is the last n−k columns of the global parity matrix H of the erasure code, $H_x$ is the second intermediate parity matrix, and the second intermediate parity matrix $H_x$ is the first k columns of the global parity matrix H of the erasure code. It should be noted that "×" in embodiments of this disclosure refers to a finite field multiplication operation. A finite field in embodiments of this disclosure may be a GF(2^8), a GF(2^16), or another finite field. This is not limited herein.

When the quantity of data blocks in the incremental data block is less than or equal to the first encoding threshold ($t_{th}$), the encoder side performs encoding processing on the incremental data block by using the first incremental encoding matrix to generate the incremental parity block.

First, the encoder side determines the first incremental encoding matrix from the global encoding matrix based on the incremental data block. The first incremental encoding matrix is set to $G_{in}^i$, and the first incremental encoding matrix is a submatrix of the global encoding matrix G. The first incremental encoding matrix $G_{in}^i$ is formed by performing column juxtaposition on columns that correspond to the incremental data block and that are of the global encoding matrix G of the erasure code.

For example, the incremental data block includes $x_1$, $x_2$, and $x_3$, and the incremental data block corresponds to vectors in first, second, and third columns of the global encoding matrix. The encoder side performs column juxtaposition based on the vectors in the first, second, and third columns of the global encoding matrix to form the first incremental encoding matrix.

Further, that the encoder side performs encoding processing on the incremental data block by using the first incremental encoding matrix $G_{in}^i$ to generate the incremental parity block includes the following.

The incremental parity block is obtained through calculation by using the following method:

$$y_{in}^i = G_{in}^i \times x_{in}^i.$$

The incremental data vector including the incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in the global data vector $x = [x_1, x_2, \ldots, x_k]^T$.

Enter step 605 after step 602.

603: When the quantity of data blocks in the incremental data block is greater than the first encoding threshold, the encoder side performs encoding processing on the incremental data block by using a first incremental parity matrix to generate a first syndrome.

In step 603, first, the encoder side determines the second intermediate parity matrix from the global parity matrix H of the erasure code, where the second intermediate parity matrix is the first k columns of the global parity matrix H of the erasure code. The second intermediate parity matrix is set to $H_x$.

The encoder side determines the first incremental parity matrix from the second intermediate parity matrix $H_x$ based on the incremental data block, where the first incremental parity matrix is formed by performing column juxtaposition on columns that correspond to the incremental data block and that are of the second intermediate parity matrix $H_x$. The first incremental parity matrix is set to $H_{in}^i$.

For example, the incremental data block includes $x_1$, $x_2$, and $x_3$, and the incremental data block corresponds to vectors in first, second, and third columns of the second intermediate parity matrix. The encoder side performs column juxtaposition based on the vectors in the first, second, and third columns of the second intermediate parity matrix to form the first incremental parity matrix $H_{in}^i$.

The first incremental encoding matrix $G_{in}^i$ and the first incremental parity matrix $H_{in}^i$ meet the following relationship:

$$G_{in}^i = H_y^{-1} \times H_{in}^i.$$

$H_y^{-1}$ is an inverse matrix of the first intermediate parity matrix.

The encoder side performs encoding processing on the incremental data block by using the first incremental parity matrix to generate the first syndrome, and the first syndrome is set to $s_{in}^i$. A specific encoding processing method is as follows:

$$s_{in}^i = H_{in}^i \times x_{in}^i.$$

The incremental data vector including the incremental data blocks is $x_{in}^i$, where $x_{in}^i=[x_{b_i+1}, x_{b_i+2}, \ldots, x_{b_i+t_i}]^T$. $b_i+1$ indicates the location sequence number of the initial data block of $x_{in}^i$ in the global data vector $x=[x_1, x_2, \ldots, x_k]^T$, and $H_{in}^i$ is the first incremental parity matrix.

604: The encoder side performs encoding processing on the first syndrome by using the inverse matrix of the first intermediate parity matrix to generate the incremental parity block.

In step 604, after obtaining the first syndrome, the encoder side performs encoding processing on the first syndrome by using the inverse matrix of the first intermediate parity matrix to generate the incremental parity block. Details are as follows:

$$y_{in}^j = H_y^{-1} \times s_{in}^j.$$

605: The encoder side performs an exclusive OR operation based on the incremental parity block and an original global parity block to generate a first incremental global parity block.

After step 602 or 604, in step 605, that the encoder side performs an exclusive OR operation based on the incremental parity block and an original global parity block to generate a first incremental global parity block includes obtaining the first incremental global parity block through calculation by using the following method:

$$y = y^* + y_{in}^j.$$

y is the first incremental global parity block, y* is the original global parity block, $y_{in}^i$ is the incremental parity block, and + is an operator of the exclusive OR operation in the finite field.

In embodiments of this disclosure, the applicant studies erasure code and finds that for some (n, k) erasure code, density of a global encoding matrix is significantly higher than density of a global parity matrix. Calculation complexity of encoding processing performed based on the global encoding matrix is significantly higher than calculation complexity of encoding processing performed based on the global parity matrix. However, when encoding processing is performed based on the global parity matrix, a syndrome needs to be first generated (for example, the first syndrome in this embodiment), and then encoding processing is performed on the syndrome to obtain a parity block. Therefore, in comparison with encoding processing performed based on the global encoding matrix, additional calculation complexity is introduced. Based on the foregoing research, the first encoding threshold is introduced in embodiments of this disclosure. When the incremental data blocks on which encoding processing is performed are less than or equal to the first encoding threshold, encoding processing is performed by using the submatrix (the first incremental encoding matrix) of the global encoding matrix. When the incremental data blocks on which the encoding processing is performed are greater than the first encoding threshold, encoding processing is performed by using an association matrix (the first incremental parity matrix) of the global parity matrix to generate the first syndrome, and encoding processing is performed on the first syndrome by using the inverse matrix of the first intermediate parity matrix to generate the incremental parity block. Calculation overheads of the encoder side are effectively reduced, and encoding performance is improved.

Figure 7:
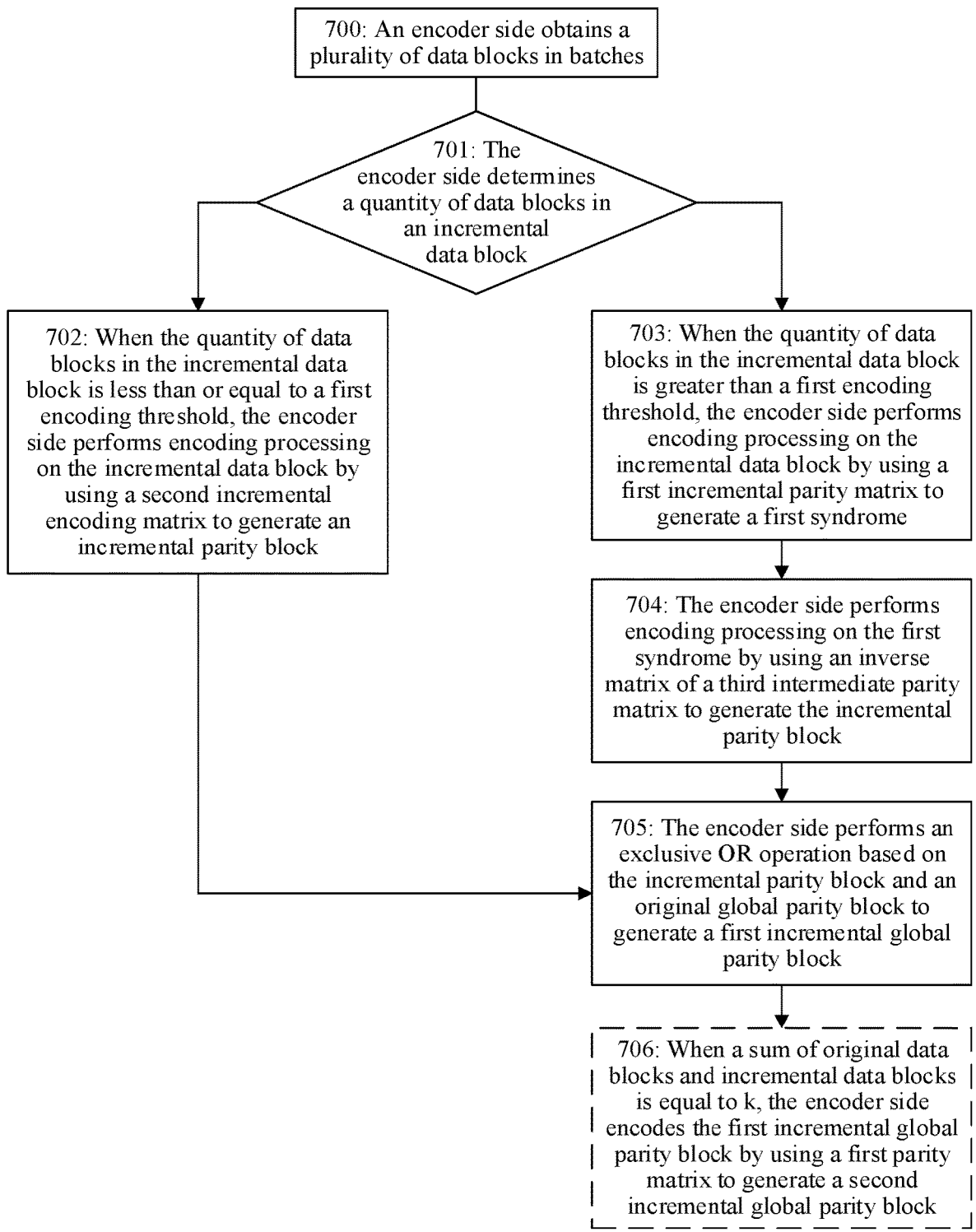
FIG. 7 is a schematic diagram of an embodiment of an erasure code-based encoding method according to an embodiment of this disclosure.

Then, FIG. 7 is a schematic diagram of an embodiment of an erasure code-based encoding method according to an embodiment of this disclosure. Based on the foregoing embodiments, to further reduce encoding complexity, the erasure code-based encoding method provided by this embodiment of this disclosure includes the following steps.

700: An encoder side obtains a plurality of data blocks in batches.

701: The encoder side determines a quantity of data blocks in an incremental data block.

Steps 700 and 701 are consistent with the foregoing steps 600 and 601. Details are not described herein again.

702: When the quantity of data blocks in the incremental data block is less than or equal to a first encoding threshold, the encoder side performs encoding processing on the incremental data block by using a second incremental encoding matrix to generate an incremental parity block.

In step 702, a calculation process of the second incremental encoding matrix is first described.

The encoder side determines a first intermediate parity matrix from a global parity matrix of erasure code, where the first intermediate parity matrix is last n−k columns of the global parity matrix H of the erasure code, and the first intermediate parity matrix is set to $H_y$.

The encoder side determines a second intermediate parity matrix from the global parity matrix of the erasure code, where the second intermediate parity matrix is first k columns of the global parity matrix H of the erasure code, and the second intermediate parity matrix is set to $H_x$.

Further, a global encoding matrix and the global parity matrix meet the following relationships:

$$H = [H_x | H_y],$$

and $$G = H_y^{-1} \times H_x.$$

G is the global encoding matrix, H is the global parity matrix, $H_y$ is the first intermediate parity matrix, the first intermediate parity matrix $H_y$ is the last n−k columns of the global parity matrix H of the erasure code, $H_x$ is the second intermediate parity matrix, the second intermediate parity matrix $H_x$ is the first k columns of the global parity matrix H of the erasure code, and $H_y^{-1}$ is an inverse matrix of the first intermediate parity matrix. It should be noted that "×" in embodiments of this disclosure refers to a finite field multiplication operation. A finite field in embodiments of this disclosure may be a GF(2^8), a GF(2^16), or another finite field. This is not limited herein.

The encoder side determines the first incremental parity matrix from the second intermediate parity matrix $H_x$ based on the incremental data block, where the first incremental parity matrix is formed by performing column juxtaposition on columns that correspond to the incremental data block and that are of the second intermediate parity matrix. The first incremental parity matrix is set to $H_{in}^i$. For example, the incremental data block includes $x_1$, $x_2$, and $x_3$, and the incremental data block corresponds to vectors in first, second, and third columns of the second intermediate parity matrix. The encoder side performs column juxtaposition based on the vectors in the first, second, and third columns of the second intermediate parity matrix to form the first incremental parity matrix $H_{in}^i$.

The encoder side determines a third intermediate parity matrix based on the global parity matrix H. The third intermediate parity matrix is set to $H_{ys}$. The third intermediate parity matrix meets the following condition. Density of an inverse matrix $H_{ys}^{-1}$ of the third intermediate parity matrix is lower than density of the inverse matrix $H_y^{-1}$ of the first intermediate parity matrix $H_y$, and any $(n-k)^{th}$-order submatrix of a matrix $[H_x|H_{ys}]$ is nonsingular. It may be understood that there may be a plurality of implementations of the third intermediate parity matrix, and any matrix that meets the foregoing condition may be used as the third intermediate parity matrix.

The encoder side determines the second incremental encoding matrix based on the second intermediate parity matrix $H_x$ and the third intermediate parity matrix $H_{ys}$. The second incremental encoding matrix is a product of the first incremental parity matrix and the inverse matrix of the third intermediate parity matrix $H_{ys}$. Further, the second incremental encoding matrix is set to $G_{ins}^i$, and the second incremental encoding matrix is calculated in the following manner: $G_{ins}^i = H_{ys}^{-1} \times H_{in}^i$.

Because the quantity of data blocks in the incremental data block is less than or equal to the first encoding threshold, the encoder side performs encoding processing on the incremental data block by using the second incremental encoding matrix to generate the incremental parity block. Further, the incremental parity block is obtained through calculation by using the following method:

$$y_{in}^i = G_{ins}^i \times x_{in}^i.$$

An incremental data vector including incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in a global data vector $x=[x_1, x_2, \ldots, x_k]^T$.

Enter step 705 after step 702.

703: When the quantity of data blocks in the incremental data block is greater than the first encoding threshold, the encoder side performs encoding processing on the incremental data block by using the first incremental parity matrix to generate a first syndrome.

Step 703 is consistent with the foregoing step 603. Details are not described herein again.

704: The encoder side performs encoding processing on the first syndrome by using the inverse matrix of the third intermediate parity matrix to generate the incremental parity block.

In step 704, to reduce encoding complexity, the encoder side performs encoding processing on the first syndrome by using the inverse matrix of the third intermediate parity matrix and the following formula to generate the incremental parity block:

$$y_{in}^i = H_{ys}^{-1} \times s_{in}^i.$$

The incremental parity vector including the incremental parity blocks is $y_{in}^i$, where $y_{in}^i = [y_{in,1}, y_{in,2}, \ldots, y_{in,n-k}]^T$. $s_{in}^i$ is the first syndrome, and $H_{ys}^{-1}$ is the inverse matrix of the third intermediate parity matrix.

705: The encoder side performs an exclusive OR operation based on the incremental parity block and an original global parity block to generate a first incremental global parity block.

In step 705, the encoder side obtains the first incremental global parity block y through calculation by using the following method:

$$y = y^* + y_{in}^i.$$

y is the first incremental global parity block, y* is the original global parity block, $y_{in}^i$ is the incremental parity block, and + is an operator of the exclusive OR operation in the finite field.

706: When a sum of original data blocks and the incremental data blocks is equal to k, the encoder side encodes the first incremental global parity block by using a first parity matrix to generate a second incremental global parity block.

Step 706 is an optional step. When the sum of the original data blocks and the incremental data blocks is equal to k, that is, encoded data blocks reach an upper limit of an encoding group (for example, a stripe is fully written), the encoder side encodes the first incremental global parity block by using the first parity matrix to generate the second incremental global parity block. The second incremental global parity block is used to reconstruct a damaged data block in the written original data blocks and the written incremental data blocks, wherein a total quantity of the original data blocks and the incremental data blocks is k. The generated second incremental global parity block meets an encoding feature of the erasure code.

First, the encoder side determines the first parity matrix based on the inverse matrix of the first intermediate parity matrix $H_y$ and the third intermediate parity matrix $H_{ys}$, where the first parity matrix is $H_y^{-1} \times H_{ys}$.

Then, the encoder side encodes the first incremental global parity block by using the first parity matrix to generate the second incremental global parity block. Further, the second incremental global parity block is obtained through calculation by using the following method:

$$y^{**} = \left(H_y^{-1} \times H_{ys}\right) \times y.$$

y** is the second incremental global parity block, y is the first incremental global parity block, and $H_y^{-1} \times H_{ys}$ is the first parity matrix.

In embodiments of this disclosure, because the density of the inverse matrix $H_{ys}^{-1}$ of the third intermediate parity matrix is significantly lower than the density of the inverse matrix $H_y^{-1}$ of the first intermediate parity matrix, calculation overheads of the encoder side can be further reduced, and encoding performance can be improved. In addition, because any $(n-k)^{th}$-order submatrix of the matrix $[H_x|H_{ys}]$ is nonsingular, it can be ensured that the foregoing encoding process meets an MDS feature, and data reliability is effectively ensured. When the stripe is fully written (that is, when a quantity of written data blocks is k), the first incremental global parity block is encoded by using $[H_x|H_{ys}]$, and finally the second incremental global parity block is generated, so that the generated second incremental global parity block meets the encoding feature of the erasure code.

Figure 8:
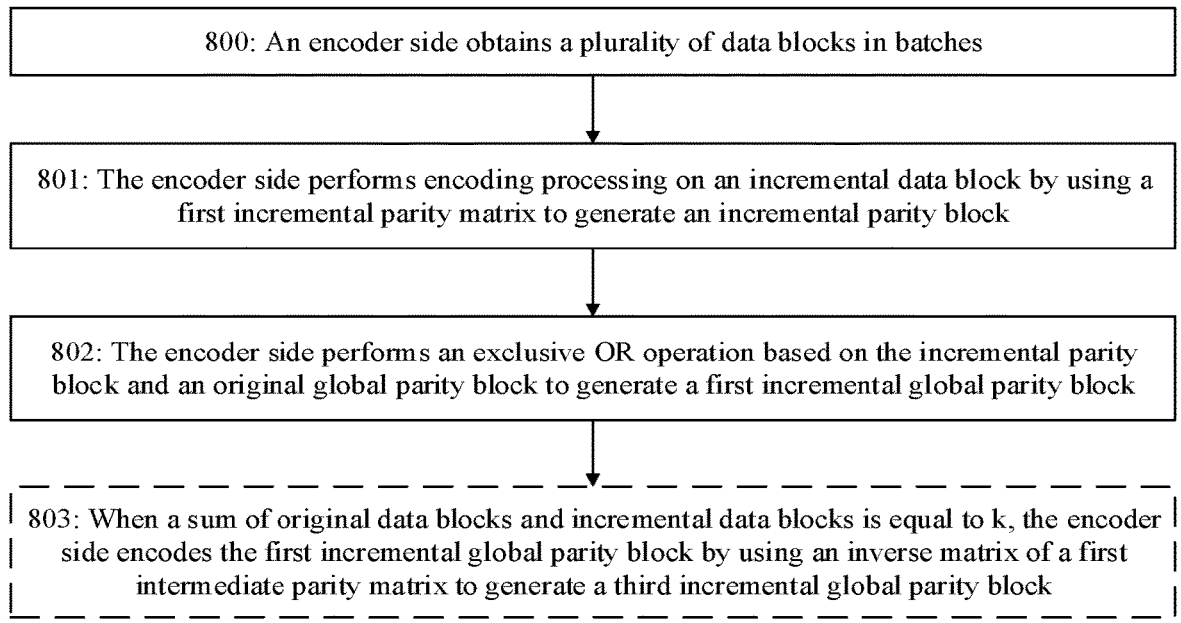
FIG. 8 is a schematic diagram of an embodiment of an erasure code-based encoding method according to an embodiment of this disclosure.

Then, FIG. 8 is a schematic diagram of an embodiment of an erasure code-based encoding method according to an embodiment of this disclosure. Based on the foregoing embodiments, to further reduce complexity of performing encoding by using a parity matrix, the erasure code-based encoding method provided by this embodiment of this disclosure includes the following steps.

800: An encoder side obtains a plurality of data blocks in batches.

Step 800 is consistent with the foregoing step 600. Details are not described herein again.

801: The encoder side performs encoding processing on an incremental data block by using a first incremental parity matrix to generate an incremental parity block.

In step 801, first, the encoder side determines a first intermediate parity matrix from a global parity matrix of erasure code, where the first intermediate parity matrix is last n–k columns of the global parity matrix H of the erasure code, and the first intermediate parity matrix is set to $H_y$.

The encoder side determines a second intermediate parity matrix from the global parity matrix of the erasure code, where the second intermediate parity matrix is first k columns of the global parity matrix H of the erasure code, and the second intermediate parity matrix is set to $H_x$.

Further, a global encoding matrix and the global parity matrix meet the following relationships:

$$H = [H_x | H_y], \text{ and}$$

$$G = H_y^{-1} \times H_x.$$

G is the global encoding matrix, H is the global parity matrix, $H_y$ is the first intermediate parity matrix, the first intermediate parity matrix $H_y$ is the last n–k columns of the global parity matrix H of the erasure code, $H_x$ is the second intermediate parity matrix, the second intermediate parity matrix $H_x$ is the first k columns of the global parity matrix H of the erasure code, and $H_y^{-1}$ is an inverse matrix of the first intermediate parity matrix. It should be noted that "×" in embodiments of this disclosure refers to a finite field multiplication operation. A finite field in embodiments of this disclosure may be a GF(2^8), a GF(2^16), or another finite field. This is not limited herein.

The encoder side determines the first incremental parity matrix from the second intermediate parity matrix $H_x$ based on the incremental data block, where the first incremental parity matrix is formed by performing column juxtaposition on columns that correspond to the incremental data block and that are of the second intermediate parity matrix. The first incremental parity matrix is set to $H_{in}^i$. For example, the incremental data block includes $x_1$, $x_2$, and $x_3$, and the incremental data block corresponds to vectors in first, second, and third columns of the second intermediate parity matrix. The encoder side performs column juxtaposition based on the vectors in the first, second, and third columns of the second intermediate parity matrix to form the first incremental parity matrix $H_{in}^i$.

Then, that the encoder side performs encoding processing on an incremental data block by using a first incremental parity matrix $H_{in}^i$ to generate an incremental parity block includes obtaining the incremental parity block through calculation by using the following method:

$$y_{in}^i = H_{in}^i \times x_{in}^i.$$

An incremental data vector including incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in a global data vector $x = [x_1, x_2, \ldots, x_k]^T$, and i is an integer greater than 1.

802: The encoder side performs an exclusive OR operation based on the incremental parity block and an original global parity block to generate a first incremental global parity block.

In step 802, the encoder side performs the exclusive OR operation based on the incremental parity block and the original global parity block to generate the first incremental global parity block. Further, the first incremental global parity block y is obtained through calculation by using the following method:

$$y = y^* + y_{in}^j.$$

y is the first incremental global parity block, y* is the original global parity block, $y_{in}^i$ is the incremental parity block, and + is an operator of the exclusive OR operation in the finite field.

Optionally, because the second intermediate parity matrix may include an $r^{th}$-order singular submatrix, where r is an integer and 2≤r≤k, encoding processing performed by the encoder side based on a submatrix (namely, the first incremental parity matrix) of the second intermediate parity matrix may fail to meet an MDS feature. To resolve this problem, the encoder side needs to perform backup processing on the first incremental global parity block to ensure data reliability of the first incremental global parity block, and further ensure the data reliability of the finally generated first incremental global parity block. For example, the encoder side performs three-copy backup processing on the first incremental global parity block. An example in which a quantity of first incremental global parity blocks is P is used for description, and P is an integer greater than or equal to 1. When any quantity of blocks, less than or equal to P, in the original data block, the incremental data block, and the first incremental global parity block is lost, the encoder side may reconstruct the lost data block by using the backup first incremental global parity block, thereby ensuring the data reliability.

Optionally, the encoder side performs exclusive OR processing on P first incremental global parity blocks to generate a backup parity block. The encoder side performs backup processing on the backup parity block. For example, the encoder side performs three-copy backup processing on the backup parity block. A use of the backup parity block is similar to a use of the backup first incremental global parity block. When any quantity of blocks, less than or equal to P, in the original data block, the incremental data block, and the first incremental global parity block is lost, the encoder side may reconstruct the lost data block by using the backup parity block, thereby ensuring the data reliability.

Optionally, the encoder side may further add redundant data to the first incremental global parity block to ensure the data reliability of the first incremental global parity block. Further, the encoder side performs the exclusive OR operation based on the incremental parity block and the original global parity block to generate the first incremental global parity block. The encoder side adds the redundant data to the first incremental global parity block. Optionally, the redundant data may be generated based on the first incremental global parity block. A storage device stores the first incremental global parity block to which the redundant data is added. A decoder side reconstructs a damaged block in the original data block, the incremental data block, and the first incremental global parity block by using the first incremental global parity block to which the redundant data is added.

For example, first incremental global parity blocks are y=[y1, y2, y3]. The redundant data is P=y1+y2+y3, in other words, the redundant data is generated by performing exclusive OR processing on a plurality of first incremental global parity blocks.

In a possible implementation, the first incremental global parity blocks to which the redundant data is added are set to y'. The first incremental global parity blocks to which the redundant data is added are as follows: y'=[y1', y2', y3'], where y1'=[y1, P], y2'=[y2, P], and y3'=[y3, P].

In another possible implementation, different redundant data is added to different first incremental global parity blocks. P=y1+y2+y3=[P1, P2], in other words, redundant data P is redundant data P1 and redundant data P2. The first incremental global parity blocks to which the redundant data is added are as follows: y'=[y1', y2', y3'], where y1'=[y1, P1], y2'=[y2, P2], and y3'=[y3, P1+P2].

803: When a sum of original data blocks and the incremental data blocks is equal to k, the encoder side encodes the first incremental global parity block by using the inverse matrix of the first intermediate parity matrix to generate a third incremental global parity block.

Step 803 is an optional step. To further improve the data reliability, when the sum of the original data blocks and the incremental data blocks is equal to k, that is, encoded data blocks reach an upper limit of an encoding group (for example, a stripe is fully written), the encoder side encodes the first incremental global parity block by using the inverse matrix of the first intermediate parity matrix to generate the third incremental global parity block. The third incremental global parity block is used to reconstruct a damaged data block in the written original data blocks and the written incremental data blocks, wherein a total quantity of the original data blocks and the incremental data blocks is k.

The third incremental global parity block is obtained through calculation by using the following method:

$$y^{***} = H_y^{-1} \times y.$$

$y^{***}$ is the third incremental global parity block, $H_y^{-1}$ is the inverse matrix of the first intermediate parity matrix, and y is the first incremental global parity block.

Optionally, the encoder side encodes, by using the inverse matrix of the first intermediate parity matrix, the first incremental global parity block to which the redundant data is added to generate the third incremental global parity block.

In embodiments of this disclosure, the encoder side performs encoding processing on the incremental data block by using the first incremental parity matrix with low complexity to effectively reduce calculation overheads of the encoder side. Further, because the encoder side performs encoding processing on the first incremental global parity block only after the encoded data blocks reach the upper limit of the encoding group to obtain the third incremental global parity block, the data reliability can be ensured, and encoding performance can be improved.

Based on the foregoing embodiments, the following describes a specific encoding procedure when embodiments of this disclosure are applied to a storage system with reference to the accompanying drawings. i=4 is used as an example for description. FIG. 9 to FIG. 12 are schematic diagrams of an encoding procedure according to an embodiment of this disclosure.

Figure 9:
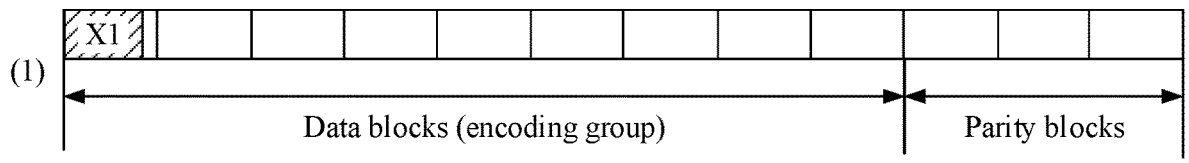
FIG. 9, FIG. 10, FIG. 11, and FIG. 12 are schematic diagrams of an encoding procedure according to an embodiment of this disclosure.

FIG. 9 shows that an upper-layer service writes data in a first time, and the data written in the first time is referred to as X1. Because X1 (for example, X1 is 3 kB and the data block is 4 kB) does not fully fill one data block, an encoder side performs backup processing, for example, three-copy backup processing, on X1. When a sum of data written next time and a data amount of X1 is greater than or equal to a data amount of one data block, encoding processing at the encoder side is triggered.

Figure 10:
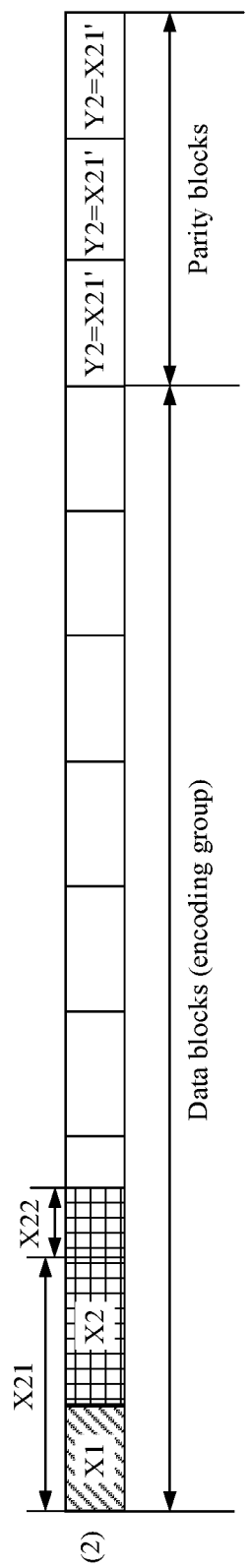

FIG. 10 shows that an upper-layer service writes data in a second time, and the data written in the second time is referred to as X2. Because a sum of data amounts of X1 and X2 is greater than the data amount of one data block, encoding processing at the encoder side is triggered. Further, because the sum of data amounts of X1 and X2 is greater than data amounts of two data blocks and less than data amounts of three data blocks, the encoder side selects, for encoding, data (that is, X21 in the figure) that is in X1 and X2 and that fully fills two data blocks. The encoder side performs backup processing on remaining data X22 in X2, and waits for a next time of writing. The encoder side performs encoding processing on X21 (X21 is used as an original data block) by using any method in the foregoing embodiments to generate a parity block X21'. Because this is a first time of encoding of the encoder side, a global parity block (that is, an original global parity block) Y2=X21'.

Figure 11:
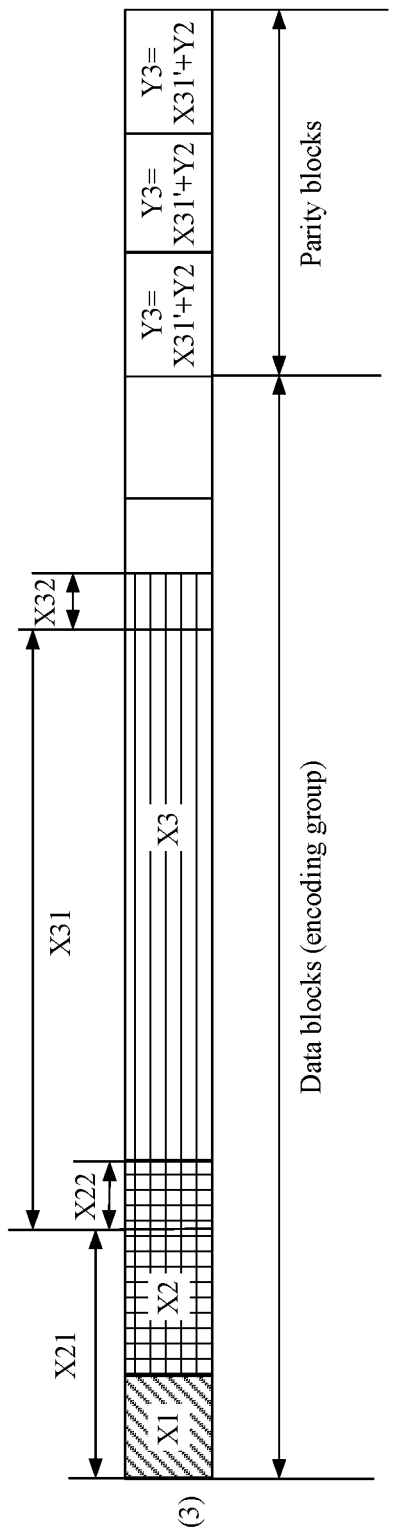

FIG. 11 shows that an upper-layer service writes data in a third time, and the data written in the third time is referred to as X3. Because a sum of data amounts of X3 and X22 is greater than the data amount of one data block, encoding processing at the encoder side is triggered. Further, because the sum of data amounts of X3 and X22 is greater than data amounts of five data blocks and less than data amounts of six data blocks, the encoder side selects, for encoding, data (that is, X31 in the figure) that is in X3 and X22 and that fully fills five data blocks. The encoder side performs backup processing on remaining data X32 in X3, and waits for a next time of writing. The encoder side performs encoding processing on X31 (X31 is used as an incremental data block) by using any method in the foregoing embodiments to generate an incremental parity block X31'. In a second time of encoding, a first incremental global parity block Y3=X31'+Y2.

Figure 12:
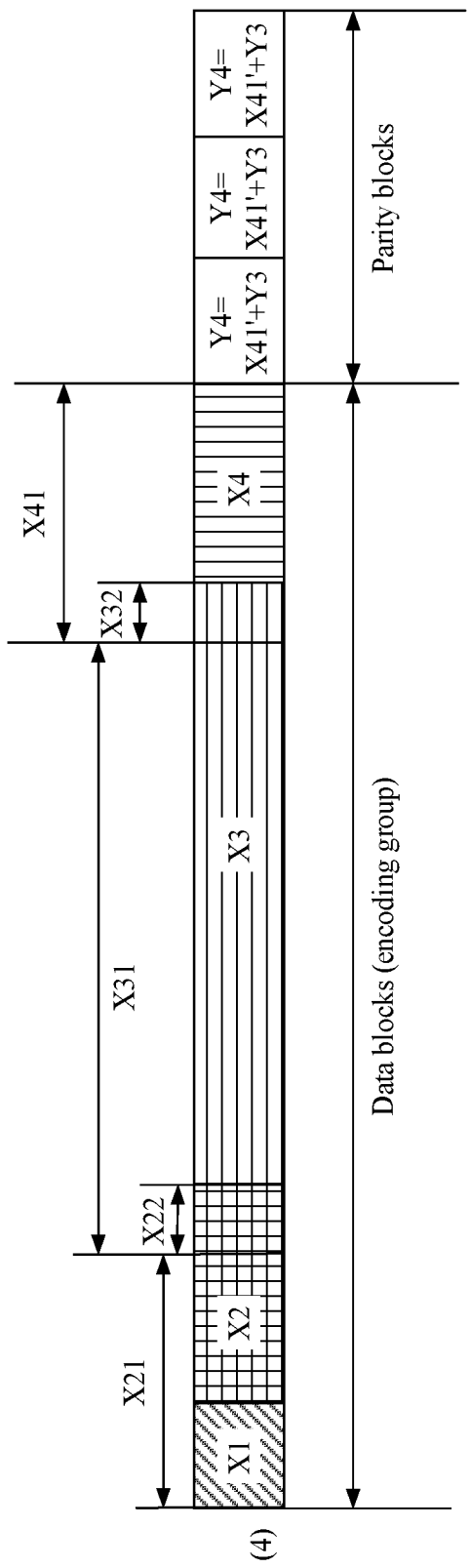

FIG. 12 shows that an upper-layer service writes data in a fourth time, and the data written in the fourth time is referred to as X4. Because a sum of data amounts of X4 and X32 is greater than the data amount of one data block, encoding processing at the encoder side is triggered. Further, because the sum of data amounts of X4 and X32 is equal to the data amounts of two data blocks, the encoder side selects X4 and X32 (that is, X41 in the figure) for encoding. The encoder side performs encoding processing on X41 (X41 is used as an incremental data block) by using any method in the foregoing embodiments to generate an incremental parity block X41'. In a third time of encoding, a first incremental global parity block Y4=X41'+Y3.

Optionally, when the solution shown in FIG. 7 or FIG. 8 is applied, because data blocks written in first four times fill one stripe, a second incremental global parity block y4 or a third incremental global parity block y4* may be further generated in the third time of encoding based on the first incremental global parity block Y4.

The following describes an application scenario according to embodiments of this disclosure. The solution in the foregoing embodiments is described by using an example in which (n, k) erasure code is (24, 20) erasure code. The (24, 20) erasure code is erasure code with n=24 and k=20. In this disclosure scenario, an example in which the encoder side is used in a storage system is used for description. Further, an upper-layer application writes data to a storage node, and the encoder side performs encoding processing on the written data to ensure data reliability. It may be understood that the solution shown in this disclosure scenario may alternatively be applicable to an encoding system. This is not limited herein.

Further, in this disclosure scenario, the storage system includes 24 storage nodes, and each storage node includes one or more SSDs and one or more HDDs. A global parity matrix H of the (24, 20) erasure code includes a Vandermonde matrix of the following formula:

$$H = \begin{bmatrix} 1 & 1 & 1 & \ldots & 1 \\ 3 & 4 & 5 & \ldots & 26 \\ 3^2 & 4^2 & 5^2 & \ldots & 26^2 \\ 3^3 & 4^3 & 5^3 & \ldots & 26^3 \end{bmatrix}.$$

A global encoding matrix G of the (24, 20) erasure code is indicated as:

$$G = H_y^{-1} \times H_x = \begin{bmatrix} 1 & 1 & 1 & 1 \\ 23 & 24 & 25 & 26 \\ 23^2 & 24^2 & 25^2 & 26^2 \\ 23^3 & 24^3 & 25^3 & 26^3 \end{bmatrix}^{-1} \times \begin{bmatrix} 1 & 1 & 1 & \ldots & 1 \\ 3 & 4 & 5 & \ldots & 22 \\ 3^2 & 4^2 & 5^2 & \ldots & 22^2 \\ 3^3 & 4^3 & 5^3 & \ldots & 22^3 \end{bmatrix}.$$

It is assumed that a first encoding threshold is 5, and a second encoding threshold is 1, in other words, encoding processing is triggered when a quantity of data blocks obtained by the encoder side is greater than or equal to 1. A decision condition in which the encoder side selects different matrices to encode the data block is five data blocks.

Data blocks written in a first time form an incremental data vector $x_{in}^1 = [x_1, x_2, x_3]^T$.

Data blocks written in a second time form an incremental data vector $x_{in}^2 = [x_4, x_5, \ldots, x_{12}]^T$.

Data blocks written in a third time form an incremental data vector $x_{in}^3 = [x_{13}, x_{14}, \ldots, x_{20}]^T$.

A global parity vector including global parity blocks is $y = [y_1, y_2, y_3, y_4]^T$.

An encoding process in this disclosure scenario based on the solution shown in FIG. 6 is first described.

For a first time of writing, because a quantity of data blocks in $x_{in}^1 = [x_1, x_2, x_3]^T$ is greater than the second encoding threshold, encoding processing performed by the encoder side on $x_{in}^1$ is triggered.

Because the quantity of data blocks in $x_{in}^1 = [x_1, x_2, x_3]^T$ is less than the first encoding threshold, the encoder side performs encoding processing on $x_{in}^1$ by using a first incremental encoding matrix ($G_{in}^1$) to generate a parity block $y_{in}^1$ in the first time of encoding (similar to the foregoing step 602). Further, $y_{in}^1$ is calculated by using the following method:

$$y_{in}^1 = G_{in}^1 \times x_{in}^1 = G_{in}^1 \times [x_1, x_2, x_3]^T,$$

-continued $$\text{and } G_{in}^1 = \begin{bmatrix} 1 & 1 & 1 & 1 \\ 23 & 24 & 25 & 26 \\ 23^2 & 24^2 & 25^2 & 26^2 \\ 23^3 & 24^3 & 25^3 & 26^3 \end{bmatrix}^{-1} \times \begin{bmatrix} 1 & 1 & 1 \\ 3 & 4 & 5 \\ 3^2 & 4^2 & 5^2 \\ 3^3 & 4^3 & 5^3 \end{bmatrix}.$$

Because encoding is performed for the first time, a first incremental global parity block in the first time of encoding is $y1 = y_{in}^1 + y0$, where $y0 = [0, 0, 0, 0]^T$.

After the foregoing step is completed, the encoder side separately transmits the data blocks $x_1$, $x_2$, and $x_3$ to HDDs of storage nodes 1 to 3 by using a storage network, and transmits the global parity block y1 to HDDs of storage nodes 21 to 24 by using the storage network. If the storage nodes 21 to 24 already store y0, original y0 is overwritten with y1. After the foregoing step is completed, the encoder side returns, to the upper-layer application, an instruction that $x_{in}^1$ is successfully written.

For a second time of writing, a quantity of data blocks in $x_{in}^2 = [x_4, x_5, \ldots, x_{12}]^T$ is greater than the second encoding threshold and greater than the first encoding threshold. Therefore, the encoder side performs encoding processing on an incremental data block ($x_{in}^2$) by using a first incremental parity matrix ($H_{in}^2$) to generate a first syndrome ($s_{in}^2$). This is similar to step 603. The encoder side performs encoding processing on the first syndrome ($s_{in}^2$) by using an inverse matrix ($H_y^{-1}$) of a first intermediate parity matrix to generate an incremental parity block ($y_{in}^2$). This is similar to step 604.

$$s_{in}^2 = H_{in}^2 \times x_{in}^2 = \begin{bmatrix} 1 & 1 & \ldots & 1 \\ 6 & 7 & \ldots & 14 \\ 6^2 & 7^2 & \ldots & 14^2 \\ 6^3 & 7^3 & \ldots & 14^3 \end{bmatrix} \times [x_4, x_5, \ldots, x_{12}]^T,$$

$$\text{and } y_{in}^2 = H_y^{-1} \times s_{in}^2 = \begin{bmatrix} 1 & 1 & 1 & 1 \\ 23 & 24 & 25 & 26 \\ 23^2 & 24^2 & 25^2 & 26^2 \\ 23^3 & 24^3 & 25^3 & 26^3 \end{bmatrix}^{-1} \times s_{in}^2.$$

Because encoding is performed for a second time, a first incremental global parity block in the second time of encoding is $y2 = y1 + y_{in}^2$.

After the foregoing step is completed, the encoder side separately transmits the data blocks $x_4, x_5, \ldots,$ and $x_{12}$ to HDDs of storage nodes 4 to 12 by using the storage network, and transmits the first incremental global parity block y2 to the HDDs of the storage nodes 21 to 24 by using the storage network. In addition, original y1 is overwritten with y2. After the foregoing step is completed, the encoder side returns, to the upper-layer application, an instruction that $x_{in}^2$ is successfully written.

For a third time of writing, a quantity of data blocks in $x_{in}^3 = [x_{13}, x_{14}, \ldots, x_{20}]^T$ is greater than the second encoding threshold and equal to the first encoding threshold. Therefore, the encoder side performs encoding processing on an incremental data block ($x_{in}^3$) by using a first incremental parity matrix ($H_{in}^3$) to generate a first syndrome ($s_{in}^3$). This is similar to step 603. The encoder side performs encoding processing on the first syndrome ($s_{in}^3$) by using the inverse matrix ($H_y^{-1}$) of the first intermediate parity matrix to generate an incremental parity block ($y_{in}^3$). This is similar to step 604.

Further, $$s_{in}^3 = H_{in}^3 \times x_{in}^3 = \begin{bmatrix} 1 & 1 & \ldots & 1 \\ 15 & 16 & \ldots & 22 \\ 15^2 & 16^2 & \ldots & 22^2 \\ 15^3 & 16^3 & \ldots & 22^3 \end{bmatrix} \times [x_{13}, x_{14}, \ldots, x_{20}]^T,$$

$$\text{and } y_{in}^3 = H_y^{-1} \times s_{in}^3 = \begin{bmatrix} 1 & 1 & 1 & 1 \\ 23 & 24 & 25 & 26 \\ 23^2 & 24^2 & 25^2 & 26^2 \\ 23^3 & 24^3 & 25^3 & 26^3 \end{bmatrix}^{-1} \times s_{in}^3.$$

Because encoding is performed for a third time, a first incremental global parity block in the third time of encoding is y3=y2+$y_{in}^3$.

After the foregoing step is completed, the encoder side separately transmits the data blocks $x_{13}$, $x_{14}$, ..., and $x_{20}$ to HDDs of storage nodes 13 to 20 by using the storage network, and transmits the first incremental global parity block y3 to the HDDs of the storage nodes 21 to 24 by using the storage network. In addition, original y2 is overwritten with y3. After the foregoing step is completed, the encoder side returns, to the upper-layer application, an instruction that $x_{in}^3$ is successfully written, and ends the encoding processing procedure.

Then, an encoding process in this disclosure scenario based on the solution shown in FIG. 7 is described.

First, the encoder side determines a third intermediate parity matrix $H_{ys}$. For a specific determining method, refer to the embodiment corresponding to FIG. 7. Details are not described herein again. This disclosure scenario uses as an example of $$H_{ys} = \begin{bmatrix} 0 & 1 & 1 & 1 \\ 0 & 0 & 1 & 2 \\ 0 & 0 & 1 & 4 \\ 1 & 0 & 1 & 8 \end{bmatrix}$$

for description. $H_{ys}$ meets the following condition. Density of an inverse matrix $H_{ys}^{-1}$ of the third intermediate parity matrix is lower than density of an inverse matrix $H_y^{-1}$ of a first intermediate parity matrix $H_y$, and any fourth-order submatrix of a matrix $[H_x|H_{ys}]$ is nonsingular (n−k=4).

The inverse matrix of the third intermediate parity matrix is $$H_{ys}^{-1} = \begin{bmatrix} 0 & 2 & 3 & 1 \\ 1 & 143 & 142 & 0 \\ 0 & 245 & 244 & 0 \\ 0 & 122 & 12 & 0 \end{bmatrix}.$$

For a first time of writing, because a quantity of data blocks in $x_{in}^1=[x_1, x_2, x_3]^T$ is greater than the second encoding threshold, encoding processing performed by the encoder side on $x_{in}^1$ is triggered.

Because the quantity of data blocks in $x_{in}^1=[x_1, x_2, x_3]^T$ is less than the first encoding threshold, the encoder side performs encoding processing on $x_{in}^1$ by using a second incremental encoding matrix ($G_{ins}^1$) to generate a parity block $y_{in}^1$ in the first time of encoding (similar to the foregoing step 702). Further, $y_{in}^1$ is calculated by using the following method:

$$y_{in}^1 = G_{ins}^1 \times x_{in}^1 = G_{ins}^1 \times [x_1, x_2, x_3]^T,$$

-continued $$\text{and } G_{ins}^1 = H_{ys}^{-1} \times H_{in}^1 = \begin{bmatrix} 0 & 2 & 3 & 1 \\ 1 & 143 & 142 & 0 \\ 0 & 245 & 244 & 0 \\ 0 & 122 & 12 & 0 \end{bmatrix} \times \begin{bmatrix} 1 & 1 & 1 \\ 3 & 4 & 5 \\ 3^2 & 4^2 & 5^2 \\ 3^3 & 4^3 & 5^3 \end{bmatrix}.$$

Because encoding is performed for the first time, a first incremental global parity block in the first time of encoding is y1=$y_{in}^1$+y0, where y0=[0, 0, 0, 0]$^T$.

After the foregoing step is completed, the encoder side separately transmits the data blocks $x_1$, $x_2$, and $x_3$ to HDDs of storage nodes 1 to 3 by using a storage network, and transmits the first incremental global parity block y1 to HDDs of storage nodes 21 to 24 by using the storage network. If the storage nodes 21 to 24 already store y0, original y0 is overwritten with y1. After the foregoing step is completed, the encoder side returns, to the upper-layer application, an instruction that $x_{in}^1$ is successfully written.

For a second time of writing, a quantity of data blocks in $x_{in}^2=[x_4, x_5, \ldots, x_{12}]^T$ is greater than the second encoding threshold and greater than the first encoding threshold. Therefore, the encoder side performs encoding processing on an incremental data block ($x_{in}^2$) by using a first incremental parity matrix ($H_{in}^2$) to generate a first syndrome ($s_{in}^2$). This is similar to step 703. The encoder side performs encoding processing on the first syndrome ($s_{in}^2$) by using the inverse matrix ($H_{ys}^{-1}$) of the third intermediate parity matrix to generate an incremental parity block ($y_{in}^2$). This is similar to step 704.

Further, $$s_{in}^2 = H_{in}^2 \times x_{in}^2 = \begin{bmatrix} 1 & 1 & \ldots & 1 \\ 6 & 7 & \ldots & 14 \\ 6^2 & 7^2 & \ldots & 14^2 \\ 6^3 & 7^3 & \ldots & 14^3 \end{bmatrix} \times [x_4, x_5, \ldots, x_{12}]^T, \text{ and}$$

$$y_{in}^2 = H_{ys}^{-1} \times s_{in}^2 = \begin{bmatrix} 0 & 2 & 3 & 1 \\ 1 & 143 & 142 & 0 \\ 0 & 245 & 244 & 0 \\ 0 & 122 & 12 & 0 \end{bmatrix} \times s_{in}^2.$$

Because encoding is performed for a second time, a first incremental global parity block in the second time of encoding is y2=y1+$y_{in}^2$.

After the foregoing step is completed, the encoder side separately transmits the data blocks $x_4$, $x_5$, ..., and $x_{12}$ to HDDs of storage nodes 4 to 12 by using the storage network, and transmits the first incremental global parity block y2 to the HDDs of the storage nodes 21 to 24 by using the storage network. In addition, original y1 is overwritten with y2. After the foregoing step is completed, the encoder side returns, to the upper-layer application, an instruction that $x_{in}^2$ is successfully written.

For a third time of writing, a quantity of data blocks in $x_{in}^3=[x_{13}, x_{14}, \ldots, x_{20}]^T$ is greater than the second encoding threshold and equal to the first encoding threshold. Therefore, the encoder side performs encoding processing on an incremental data block ($x_{in}^3$) by using a first incremental parity matrix ($H_{in}^3$) to generate a first syndrome ($s_{in}^3$). This is similar to step 703. The encoder side performs encoding processing on the first syndrome ($s_{in}^3$) by using the inverse matrix ($H_{ys}^{-1}$) of the third intermediate parity matrix to generate an incremental parity block ($y_{in}^3$). This is similar to step 704.

Further, $$s_{in}^3 = H_{in}^3 \times x_{in}^3 = \begin{bmatrix} 1 & 1 & \ldots & 1 \\ 15 & 16 & \ldots & 22 \\ 15^2 & 16^2 & \ldots & 22^2 \\ 15^3 & 16^3 & \ldots & 22^3 \end{bmatrix} \times [x_{13}, x_{14}, \ldots, x_{20}]^T, \text{ and}$$

$$y_{in}^3 = H_y^{-1} \times s_{in}^3 = \begin{bmatrix} 1 & 1 & 1 & 1 \\ 23 & 24 & 25 & 26 \\ 23^2 & 24^2 & 25^2 & 26^2 \\ 23^3 & 24^3 & 25^3 & 26^3 \end{bmatrix}^{-1} \times s_{in}^3.$$

Because encoding is performed for a third time, a first incremental global parity block in the third time of encoding is $y3 = y2 + y_{in}^3$.

After the foregoing step is completed, the encoder side separately transmits the data blocks $x_{13}, x_{14}, \ldots,$ and $x_{20}$ to HDDs of storage nodes 13 to 20 by using the storage network.

After the third time of encoding is completed, because a total quantity of data blocks written in three times is equal to 20, k in the erasure code is equal to 20, in other words, one stripe is fully written by $x_{in}^1, x_{in}^2,$ and $x_{in}^3$. Therefore, the encoder side encodes the first incremental global parity block (y3) by using a first parity matrix ($H_y^{-1} \times H_{ys}$) to generate a second incremental global parity block (y3**), where:

$$y3^{**} = (H_y^{-1} \times H_{ys}) \times y3 = \begin{bmatrix} 1 & 1 & 1 & 1 \\ 23 & 24 & 25 & 26 \\ 23^2 & 24^2 & 25^2 & 26^2 \\ 23^3 & 24^3 & 25^3 & 26^3 \end{bmatrix}^{-1} \times \begin{bmatrix} 0 & 1 & 1 & 1 \\ 0 & 0 & 1 & 2 \\ 0 & 0 & 1 & 4 \\ 1 & 0 & 1 & 8 \end{bmatrix} \times y3.$$

The encoder side transmits the second incremental global parity block (y3) to the HDDs of the storage nodes 21 to 24 by using the storage network. In addition, original y2 is overwritten with y3.

After the foregoing step is completed, the encoder side returns, to the upper-layer application, an instruction that $x_{in}^3$ is successfully written, and ends the encoding processing procedure.

Then, an encoding process in this disclosure scenario based on the solution shown in FIG. 8 is described. Different from the foregoing two application scenarios, the storage system in this disclosure scenario requires 25 storage nodes.

For a first time of writing, because a quantity of data blocks in $x_{in}^1 = [x_1, x_2, x_3]^T$ is greater than the second encoding threshold, encoding processing performed by the encoder side on $x_{in}^1$ is triggered.

The encoder side performs encoding processing on the data blocks ($x_{in}^1$) by using a first incremental parity matrix ($H_{in}^1$) to generate a parity block $y_{in}^1$ in the first time of encoding (similar to the foregoing step 801). Further, $y_{in}^1$ is calculated by using the following method:

$$y_{in}^1 = H_{in}^1 \times x_{in}^1 = \begin{bmatrix} 1 & 1 & 1 \\ 3 & 4 & 5 \\ 3^2 & 4^2 & 5^2 \\ 3^3 & 4^3 & 5^3 \end{bmatrix} \times [x_1, x_2, x_3]^T.$$

Because encoding is performed for the first time, a first incremental global parity block in the first time of encoding is $y1 = y_{in}^1 + y0$, where $y0 = [0, 0, 0, 0]^T$.

Because a second intermediate parity matrix may include an $r^{th}$-order singular submatrix, where r is an integer and $2 \leq r \leq k$, encoding processing performed by the encoder side based on a submatrix (namely, the first incremental parity matrix ($H_{in}^1$)) of the second intermediate parity matrix may fail to meet an MDS feature. The encoder side performs exclusive OR processing on the first incremental global parity block y1 encoded for the first time to generate a backup parity block t1. A specific method for calculating t1 is as follows:

$$y1 = [y_{11}, y_{12}, y_{13}, y_{14}]^T, \text{ and}$$

$$t1 = y_{11} + y_{12} + y_{13} + y_{14}.$$

After the foregoing step is completed, the encoder side separately transmits the data blocks $x_1, x_2,$ and $x_3$ to HDDs of storage nodes 1 to 3 by using a storage network, and transmits the first incremental global parity block y1 to HDDs of storage nodes 21 to 24 by using the storage network. The encoder side transmits the backup parity block t1 to an HDD of a storage node 25 by using the storage network. If the storage nodes 21 to 24 already store y0, original y0 is overwritten with y1. After the foregoing step is completed, the encoder side returns, to the upper-layer application, an instruction that $x_{in}^1$ is successfully written.

For a second time of writing, a quantity of data blocks in $x_{in}^2 = [x_4, x_5, \ldots, x_{12}]^T$ is greater than the second encoding threshold. Therefore, the encoder side performs encoding processing on an incremental data block ($x_{in}^2$) by using a first incremental parity matrix ($H_{in}^2$) to generate an incremental parity block ($y_{in}^2$). This is similar to step 801.

Further, $$y_{in}^2 = H_{in}^2 \times x_{in}^2 = \begin{bmatrix} 1 & 1 & \ldots & 1 \\ 6 & 7 & \ldots & 14 \\ 6^2 & 7^2 & \ldots & 14^2 \\ 6^3 & 7^3 & \ldots & 14^3 \end{bmatrix} \times [x_4, x_5, \ldots, x_{12}]^T.$$

Because encoding is performed for a second time, a first incremental global parity block in the second time of encoding is $y2 = y1 + y_{in}^2$.

The encoder side performs exclusive OR processing on the first incremental global parity block y2 encoded for the second time to generate a backup parity block t2. A specific method for calculating t2 is as follows:

$$y2 = [y_{21}, y_{22}, y_{23}, y_{24}]^T, \text{ and}$$

$$t2 = y_{21} + y_{22} + y_{23} + y_{24}.$$

After the foregoing step is completed, the encoder side separately transmits the data blocks $x_4, x_5, \ldots,$ and $x_{12}$ to HDDs of storage nodes 4 to 12 by using the storage network, transmits the first incremental global parity block y2 to the HDDs of the storage nodes 21 to 24 by using the storage network, and overwrites original y1 with y2. The encoder side transmits the backup parity block t2 to the HDD of the storage node 25 by using the storage network, and overwrites original t1 with t2. After the foregoing step is completed, the encoder side returns, to the upper-layer application, an instruction that x is successfully written.

For a third time of writing, a quantity of data blocks in $x_{in}^3 = [x_{13}, x_{14}, \ldots, x_{20}]^T$ is greater than the second encoding threshold. Therefore, the encoder side performs encoding processing on an incremental data block ($x_{in}^3$) by using a first incremental parity matrix ($H_{in}^3$) to generate an incremental parity block ($y_{in}^3$). This is similar to step 801.

Further, $$y_{in}^3 = H_{in}^3 \times x_{in}^3 = \begin{bmatrix} 1 & 1 & \cdots & 1 \\ 15 & 16 & \cdots & 22 \\ 15^2 & 16^2 & \cdots & 22^2 \\ 15^3 & 16^3 & \cdots & 22^3 \end{bmatrix} \times [x_{13}, x_{14}, \ldots, x_{20}]^T.$$

Because encoding is performed for a third time, a first incremental global parity block in the third time of encoding is y3=y2+$y_{in}^3$.

After the foregoing step is completed, the encoder side separately transmits the data blocks $x_{13}$, $x_{14}$, . . . , and $x_{20}$ to HDDs of storage nodes 13 to 20 by using the storage network.

After the third time of encoding is completed, because a total quantity of data blocks written in three times is equal to 20, k in the erasure code is equal to 20, in other words, one stripe is fully written by $x_{in}^1$, $x_{in}^2$, and $x_{in}^3$. Therefore, the encoder side encodes the first incremental global parity block (y3) by using the inverse matrix ($H_y^{-1}$) of the first intermediate parity matrix to generate a third incremental global parity block (y3\*\*\*), where $$y3^{***} = (H_y^{-1}) \times y3 = \begin{bmatrix} 1 & 1 & 1 & 1 \\ 23 & 24 & 25 & 26 \\ 23^2 & 24^2 & 25^2 & 26^2 \\ 23^3 & 24^3 & 25^3 & 26^3 \end{bmatrix}^{-1} \times y3.$$

The encoder side transmits the third incremental global parity block (y3\*\*\*) to the HDDs of the storage nodes 21 to 24 by using the storage network. In addition, original y2 is overwritten with y3\*\*\*. The encoder side deletes the backup parity block t2 from the storage node 25. After the foregoing step is completed, the encoder side returns, to the upper-layer application, an instruction that $x_{in}^3$ is successfully written, and ends the encoding processing procedure.

Further, the erasure code-based encoding methods shown in FIG. 5 to FIG. 8 may be further applied to a transmitter (or an intermediate node) of a network apparatus having an encoding module. In a possible application scenario, the network apparatus having an encoding module also has a decoding module. The network apparatus may alternatively perform an erasure code-based decoding method corresponding to the erasure code-based encoding methods shown in FIG. 5 to FIG. 8. A network apparatus that performs the foregoing encoding method or the foregoing decoding method is not limited in this disclosure. The network apparatus is distinguished only by whether the network apparatus executes the encoding method or the decoding method.

The erasure code-based encoding methods shown in FIG. 5 to FIG. 8 are disclosed only as encoding methods in this disclosure to avoid redundancy. It should be understood that the foregoing encoding method may alternatively be parsed as a decoding method, in other words, the decoder side performs an operation reversely according to the method of the encoder side. A technical means of the decoder side is similar to a technical means of the encoder side. In this case, the decoding method performed corresponding to the encoding method also falls within the protection scope of this disclosure.

The foregoing mainly describes the solutions provided in embodiments of this disclosure from a perspective of a method. It may be understood that, to implement the foregoing functions, the network apparatus includes hardware structures and/or software modules for performing corresponding functions. A person of ordinary skill in the art should easily be aware that, in combination with the examples described in embodiments disclosed in this specification, modules, algorithms and steps may be implemented by hardware or a combination of hardware and computer software. Whether a function is performed by hardware or hardware driven by computer software depends on particular applications and design constraint conditions of the technical solutions. A person skilled in the art may use different methods to implement the described functions for each particular application, but it should not be considered that the implementation goes beyond the scope of this disclosure.

In embodiments of this disclosure, the encoding device may be divided into functional modules based on the foregoing method examples. For example, functional modules corresponding to various functions are obtained through division, or two or more functions may be integrated into one processing module. The integrated module may be implemented in a form of hardware, or may be implemented in a form of a software function module. It should be noted that, in embodiments of this disclosure, the module division is used as an example, and is merely a logical function division. During actual implementation, another division manner may be used.

Figure 13:
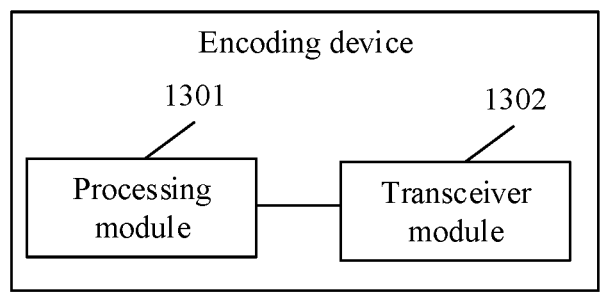
FIG. 13 is a schematic diagram of an embodiment of an encoding device according to an embodiment of this disclosure.

The following describes the encoding device in this disclosure in detail. FIG. 13 is a schematic diagram of an embodiment of an encoding device according to an embodiment of this disclosure. The encoding device includes a processing module 1301 or a transceiver module 1302 configured to obtain a plurality of data blocks in batches, where the plurality of data blocks belong to a same encoding group.

The processing module 1301 is further configured to perform encoding processing on the plurality of data blocks by using erasure code. In an $i^{th}$ time of encoding, after obtaining an incremental data block, an encoder side performs encoding processing on the incremental data block by using the erasure code to generate an incremental parity block, the incremental data block includes at least one data block, and i is an integer greater than 1.

The processing module 1301 is further configured to perform an exclusive OR operation based on the incremental parity block and an original global parity block to generate a first incremental global parity block. The original global parity block is a first incremental global parity block generated by the encoder side in an $(i-1)^{th}$ time of encoding, the original global parity block is used to reconstruct a damaged data block in an original data block, the original data block is a data block obtained by the encoder side before the $(i-1)^{th}$ time of encoding, and the original data block and the incremental data block belong to a same encoding group. The first incremental global parity block is used to reconstruct a damaged data block in the original data block and the incremental data block.

In a possible implementation, the processing module 1301 is further configured to determine a quantity of data blocks in the incremental data block.

The processing module 1301 is further configured to, when the quantity of data blocks in the incremental data block is less than or equal to a first encoding threshold $t_{th}$, perform encoding processing on the incremental data block by using a first incremental encoding matrix $G_{in}^{i}$ to generate the incremental parity block.

Alternatively, the processing module 1301 is further configured to, when the quantity of data blocks in the incremental data block is greater than the first encoding threshold $t_{th}$, perform encoding processing on the incremental data block by using a first incremental parity matrix $H_{in}^{i}$ and an inverse matrix of a first intermediate parity matrix $H_y$ to generate the incremental parity block.

The first incremental encoding matrix $G_{in}^{i}$ is a submatrix of a global encoding matrix G of the erasure code, a product of the first incremental parity matrix $H_{in}^{i}$ and the inverse matrix of the first intermediate parity matrix $H_y$ is equal to the first incremental encoding matrix $G_{in}^{i}$, and the first intermediate parity matrix $H_y$ is a submatrix of a global parity matrix H of the erasure code.

In a possible implementation, when a maximum quantity of data blocks that can be encoded by using the erasure code is k, a quantity of global parity blocks generated by the encoder side by performing encoding processing on the data blocks by using the erasure code is n−k, the global parity block is used to reconstruct a damaged data block in the data blocks on which encoding processing is performed, k is a positive integer, n is a positive integer, and n is greater than k, the processing module 1301 is further configured to determine the first incremental encoding matrix $G_{in}^{i}$ from the global encoding matrix G of the erasure code based on the incremental data block, where the first incremental encoding matrix $G_{in}^{i}$ is formed by performing column juxtaposition on columns that correspond to the incremental data block and that are of the global encoding matrix G of the erasure code, the processing module 1301 is further configured to determine the first intermediate parity matrix $H_y$ from the global parity matrix H of the erasure code, where the first intermediate parity matrix $H_y$ is last n−k columns of the global parity matrix H of the erasure code, or the processing module 1301 is further configured to determine a second intermediate parity matrix $H_x$ from the global parity matrix H of the erasure code, where the second intermediate parity matrix $H_x$ is first k columns of the global parity matrix H of the erasure code, and the processing module 1301 is further configured to determine the first incremental parity matrix $H_{in}^{i}$ from the second intermediate parity matrix $H_x$ based on the incremental data block, where the first incremental parity matrix $H_{in}^{i}$ is formed by performing column juxtaposition on columns that correspond to the incremental data block and that are of the second intermediate parity matrix $H_x$.

In a possible implementation, G is the global encoding matrix of the erasure code, H is the global parity matrix of the erasure code, and G and H meet the following relationships:

$$H = [H_x | H_y], \text{ and}$$

$$G = H_y^{-1} \times H_x.$$

$H_y$ is the first intermediate parity matrix, the first intermediate parity matrix $H_y$ is the last n−k columns of the global parity matrix H of the erasure code, $H_x$ is the second intermediate parity matrix, and the second intermediate parity matrix $H_x$ is the first k columns of the global parity matrix H of the erasure code.

$G_{in}^{i}$ is the first incremental encoding matrix, $H_{in}^{i}$ is the first incremental parity matrix, and $G_{in}^{i}$ and $H_{in}^{i}$ meet the following relationship:

$$G_{in}^{i} = H_y^{-1} \times H_{in}^{i}.$$

In a possible implementation, the processing module 1301 is further configured to obtain the incremental parity block through calculation by using the following method:

$$y_{in}^{i} = G_{in}^{i} \times x_{in}^{i}.$$

An incremental data vector including incremental data blocks is $x_{in}^{i}$, where $x_{in}^{i}=[x_{b_i+1}, x_{b_i+2}, \ldots, x_{b_i+t_i}]^T$, and an incremental parity vector including incremental parity blocks is $y_{in}^{i}$, where $y_{in}^{i}=[y_{in,1}, y_{in,2}, \ldots, y_{in,n-k}]^T$. $b_i+1$ indicates a location sequence number of an initial data block of $x_{in}^{i}$ in a global data vector $x=[x_1, x_2, \ldots, x_k]^T$, and the global data vector is a vector including data blocks of the encoding group.

In a possible implementation, the processing module 1301 is further configured to obtain the incremental parity block through calculation by using the following method:

$$s_{in}^{i} = H_{in}^{i} \times x_{in}^{i}, \text{ and}$$

$$y_{in}^{i} = H_y^{-1} \times s_{in}^{i}.$$

An incremental data vector including incremental data blocks is $x_{in}^{i}$, where $x_{in}^{i}=[x_{b_i+1}, x_{b_i+2}, \ldots, x_{b_i+t_i}]^T$, and an incremental parity vector including incremental parity blocks is $y_{in}^{i}$, where $y_{in}^{i}=[y_{in,1}, y_{in,2}, \ldots, y_{in,n-k}]^T$. $b_i+1$ indicates a location sequence number of an initial data block of $x_{in}^{i}$ in a global data vector $x=[x_1, x_2, \ldots, x_k]^T$, and $s_{in}^{i}$ is a first syndrome.

In a possible implementation, the processing module 1301 is further configured to obtain the first incremental global parity block through calculation by using the following method:

$$y = y^* + y_{in}^{j}.$$

y is the first incremental global parity block, y* is the original global parity block, $y_{in}^{i}$ is the incremental parity block, and + is an operator of the exclusive OR operation in a finite field.

In a possible implementation, when the maximum quantity of data blocks that can be encoded by using the erasure code is k, the quantity of global parity blocks generated by the encoder side by performing encoding processing on the data blocks by using the erasure code is n−k, the global parity block is used to reconstruct the damaged data block in the data blocks on which encoding processing is performed, k is a positive integer, n is a positive integer, and n is greater than k, the processing module 1301 is further configured to determine the first intermediate parity matrix $H_y$ from the global parity matrix of the erasure code based on the incremental data block, where the first intermediate parity matrix $H_y$ is the last n−k columns of the global parity matrix H of the erasure code, or the processing module 1301 is further configured to determine the second intermediate parity matrix $H_x$ from the global parity matrix of the erasure code based on the incremental data block, where the second intermediate parity matrix $H_x$ is the first k columns of the global parity matrix H of the erasure code, and the processing module 1301 is further configured to determine the first incremental parity matrix $H_{in}{}^i$ from the second intermediate parity matrix $H_x$ based on the incremental data block, where the first incremental parity matrix is formed by performing column juxtaposition on the columns that correspond to the incremental data block and that are of the second intermediate parity matrix.

The processing module 1301 is further configured to determine a third intermediate parity matrix $H_{ys}$ based on the global parity matrix H of the erasure code. Density of an inverse matrix of the third intermediate parity matrix is lower than density of the inverse matrix of the first intermediate parity matrix, and any $(n-k)^{th}$-order submatrix of a matrix $[H_x|H_{ys}]$ is nonsingular.

The processing module 1301 is further configured to determine a second incremental encoding matrix $G_{ins}{}^i$ based on the second intermediate parity matrix $H_x$ and the third intermediate parity matrix $H_{ys}$. The second incremental encoding matrix $G_{ins}{}^i$ is a product of the first incremental parity matrix $H_{in}{}^i$ and the inverse matrix of the third intermediate parity matrix $H_{ys}$.

The processing module 1301 is further configured to determine the quantity of data blocks in the incremental data block.

The processing module 1301 is further configured to, when the quantity of data blocks in the incremental data block is less than or equal to $t_{th}$, perform encoding processing on the incremental data block by using the second incremental encoding matrix $G_{ins}{}^i$ to generate the incremental parity block.

Alternatively, the processing module 1301 is further configured to, when the quantity of data blocks in the incremental data block is greater than $t_{th}$, perform encoding processing on the incremental data block by using the first incremental parity matrix $H_{in}{}^i$ and the inverse matrix of the third intermediate parity matrix $H_{ys}$ to generate the incremental parity block.

In a possible implementation, the processing module 1301 is further configured to obtain the incremental parity block through calculation by using the following method:

$$y_{in}^j = G_{ins}^i \times x_{in}^i.$$

An incremental data vector including incremental data blocks is $x_{in}{}^i$, where $x_{in}{}^i=[x_{b_i+1}, x_{b_i+2}, \ldots, x_{b_i+t_i}]^T$, and an incremental parity vector including incremental parity blocks is $y_{in}{}^i$, where $y_{in}{}^i=[y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and the global data vector is a vector including data blocks of the encoding group.

In a possible implementation, the processing module 1301 is further configured to obtain the incremental parity block through calculation by using the following method:

$$s_{in}^i = H_{in}^i \times x_{in}^i, \text{ and}$$

$$y_{in}^j = H_{ys}^{-1} \times s_{in}^j.$$

An incremental data vector including incremental data blocks is $x_{in}{}^i$, where $x_{in}{}^i=[x_{b_i+1}, x_{b_i+2}, \ldots, x_{b_i+t_i}]^T$, and an incremental parity vector including incremental parity blocks is $y_{in}{}^i$, where $y_{in}{}^i=[y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and $s_{in}{}^i$ is a first syndrome.

In a possible implementation, the processing module 1301 is further configured to, when a sum of a quantity of data blocks in the original data block and the quantity of data blocks in the incremental data block is equal to k, encode the first incremental global parity block y by using a first parity matrix to generate a second incremental global parity block y**. The first parity matrix is a product of the inverse matrix of the first intermediate parity matrix $H_y$ and the third intermediate parity matrix $H_{ys}$, and the second incremental global parity block is used to reconstruct a damaged data block in the original data blocks and the incremental data blocks, wherein a total quantity of the original data blocks and the incremental data blocks is k.

In a possible implementation, that the processing module 1301 is further configured to, when a sum of a quantity of data blocks in the original data block and the quantity of data blocks in the incremental data block is equal to k, encode the first incremental global parity block y by using a first parity matrix to generate a second incremental global parity block y** includes obtaining the second incremental global parity block through calculation by using the following method:

$$y^{**} = \left(H_y^{-1} \times H_{ys}\right) \times y.$$

y** is the second incremental global parity block, y is the first incremental global parity block, and $H_y^{-1} \times H_{ys}$ is the first parity matrix.

In a possible implementation, the processing module 1301 is further configured to perform encoding processing on the incremental data block by using a first incremental parity matrix $H_{in}{}^i$ to generate the incremental parity block.

The first incremental parity matrix $H_{in}{}^i$ is a submatrix of a global parity matrix H of the erasure code.

In a possible implementation, when a maximum quantity of data blocks that can be encoded by using the erasure code is k, a quantity of global parity blocks generated by the encoder side by performing encoding processing on the data blocks by using the erasure code is n–k, the global parity block is used to reconstruct a damaged data block in the data blocks on which encoding processing is performed, k is a positive integer, n is a positive integer, and n is greater than k, the processing module 1301 is further configured to determine a first intermediate parity matrix from the global parity matrix of the erasure code, where the first intermediate parity matrix is last n–k columns of the global parity matrix H of the erasure code, the processing module 1301 is further configured to determine a second intermediate parity matrix $H_x$ from the global parity matrix H of the erasure code, where the second intermediate parity matrix $H_x$ is first k columns of the global parity matrix H of the erasure code, and the processing module 1301 is further configured to determine the first incremental parity matrix $H_{in}{}^i$ from the second intermediate parity matrix $H_x$ based on the incremental data block, where the first incremental parity matrix $H_{in}^i$ is formed by performing column juxtaposition on columns that correspond to the incremental data block and that are of the second intermediate parity matrix $H_x$.

In a possible implementation, the processing module 1301 is further configured to obtain the incremental parity block through calculation by using the following method:

$$y_{in}^i = H_{in}^i \times x_{in}^i.$$

An incremental data vector including incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in a global data vector $x = [x_1, x_2, \ldots, x_k]^T$, and i is an integer greater than 1.

In a possible implementation, the processing module 1301 is further configured to, when a sum of a quantity of data blocks in the original data block and a quantity of data blocks in the incremental data block is equal to k, encode the first intermediate incremental global parity block y by using an inverse matrix of the first intermediate parity matrix to generate a third incremental global parity block y\*\*\*, where the third incremental global parity block is used to reconstruct a damaged data block in the original data blocks and the incremental data blocks, wherein a total quantity of the original data blocks and the incremental data blocks is k.

In a possible implementation, the processing module 1301 is further configured to obtain the third incremental global parity block through calculation by using the following method:

$$y^{***} = H_y^{-1} \times y.$$

y\*\*\* is the third incremental global parity block, $H_y^{-1}$ is the inverse matrix of the first intermediate parity matrix, and y is the first incremental global parity block.

In a possible implementation, the processing module 1301 is further configured to perform three-copy backup processing on the first incremental global parity block.

In a possible implementation, the first incremental global parity block further includes redundant data.

Figure 14:
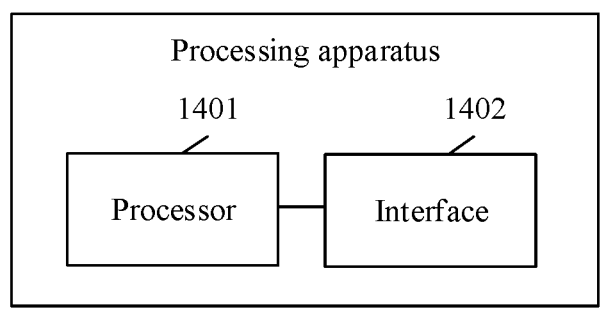
FIG. 14 is a schematic diagram of a processing apparatus according to an embodiment of this disclosure.

An embodiment of this disclosure further provides a processing apparatus. FIG. 14 is a schematic diagram of a processing apparatus according to an embodiment of this disclosure. The processing apparatus includes a processor 1401 and an interface 1402. The processor 1401 is configured to perform the erasure code-based encoding method in any one of the foregoing method embodiments.

For example, the processor 1401 is configured to obtain a plurality of data blocks in batches, where the plurality of data blocks belong to a same encoding group.

The processor 1401 is further configured to perform encoding processing on the plurality of data blocks by using erasure code. In an $i^{th}$ time of encoding, after obtaining an incremental data block, an encoder side performs encoding processing on the incremental data block by using the erasure code to generate an incremental parity block, the incremental data block includes at least one data block, and i is an integer greater than 1.

The processor 1401 is further configured to perform an exclusive OR operation based on the incremental parity block and an original global parity block to generate a first incremental global parity block. The original global parity block is a first incremental global parity block generated by the encoder side in an $(i-1)^{th}$ time of encoding, the original global parity block is used to reconstruct a damaged data block in an original data block, the original data block is a data block obtained by the encoder side before the $(i-1)^{th}$ time of encoding, and the original data block and the incremental data block belong to a same encoding group. The first incremental global parity block is used to reconstruct a damaged data block in the original data block and the incremental data block.

In a possible implementation, the processor 1401 is further configured to determine a quantity of data blocks in the incremental data block.

The processor 1401 is further configured to, when the quantity of data blocks in the incremental data block is less than or equal to a first encoding threshold $t_{th}$, perform encoding processing on the incremental data block by using a first incremental encoding matrix $G_{in}^i$ to generate the incremental parity block.

Alternatively, the processor 1401 is further configured to, when the quantity of data blocks in the incremental data block is greater than the first encoding threshold $t_{th}$, perform encoding processing on the incremental data block by using a first incremental parity matrix $H_{in}^i$ and an inverse matrix of a first intermediate parity matrix $H_y$ to generate the incremental parity block.

The first incremental encoding matrix $G_{in}^i$ is a submatrix of a global encoding matrix G of the erasure code, a product of the first incremental parity matrix $H_{in}^i$ and the inverse matrix of the first intermediate parity matrix $H_y$ is equal to the first incremental encoding matrix $G_{in}^i$, and the first intermediate parity matrix $H_y$ is a submatrix of a global parity matrix H of the erasure code.

In a possible implementation, when a maximum quantity of data blocks that can be encoded by using the erasure code is k, a quantity of global parity blocks generated by the encoder side by performing encoding processing on the data blocks by using the erasure code is n−k, the global parity block is used to reconstruct a damaged data block in the data blocks on which encoding processing is performed, k is a positive integer, n is a positive integer, and n is greater than k, the processor 1401 is further configured to determine the first incremental encoding matrix $G_{in}^i$ from the global encoding matrix G of the erasure code based on the incremental data block, where the first incremental encoding matrix $G_{in}^i$ is formed by performing column juxtaposition on columns that correspond to the incremental data block and that are of the global encoding matrix G of the erasure code, the processor 1401 is further configured to determine the first intermediate parity matrix $H_y$ from the global parity matrix H of the erasure code, where the first intermediate parity matrix $H_y$ is last n−k columns of the global parity matrix H of the erasure code, or the processor 1401 is further configured to determine a second intermediate parity matrix $H_x$ from the global parity matrix H of the erasure code, where the second intermediate parity matrix $H_x$ is first k columns of the global parity matrix H of the erasure code, and the processor 1401 is further configured to determine the first incremental parity matrix $H_{in}^i$ from the second intermediate parity matrix $H_x$ based on the incremental data block, where the first incremental parity matrix $H_{in}^i$ is formed by performing column juxtaposition on columns that correspond to the incremental data block and that are of the second intermediate parity matrix $H_x$.

In a possible implementation, G is the global encoding matrix of the erasure code, H is the global parity matrix of the erasure code and G and H meet the following relationships:

$$H = [H_x | H_y], \text{ and}$$

$$G = H_y^{-1} \times H_x.$$

$H_y$ is the first intermediate parity matrix, the first intermediate parity matrix $H_y$ is the last n–k columns of the global parity matrix H of the erasure code, $H_x$ is the second intermediate parity matrix, and the second intermediate parity matrix $H_x$ is the first k columns of the global parity matrix H of the erasure code.

$G_{in}^i$ is the first incremental encoding matrix, $H_{in}^i$ is the first incremental parity matrix, and $G_{in}^i$ and $H_{in}^i$ meet the following relationship:

$$G_{in}^i = H_y^{-1} \times H_{in}^i.$$

In a possible implementation, the processor 1401 is further configured to obtain the incremental parity block through calculation by using the following method:

$$y_{in}^i = G_{in}^i \times x_{in}^i.$$

An incremental data vector including incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in a global data vector $x = [x_1, x_2, \ldots, x_k]^T$, and the global data vector is a vector including data blocks of the encoding group.

In a possible implementation, the processor 1401 is further configured to obtain the incremental parity block through calculation by using the following method:

$$s_{in}^i = H_{in}^i \times x_{in}^i, \text{ and}$$

$$y_{in}^i = H_y^{-1} \times s_{in}^i.$$

An incremental data vector including incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}^i$ in a global data vector $x = [x_1, x_2, \ldots, x_k]^T$, and $s_{in}^i$ is a first syndrome.

In a possible implementation, the processor 1401 is further configured to obtain the first incremental global parity block through calculation by using the following method:

$$y = y^* + y_{in}^i.$$

y is the first incremental global parity block, y* is the original global parity block, $y_{in}^i$ is the incremental parity block, and + is an operator of the exclusive OR operation in a finite field.

In a possible implementation, when a maximum quantity of data blocks that can be encoded by using the erasure code is k, a quantity of global parity blocks generated by the encoder side by performing encoding processing on the data blocks by using the erasure code is n–k, the global parity block is used to reconstruct a damaged data block in the data blocks on which encoding processing is performed, k is a positive integer, n is a positive integer, and n is greater than k, the processor 1401 is further configured to determine the first intermediate parity matrix $H_y$ from the global parity matrix of the erasure code based on the incremental data block, where the first intermediate parity matrix $H_y$ is the last n–k columns of the global parity matrix H of the erasure code, or the processor 1401 is further configured to determine the second intermediate parity matrix $H_x$ from the global parity matrix of the erasure code based on the incremental data block, where the second intermediate parity matrix $H_x$ is the first k columns of the global parity matrix H of the erasure code, and the processor 1401 is further configured to determine the first incremental parity matrix $H_{in}^i$ from the second intermediate parity matrix $H_x$ based on the incremental data block, where the first incremental parity matrix is formed by performing column juxtaposition on columns that correspond to the incremental data block and that are of the second intermediate parity matrix.

The processor 1401 is further configured to determine a third intermediate parity matrix $H_{ys}$ based on the global parity matrix H of the erasure code. Density of an inverse matrix of the third intermediate parity matrix is lower than density of the inverse matrix of the first intermediate parity matrix, and any $(n-k)^{th}$-order submatrix of a matrix $[H_x|H_{ys}]$ is nonsingular.

The processor 1401 is further configured to determine a second incremental encoding matrix $G_{ins}^i$ based on the second intermediate parity matrix $H_x$ and the third intermediate parity matrix $H_{ys}$. The second incremental encoding matrix $G_{ins}^i$ is a product of the first incremental parity matrix $H_{in}^i$ and the inverse matrix of the third intermediate parity matrix $H_{ys}$.

The processor 1401 is further configured to determine a quantity of data blocks in the incremental data block.

The processor 1401 is further configured to, when the quantity of data blocks in the incremental data block is less than or equal to $t_{th}$, perform encoding processing on the incremental data block by using the second incremental encoding matrix $G_{ins}^i$ to generate the incremental parity block.

Alternatively, the processor 1401 is further configured to, when the quantity of data blocks in the incremental data block is greater than $t_{th}$, perform encoding processing on the incremental data block by using the first incremental parity matrix $H_{in}^i$ and the inverse matrix of the third intermediate parity matrix $H_{ys}$ to generate the incremental parity block.

In a possible implementation, the processor 1401 is further configured to obtain the incremental parity block through calculation b using the following method:

$$y_{in}^i = G_{ins}^i \times x_{in}^i.$$

An incremental data vector including incremental data blocks is $x_{in}^i$, where $x_{in}^i = [x_{b_i+1}, x_{b_i+2}, \ldots, x_{b_i+t_i}]^T$, and an incremental parity vector including incremental parity blocks is $y_{in}^i$, where $y_{in}^i = [y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and the global data vector is a vector including data blocks of the encoding group.

In a possible implementation, the processor 1401 is further configured to obtain the incremental parity block through calculation by using the following method:

$$s_{in}^i = H_{in}^i \times x_{in}^i, \text{ and}$$

$$y_{in}^j = H_{ys}^{-1} \times s_{in}^j.$$

An incremental data vector including incremental data blocks is $x_{in}{}^i$, where $x_{in}{}^i=[x_{b_i+1}, x_{b_i+2}, \ldots, x_{b_i+t_i}]^T$, and an incremental parity vector including incremental parity blocks is $y_{in}{}^i$, where $y_{in}{}^i=[y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and $s_{in}{}^i$ is a first syndrome.

In a possible implementation, the processor 1401 is further configured to, when a sum of a quantity of data blocks in the original data block and the quantity of data blocks in the incremental data block is equal to k, encode the first incremental global parity block y by using a first parity matrix to generate a second incremental global parity block y**. The first parity matrix is a product of the inverse matrix of the first intermediate parity matrix $H_y$ and the third intermediate parity matrix $H_{ys}$, and the second incremental global parity block is used to reconstruct a damaged data block in the original data blocks and the incremental data blocks, wherein a total quantity of the original data blocks and the incremental data blocks is k.

In a possible implementation, that the processor 1401 is further configured to, when a sum of a quantity of data blocks in the original data block and the quantity of data blocks in the incremental data block is equal to k, encode the first incremental global parity block y by using a first parity matrix to generate a second incremental global parity block y** includes obtaining the second incremental global parity block through calculation by using the following method:

$$y^{**} = (H_y^{-1} \times H_{ys}) \times y.$$

y** is the second incremental global parity block, y is the first incremental global parity block, and $H_y^{-1} \times H_{ys}$ is the first parity matrix.

In a possible implementation, the processor 1401 is further configured to perform encoding processing on the incremental data block by using a first incremental parity matrix $H_{in}{}^i$ to generate the incremental parity block.

The first incremental parity matrix $H_{in}{}^i$ is a submatrix of a global parity matrix H of the erasure code.

In a possible implementation, when a maximum quantity of data blocks that can be encoded by using the erasure code is k, a quantity of global parity blocks generated by the encoder side by performing encoding processing on the data blocks by using the erasure code is n−k, the global parity block is used to reconstruct a damaged data block in the data blocks on which encoding processing is performed, k is a positive integer, n is a positive integer, and n is greater than k, the processor 1401 is further configured to determine a first intermediate parity matrix from the global parity matrix H of the erasure code, where the first intermediate parity matrix is last n−k columns of the global parity matrix H of the erasure code, the processor 1401 is further configured to determine a second intermediate parity matrix $H_x$ from the global parity matrix H of the erasure code, where the second intermediate parity matrix $H_x$ is first k columns of the global parity matrix H of the erasure code, and the processor 1401 is further configured to determine the first incremental parity matrix $H_{in}{}^i$ from the second intermediate parity matrix $H_x$ based on the incremental data block, where the first incremental parity matrix $H_{in}{}^i$ is formed by performing column juxtaposition on columns that correspond to the incremental data block and that are of the second intermediate parity matrix $H_x$.

In a possible implementation, the processor 1401 is further configured to obtain the incremental parity block through calculation by using the following method:

$$y_{in}^i = H_{in}^i \times x_{in}^i.$$

An incremental data vector including incremental data blocks is $x_{in}{}^i$, where $x_{in}{}^i=[x_{b_i+1}, x_{b_i+2}, \ldots, x_{b_i+t_i}]^T$, and an incremental parity vector including incremental parity blocks is $y_{in}{}^i$, where $y_{in}{}^i=[y_{in,1}, y_{in,2}, \ldots, y_{in,n-k}]^T$. $b_i+1$ indicates a location sequence number of an initial data block of $x_{in}{}^i$ in a global data vector $x=[x_1, x_2, \ldots, x_k]^T$, and i is an integer greater than 1.

In a possible implementation, the processor 1401 is further configured to, when a sum of a quantity of data blocks in the original data block and a quantity of data blocks in the incremental data block is equal to k, encode the first intermediate incremental global parity block y by using an inverse matrix of the first intermediate parity matrix to generate a third incremental global parity block y***, where the third incremental global parity block is used to reconstruct a damaged data block in the original data blocks and the incremental data blocks, wherein a total quantity of the original data blocks and the incremental data blocks is k.

In a possible implementation, the processor 1401 is further configured to obtain the third incremental global parity block through calculation by using the following method:

$$y^{***} = H_y^{-1} \times y.$$

y*** is the third incremental global parity block, $H_y^{-1}$ is the inverse matrix of the first intermediate parity matrix, and y is the first incremental global parity block.

In a possible implementation, the processor 1401 is further configured to perform three-copy backup processing on the first incremental global parity block.

In a possible implementation, the first incremental global parity block further includes redundant data.

It should be understood that the processing apparatus may be a chip. The processor 1401 may be implemented by using hardware or software. When the processor 1401 is implemented by using hardware, the processor 1401 may be a logic circuit, an integrated circuit, or the like. When the processor 1401 is implemented by using software, the processor 1401 may be a general-purpose processor, and is implemented by reading software code stored in a memory. The memory may be integrated into the processor 1401, or may be located outside the processor 1401 and exist independently.

Herein, "implemented by using hardware" means that a function of the foregoing module or unit is implemented by using a hardware processing circuit that does not have a function of processing program instructions. The hardware processing circuit may include a discrete hardware component, or may be an integrated circuit. To reduce power consumption and a size, an integrated circuit is usually used for implementation. The hardware processing circuit may include an ASIC or a programmable logic device (PLD). The PLD may further include an FPGA, a complex PLD (CPLD), and the like. These hardware processing circuits may be an independently packaged semiconductor chip (for example, packaged into an ASIC), or may be integrated with another circuit (for example, a CPU or a DSP) and then packaged into a semiconductor chip. For example, a plurality of hardware circuits and CPUs may be formed on one silicon base, and are independently packaged into a chip, where the chip is also referred to as a system on a chip (SoC), or a circuit that is configured to implement an FPGA function and a CPU may be formed on a silicon base, and are independently packaged into a chip, where the chip is also referred to as a system-on-a-programmable-chip (SoPC).

An embodiment of this disclosure further provides a computer-readable storage medium, including instructions. When the instructions are run on a computer, the computer is enabled to control an encoder side to perform any implementation shown in the foregoing method embodiments.

An embodiment of this disclosure further provides a computer program product. The computer program product includes computer program code. When the computer program code is run on a computer, the computer performs any implementation shown in the foregoing method embodiments.

An embodiment of this disclosure further provides a chip system, including a memory and a processor. The memory is configured to store a computer program, and the processor is configured to invoke the computer program from the memory and run the computer program, so that a chip performs any implementation shown in the foregoing method embodiments.

An embodiment of this disclosure further provides a chip system, including a processor. The processor is configured to invoke and run a computer program, so that a chip performs any implementation shown in the foregoing method embodiments.

In addition, it should be noted that the apparatus embodiments described above are merely examples. The units described as separate parts may or may not be physically separate, and parts displayed as units may or may not be physical units, may be located in one position, or may be distributed on a plurality of network units. Some or all of the modules may be selected based on an actual requirement to achieve the objectives of the solutions of embodiments. In addition, in the accompanying drawings of the apparatus embodiments provided in this disclosure, connection relationships between the modules indicate that the modules have communication connections with each other, which may be implemented as one or more communication buses or signal cables.

Based on the descriptions of the foregoing implementations, a person skilled in the art may clearly understand that this disclosure may be implemented by software in addition to necessary universal hardware, or certainly may be implemented by dedicated hardware, including an application-specific integrated circuit, a dedicated CPU, a dedicated memory, a dedicated component, and the like. Generally, any function performed by a computer program can be easily implemented by using corresponding hardware, and a specific hardware structure used to achieve a same function may be of various forms, for example, in a form of an analog circuit, a digital circuit, a dedicated circuit, or the like. However, in this disclosure, a software program implementation is a better implementation in most cases. Based on such an understanding, the technical solutions of this disclosure may be implemented in a form of a software product. The computer software product is stored in a readable storage medium, for example, a computer floppy disk, a Universal Serial Bus (USB) flash drive, a removable hard disk, a ROM, a RAM, a magnetic disk, or an optical disc, and includes several instructions for instructing a computer device to perform the methods described in embodiments of this disclosure.

All or some of foregoing embodiments may be implemented by using software, hardware, firmware, or any combination thereof. When the software is used to implement embodiments, all or a part of embodiments may be implemented in a form of a computer program product.

The computer program product includes one or more computer instructions. When the computer program instructions are loaded and executed on the computer, the procedures or functions according to embodiments of this disclosure are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, network apparatus, computing device, or data center to another website, computer, network apparatus, computing device, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, for example, a network apparatus or a data center, integrating one or more usable media. The usable medium may be a magnetic medium (for example, a floppy disk, a hard disk, or a magnetic tape), an optical medium (for example, a DIGITAL VERSATILE DISC (DVD)), a semiconductor medium (for example, an SSD), or the like.

It should be understood that "one embodiment" or "an embodiment" mentioned in the entire specification means that particular features, structures, or characteristics related to the embodiment are included in one or more embodiments of this disclosure. Therefore, "in one embodiment" or "in an embodiment" appearing throughout the specification does not necessarily refer to a same embodiment. In addition, these particular features, structures, or characteristics may be combined in one or more embodiments in any appropriate manner. It should be understood that sequence numbers of the foregoing processes do not mean execution sequences in various embodiments of this disclosure. The execution sequences of the processes should be determined based on functions and internal logic of the processes, and should not be construed as any limitation on the implementation processes of embodiments of this disclosure.

A person of ordinary skill in the art may be aware that, in combination with the examples described in embodiments disclosed in this specification, units and algorithm steps can be implemented by electronic hardware, computer software, or a combination thereof. To clearly describe interchangeability between the hardware and the software, the foregoing has generally described compositions and steps of the examples based on functions. Whether the functions are performed by hardware or software depends on particular applications and design constraint conditions of the technical solutions. A person skilled in the art may use different methods to implement the described functions for each particular application, but it should not be considered that the implementation goes beyond the scope of this disclosure.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this disclosure, it should be understood that the disclosed system, apparatus, and method may be implemented in other manners. For example, the described apparatus embodiments are merely examples. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on an actual requirement to achieve the objectives of the solutions of embodiments.

In addition, functional units in embodiments of this disclosure may be integrated into one processing unit, or each of the units may exist alone physically, or two or more units may be integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of this disclosure may be implemented in a form of a software product. The computer software product is stored in a storage medium and includes several instructions for instructing a computer device (which may be a personal computer, a server, or a network device) to perform all or some of the steps of the methods described in embodiments of this disclosure.

In conclusion, the foregoing descriptions are merely examples of embodiments of the technical solutions of this disclosure, but are not intended to limit the protection scope of this disclosure. Any modification, equivalent replacement, or improvement made without departing from the spirit and principle of this disclosure shall fall within the protection scope of this disclosure.

What is claimed is:

1. A method implemented by an encoder side, wherein the method comprises:
   obtaining, in batches, data blocks of an encoding group;
   performing, in an $i^{th}$ time of encoding, encoding processing on an incremental data block in the data blocks using an erasure code to generate an incremental parity block, wherein the incremental data block comprises at least one data block, and wherein i is an integer greater than 1;
   performing an exclusive OR operation on the incremental parity block and an original global parity block to generate a first incremental global parity block; and
   converting the first incremental global parity block into an electronic signal and storing the electronic signal comprising the first incremental global parity block onto a non-transitory hardware storage device,
   wherein the original global parity block is a previous first incremental global parity block in an $(i-1)^{th}$ time of encoding and is for reconstructing a first damaged data block in an original data block,
   wherein the original data block is from before the $(i-1)^{th}$ time of encoding,
   wherein the original data block and the incremental data block are of the encoding group, and
   wherein the first incremental global parity block is for reconstructing a second damaged data block in the original data block and the incremental data block.

2. The method of claim 1, further comprising:
   determining a quantity of data blocks in the incremental data block;
   performing encoding processing on the incremental data block using an incremental encoding matrix ($G_{in}^{i}$) to generate the incremental parity block when the quantity of data blocks is less than or equal to an encoding threshold ($t_{th}$), wherein $G_{in}^{i}$ is a submatrix of a global encoding matrix (G) of the erasure code; and
   performing encoding processing on the incremental data block using an incremental parity matrix ($H_{in}^{i}$) and an inverse matrix of a first intermediate parity matrix ($H_y$) to generate the incremental parity block when the quantity of data blocks is greater than $t_{th}$, wherein a product of $H_{in}^{i}$ and the inverse matrix is equal to $G_{in}^{i}$, and wherein $H_y$ is a submatrix of a global parity matrix (H) of the erasure code.

3. The method of claim 2, wherein a maximum quantity of data blocks that can be encoded using the erasure code is k, wherein a quantity of global parity blocks generated by performing encoding processing on k data blocks using the erasure code is n−k, wherein each of the global parity blocks is for reconstructing a third damaged data block in data blocks on which encoding processing is performed, wherein k is a positive integer, wherein n is a positive integer and is greater than k, and wherein after determining the quantity of data blocks, the method further comprises:
   determining, based on the incremental data block, $G_{in}^{i}$ from G by performing column juxtaposition on columns that correspond to the incremental data block and that are of G;
   determining, from H, $H_y$ comprising last n−k columns of H;
   determining, from H, a second intermediate parity matrix ($H_x$) comprising first k columns of H; and
   determining, from $H_x$ based on the incremental data block, $H_{in}^{i}$ by performing column juxtaposition on columns that correspond to the incremental data block and that are of $H_x$.

4. The method of claim 1, wherein a maximum quantity of data blocks that can be encoded using the erasure code is k, wherein a quantity of global parity blocks generated by performing encoding processing on k data blocks using the erasure code is n−k, wherein each of the global parity blocks is for reconstructing a third damaged data block in data blocks on which encoding processing is performed, wherein k is a positive integer, wherein n is a positive integer and is greater than k, and wherein the method further comprises:

determining a first quantity of data blocks in the incremental data block;

performing, using an incremental encoding matrix ($G_{ins}^i$), encoding processing on the incremental data block to generate the incremental parity block when the first quantity of data blocks is less than or equal to an encoding threshold, wherein $G_{ins}^i$ is a product of an incremental parity matrix ($H_{in}^i$) and a first inverse matrix of a third intermediate parity matrix ($H_{ys}$), wherein $H_{in}^i$ is based on column juxtaposition on columns that correspond to the incremental data block and that are of a second intermediate parity matrix ($H_x$), wherein $H_x$ comprises first k columns of a global parity matrix (H) of the erasure code, wherein first density of the first inverse matrix is lower than second density of a second inverse matrix of a first intermediate parity matrix ($H_y$), wherein $H_y$ comprises last n–k columns of H, and wherein any $(n-k)^{th}$-order submatrix of a matrix $[H_x|H_{ys}]$ is nonsingular; and performing, using $H_{in}^i$ and the first inverse matrix, encoding processing on the incremental data block to generate the incremental parity block when the first quantity of data blocks is greater than the encoding threshold.

5. The method of claim 4, wherein after determining the first quantity of data blocks, the method further comprises:
determining, from H based on the incremental data block, $H_y$;
determining, from H based on the incremental data block, $H_x$;
determining, from $H_x$ based on the incremental data block, $H_{in}^i$;
determining, based on H, $H_{ys}$; and
determining, based on $H_x$ and $H_{ys}$, $G_{ins}^i$.

6. The method of claim 4, wherein after performing the exclusive OR operation, the method further comprises:
identifying that a sum of a second quantity of data blocks in the original data block and the first quantity of data blocks is equal to k; and
encoding, in response to identifying that the sum is equal to k, the first incremental global parity block using a first parity matrix to generate a second incremental global parity block (y), wherein the first parity matrix is a product of the second inverse matrix and $H_{ys}$, wherein y is for reconstructing a fourth damaged data block in the original data block and the incremental data block, and wherein a total quantity of the original data block and the incremental data block is k.

7. The method of claim 1, further comprising performing, using an incremental parity matrix ($H_{in}^i$), encoding processing on the incremental data block to generate the incremental parity block, wherein $H_{in}^i$ is a submatrix of a global parity matrix (H) of the erasure code.

8. The method of claim 7, wherein a maximum quantity of data blocks that can be encoded using the erasure code is k, wherein a quantity of global parity blocks generated by performing encoding processing on k data blocks using the erasure code is n–k, wherein each of the global parity blocks is for reconstructing a third damaged data block in data blocks on which encoding processing is performed, wherein k is a positive integer, wherein n is a positive integer and is greater than k, and wherein the method further comprises:
determining, from H based on the incremental data block, a first intermediate parity matrix ($H_y$) comprising last n–k columns of H;
determining, from H, a second intermediate parity matrix ($H_x$) comprising first k columns of H; and
determining, from $H_x$ based on the incremental data block, $H_{in}^i$ by performing column juxtaposition on columns that correspond to the incremental data block and that are of $H_x$.

9. The method of claim 8, wherein after performing the exclusive OR operation, the method further comprises:
identifying that a sum of a first quantity of data blocks in the original data block and a second quantity of data blocks in the incremental data block is equal to k; and
encoding, in response to identifying that the sum is equal to k, an intermediate incremental global parity block (y) using an inverse matrix of $H_y$ to generate a second incremental global parity block (y*), wherein y* is for reconstructing a fourth damaged data block in the original data block and the incremental data block that have the sum of k.

10. The method of claim 7, further comprising performing three-copy backup processing on the first incremental global parity block.

11. The method of claim 7, wherein the first incremental global parity block further comprises redundant data.

12. An encoding device comprising:
a memory configured to store instructions; and
at least one processor coupled to the memory and configured to execute the instructions to cause the encoding device to:
obtain, in batches, data blocks of an encoding group;
perform, in an $i^{th}$ time of encoding, encoding processing on an incremental data block in the data blocks using an erasure code to generate an incremental parity block, wherein the incremental data block comprises at least one data block, and wherein i is an integer greater than 1;
perform an exclusive OR operation on the incremental parity block and an original global parity block to generate a first incremental global parity block; and
convert the first incremental global parity block into an electronic signal and store the electronic signal comprising the first incremental global parity block onto a non-transitory hardware storage device,
wherein the original global parity block is a previous first incremental global parity block in an $(i-1)^{th}$ time of encoding and is for reconstructing a first damaged data block in an original data block,
wherein the original data block is from before the $(i-1)^{th}$ time of encoding,
wherein the original data block and the incremental data block are of the encoding group, and
wherein the first incremental global parity block is for reconstructing a second damaged data block in the original data block and the incremental data block.

13. The encoding device of claim 12, wherein the at least one processor is further configured to execute the instructions to cause the encoding device to:
determine a quantity of data blocks in the incremental data block;
perform encoding processing on the incremental data block using an incremental encoding matrix ($G_{in}^i$) to generate the incremental parity block when the quantity of data blocks is less than or equal to an encoding threshold ($t_{th}$); and
perform encoding processing on the incremental data block using an incremental parity matrix ($H_{in}^i$) and an inverse matrix of a first intermediate parity matrix ($H_y$) to generate the incremental parity block when the quantity of data blocks is greater than $t_{th}$, wherein a product of $H_{in}^{i}$ and the inverse matrix is equal to $G_{in}^{i}$, and wherein $H_y$ is a submatrix of a global parity matrix (H).

14. The encoding device of claim 13, wherein a maximum quantity of data blocks that can be encoded using the erasure code is k, wherein a quantity of global parity blocks generated by performing encoding processing on k data blocks using the erasure code is n–k, wherein each of the global parity blocks is for reconstructing a third damaged data block in data blocks on which encoding processing is performed, wherein k is a positive integer, wherein n is a positive integer and is greater than k, and wherein the at least one processor is further configured to execute the instructions to cause the encoding device to:
 determine, based on the incremental data block, $G_{in}^{i}$ from G by performing column juxtaposition on columns that correspond to the incremental data block and that are of G;
 determine, from H, $H_y$ comprising last n–k columns of H;
 determine, from H, a second intermediate parity matrix ($H_x$) comprising first k columns of H; and
 determine, from $H_x$ based on the incremental data block, $H_{in}^{i}$ by performing column juxtaposition on columns that correspond to the incremental data block and that are of $H_x$.

15. The encoding device of claim 12, wherein a maximum quantity of data blocks that can be encoded using the erasure code is k, wherein a quantity of global parity blocks generated by performing encoding processing on k data blocks using the erasure code is n–k, wherein each of the global parity blocks is for reconstructing a third damaged data block in data blocks on which encoding processing is performed, wherein k is a positive integer, wherein n is a positive integer and is greater than k, and wherein the at least one processor is further configured to execute the instructions to cause the encoding device to:
 determine a first quantity of data blocks in the incremental data block;
 perform, using an incremental encoding matrix ($G_{ins}^{i}$), encoding processing on the incremental data block to generate the incremental parity block when the first quantity of data blocks is less than or equal to an encoding threshold, wherein $G_{ins}^{i}$ is a product of an incremental parity matrix ($H_{in}^{i}$) and a first inverse matrix of a third intermediate parity matrix ($H_{ys}$), wherein $H_{in}^{i}$ is based on column juxtaposition on columns that correspond to the incremental data block and that are of a second intermediate parity matrix ($H_x$), wherein $H_x$ comprises first k columns of a global parity matrix (H) of the erasure code, wherein first density of the first inverse matrix is lower than second density of a second inverse matrix of a first intermediate parity matrix ($H_y$), wherein $H_y$ comprises last n–k columns of H, and wherein any $(n-k)^{th}$-order submatrix of a matrix $[H_x|H_{ys}]$ is nonsingular; and
 perform, using $H_{in}^{i}$ and the first inverse matrix, encoding processing on the incremental data block to generate the incremental parity block when the first quantity of data blocks is greater than the encoding threshold.

16. The encoding device of claim 15, wherein after determining the first quantity of data blocks, the at least one processor is further configured to execute the instructions to cause the encoding device to:
 determine, from H based on the incremental data block, $H_y$;
 determine, from H based on the incremental data block, $H_x$;
 determine, from $H_x$ based on the incremental data block, $H_{in}^{i}$;
 determine, based on H, $H_{ys}$; and
 determine, based on $H_x$ and $H_{ys}$, $G_{ins}^{i}$.

17. The encoding device of claim 15, wherein after performing the exclusive OR operation, the at least one processor is further configured to execute the instructions to cause the encoding device to:
 identify that a sum of a second quantity of data blocks in the original data block and the first quantity is equal to k; and
 encode, in response to identifying that the sum is equal to k, the first incremental global parity block using a first parity matrix to generate a second incremental global parity block (y), wherein the first parity matrix is a product of the second inverse matrix and $H_{ys}$, wherein y is for reconstructing a fourth damaged data block in the original data block and the incremental data block, and wherein a total quantity of the original data block and the incremental data block is k.

18. The encoding device of claim 12, wherein the at least one processor is further configured to execute the instructions to cause the encoding device to perform, using an incremental parity matrix ($H_{in}^{i}$), encoding processing on the incremental data block to generate the incremental parity block, and wherein $H_{in}^{i}$ is a submatrix of a global parity matrix (H) of the erasure code.

19. The encoding device of claim 18, wherein a maximum quantity of data blocks that can be encoded using the erasure code is k, wherein a quantity of global parity blocks generated by performing encoding processing on k data blocks using the erasure code is n–k, wherein each of the global parity blocks is for reconstructing a third damaged data block in data blocks on which encoding processing is performed, wherein k is a positive integer, wherein n is a positive integer and is greater than k, and wherein the at least one processor is further configured to execute the instructions to cause the encoding device to:
 determine, from H based on the incremental data block, a first intermediate parity matrix ($H_y$) comprising last n–k columns of H;
 determine, from H, a second intermediate parity matrix ($H_x$) comprising first k columns of H; and
 determine, from $H_x$ based on the incremental data block, $H_{in}^{i}$ by performing column juxtaposition on columns that correspond to the incremental data block and that are of $H_x$,
 wherein after performing the exclusive OR operation, the at least one processor is further configured to execute the instructions to cause the encoding device to:
 identify that a sum of a first quantity of data blocks in the original data block and a second quantity of data blocks in the incremental data block is equal to k; and
 encode, in response to identifying that the sum is equal to k, an intermediate incremental global parity block (y) using an inverse matrix of $H_y$ to generate a second incremental global parity block (y*), wherein y* is for reconstructing a fourth damaged data block in the original data block and the incremental data block that have the sum of k.

20. A computer program product comprising computer-executable instructions that are stored on a non-transitory computer-readable medium and that, when executed by at least one processor, cause an encoding device to:
 obtain, in batches, data blocks of an encoding group;

perform, in an $i^{th}$ time of encoding, encoding processing on an incremental data block in the data blocks using an erasure code to generate an incremental parity block, wherein the incremental data block comprises at least one data block, and wherein i is an integer greater than 1;

perform an exclusive OR operation on the incremental parity block and an original global parity block to generate a first incremental global parity block; and convert the first incremental global parity block into an electronic signal and store the electronic signal comprising the first incremental global parity block onto a non-transitory hardware storage device, wherein the original global parity block is a previous first incremental global parity block in an $(i-1)^{th}$ time of encoding and is for reconstructing a first damaged data block in an original data block, wherein the original data block is from before the $(i-1)^{th}$ time of encoding, wherein the original data block and the incremental data block are of the encoding group, and wherein the first incremental global parity block is for reconstructing a second damaged data block in the original data block and the incremental data block.

* * * * *